(12) United States Patent
Kanamori et al.

(10) Patent No.: US 9,634,024 B2
(45) Date of Patent: Apr. 25, 2017

(54) SEMICONDUCTOR DEVICE HAVING VERTICAL CHANNEL AND AIR GAP, AND METHOD OF MANUFACTURING THEREOF

(71) Applicant: SAMSUNG ELECTRONICS CO., LTD., Suwon-si, Gyeonggi-Do (KR)

(72) Inventors: Kohji Kanamori, Seoul (KR);
Chung-Jin Kim, Gyeonggi-do (KR);
Young-Woo Park, Seoul (KR);
Jae-Goo Lee, Gyeonggi-do (KR);
Jae-Duk Lee, Gyeonggi-do (KR);
Moo-Rym Choi, Gyeonggi-do (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 14/642,086

(22) Filed: Mar. 9, 2015

(65) Prior Publication Data
US 2015/0380431 A1    Dec. 31, 2015

(30) Foreign Application Priority Data
Jun. 25, 2014 (KR) .................. 10-2014-0078205

(51) Int. Cl.
*H01L 29/792* (2006.01)
*H01L 27/11582* (2017.01)
*H01L 27/11565* (2017.01)
*H01L 27/1157* (2017.01)

(52) U.S. Cl.
CPC .... *H01L 27/11582* (2013.01); *H01L 27/1157* (2013.01); *H01L 27/11565* (2013.01)

(58) Field of Classification Search
CPC ......... H01L 21/28273; H01L 21/28282; H01L 27/11556; H01L 27/11529; H01L 27/11578; H01L 27/11582; H01L 29/7889; H01L 29/7926
USPC .................................. 257/314–324
See application file for complete search history.

(56) References Cited

U.S. PATENT DOCUMENTS

| 8,445,347 | B2 | 5/2013 | Alsmeier |
| 8,658,499 | B2 | 2/2014 | Makala et al. |
| 8,912,591 | B2 * | 12/2014 | Baek ................. H01L 27/11568 257/324 |
| 2012/0012920 | A1 | 1/2012 | Shin et al. |
| 2013/0148398 | A1 | 6/2013 | Baek et al. |
| 2013/0161726 | A1 | 6/2013 | Kim et al. |
| 2014/0008714 | A1 * | 1/2014 | Makala ............. H01L 21/28273 257/324 |

* cited by examiner

*Primary Examiner* — Brook Kebede
(74) *Attorney, Agent, or Firm* — F. Chau & Associates, LLC

(57) ABSTRACT

A semiconductor device is provided. Word lines are formed on a substrate. An air gap is interposed between two adjacent word lines. A channel structure penetrates through the word lines and the air gap. A memory cell is interposed between each word line and the channel structure. The memory cell includes a blocking pattern, a charge trap pattern and a tunneling insulating pattern. The blocking pattern conformally covers a top surface, a bottom surface, and a first side surface of each word line. The first side surface is adjacent to the channel structure. The charge trap pattern is interposed only between the first side surface and the channel structure.

20 Claims, 52 Drawing Sheets

SEMICONDUCTOR DEVICE HAVING VERTICAL CHANNEL AND AIR GAP, AND METHOD OF MANUFACTURING THEREOF

CROSS-REFERENCE TO RELATED APPLICATION

This application claims priority under 35 U.S.C. §119 to Korean Patent Application No. 10-2014-0078205, filed on Jun. 25, 2014 in the Korean Intellectual Property Office, the disclosure of which is incorporated by reference herein in its entirety.

TECHNICAL FIELD

The present inventive concept relates to a semiconductor device having a vertical channel and an air gap.

DISCUSSION OF RELATED ART

Various methods of vertically forming a plurality of memory cells on a substrate are being studied to increase performance and integration density. As the number of stacked cells increases, the thickness of the stacked cells increases to the extent that an etching process is difficult. As the thickness of the stacked cells reduces, an operational speed thereof may be lowered due to coupling capacitance between word lines to the extent that a read operation error may occur.

SUMMARY

According to an exemplary embodiment of the present inventive concept, a semiconductor device is provided. A plurality of word lines is formed on a substrate. Each air gap of a plurality of air gaps is interposed between two adjacent word lines. A channel structure penetrates through the plurality of word lines and the plurality of air gaps. Each memory cell of a plurality of memory cells is interposed between each word line and the channel structure. Each memory cell includes a blocking pattern, a charge trap pattern and a tunneling insulating pattern. The blocking pattern conformally covers a top surface, a bottom surface, and a first side surface of each word line. The first side surface is adjacent to the channel structure. The charge trap pattern is interposed only between the first side surface and the channel structure.

According to an exemplary embodiment of the present inventive concept, a nonvolatile memory device is provided. A stacked structure is disposed on a substrate. The stacked structure includes a first word line, an air gap and a second word line vertically stacked on each other. The air gap is interposed between the first word line and the second word line. A channel structure is adjacent to a first side of the stacked structure. An isolation pattern is adjacent to a second side of the stacked structure. The second side is opposite to the first side. A contiguous tunneling insulating pattern is interposed between the stacked structure and the channel structure. A first charge trap pattern is interposed between the first word line and the channel structure. A second charge trap pattern is interposed between the first charge trap pattern and the channel structure. A first blocking pattern includes a first portion and a second portion. The first portion is interposed between the first word line and the first charge trap pattern. The second portion is interposed between the first word line and the air gap. A second blocking pattern is interposed between the second word line and the contiguous tunneling insulating pattern.

According to an exemplary embodiment of the present inventive concept, a method of a nonvolatile memory device is provided. A stacked structure is formed on a substrate by alternately staking a plurality of first insulating layers and a plurality of second insulating layers on each other. A plurality of word lines is formed in place of the plurality of second insulating layers after removing the plurality of second insulating layers. A plurality of air gaps is formed in place of the plurality of first insulating layers after removing the plurality of first insulating layers. The plurality of air gaps and the plurality of word lines are alternately, vertically stacked on each other.

BRIEF DESCRIPTION OF THE DRAWINGS

These and other features of the inventive concept will become more apparent by describing in detail exemplary embodiments thereof with reference to the accompanying drawings of which.

DETAILED DESCRIPTION OF EXEMPLARY EMBODIMENTS

Figure 1:
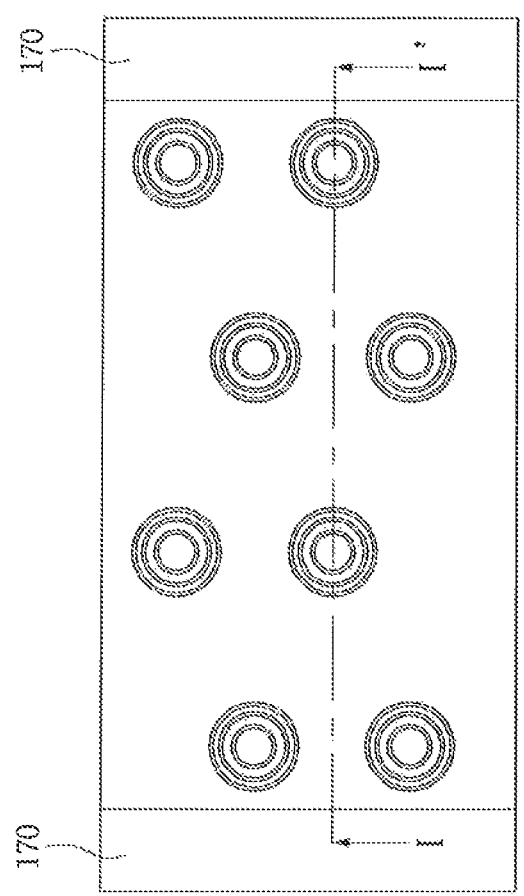
FIG. 1 is a top view showing a semiconductor device in accordance with an exemplary embodiment of the inventive concept.

Exemplary embodiments of the inventive concept will be described below in detail with reference to the accompanying drawings. However, the inventive concept may be embodied in different forms and should not be construed as limited to the embodiments set forth herein. In the drawings, the thickness of layers and regions may be exaggerated for clarity. It will also be understood that when an element is referred to as being "on" another element or substrate, it may be directly on the other element or substrate, or intervening layers may also be present. It will also be understood that when an element is referred to as being "coupled to" or "connected to" another element, it may be directly coupled to or connected to the other element, or intervening elements may also be present. Like reference numerals may refer to the like elements throughout the specification and drawings.

Figure 2A:
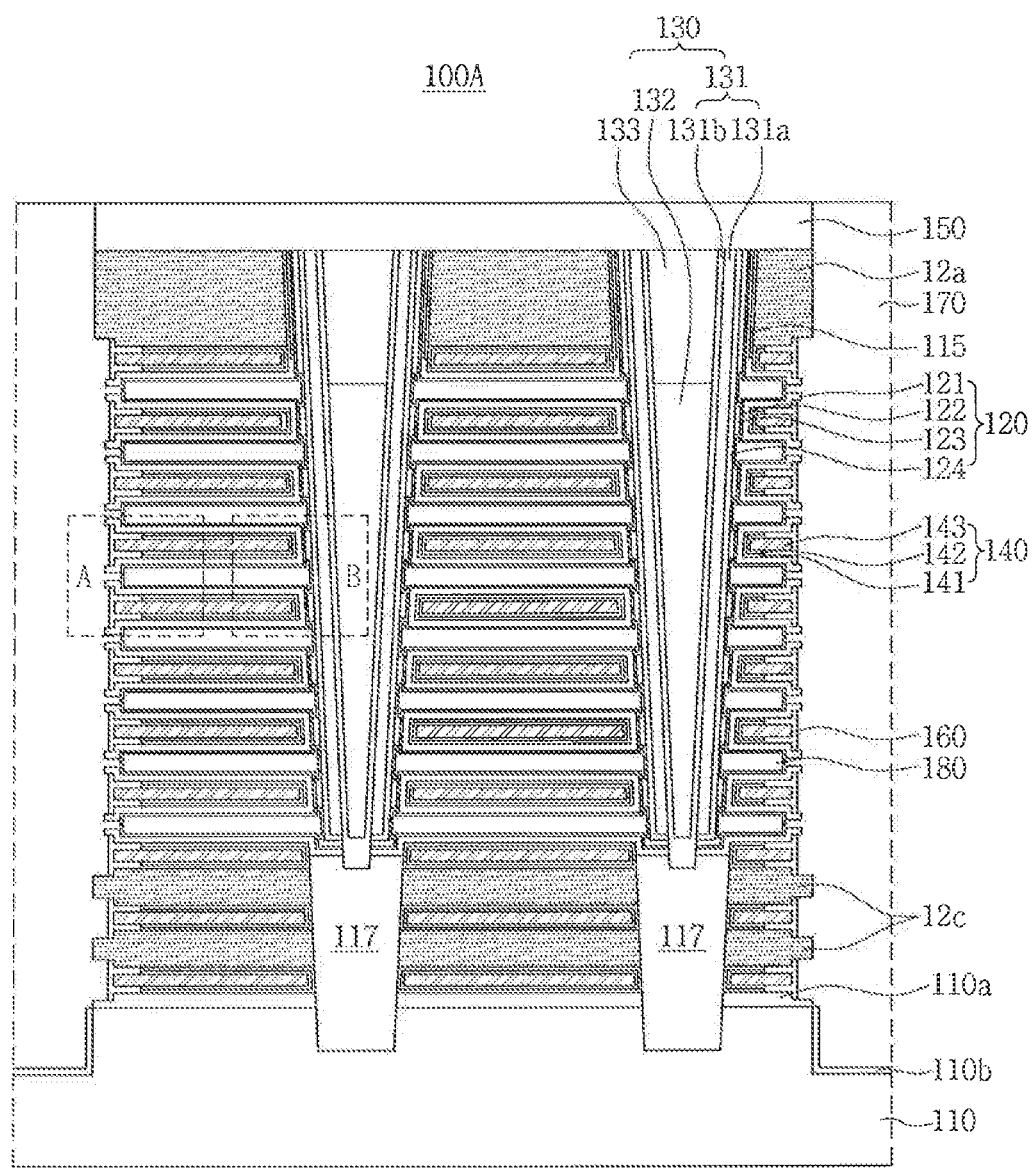
FIGS. 2A to 2C are cross-sectional views taken along line I-I' of FIG. 1 in accordance with an exemplary embodiment of the inventive concept.
Figure 2B:
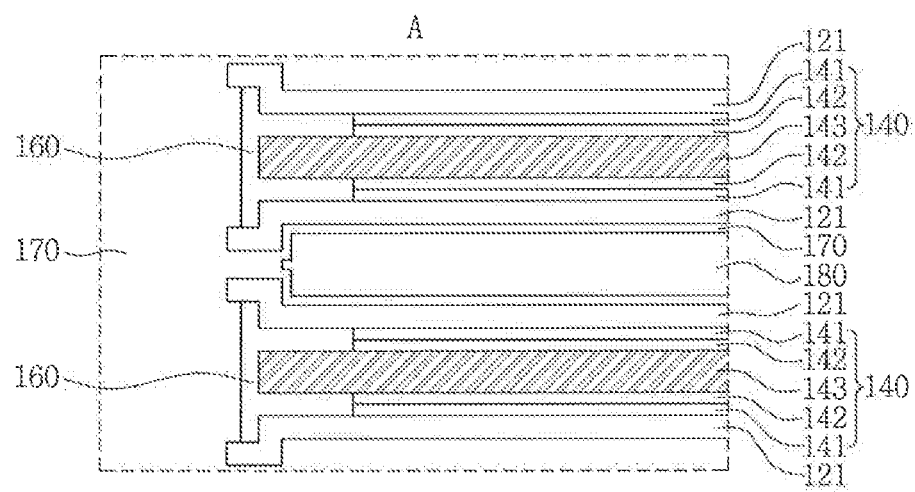
Figure 2C:
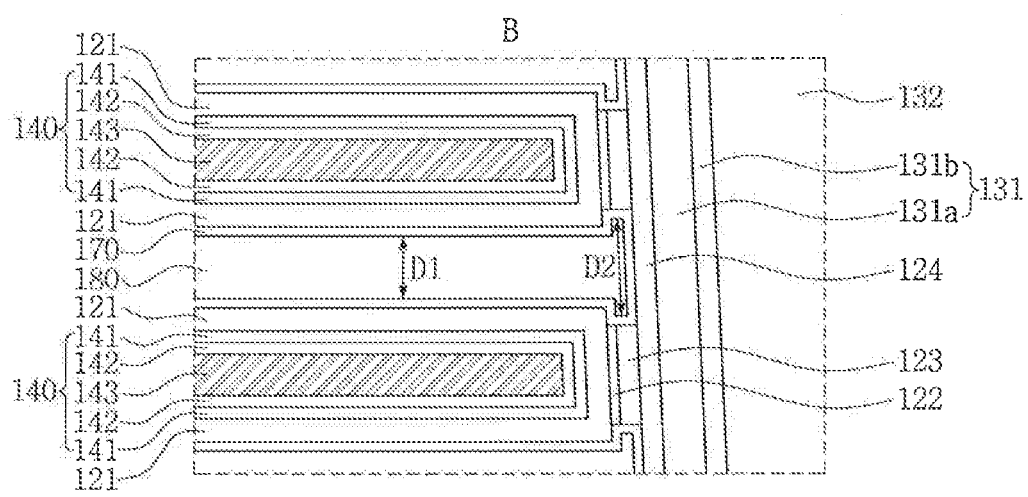

FIGS. 1 and 2A show top view and a cross-sectional view of a semiconductor device in accordance with an exemplary embodiment of the inventive concept. FIGS. 2B and 2C are an enlarged view of a region A and an enlarged view of a region B of FIG. 2A, respectively.

Referring to FIGS. 1 to 2C, a semiconductor device 100A may include a substrate 110, dielectric patterns 120, channel structures 130, word lines 140, air gaps 180, and isolation patterns 170.

The substrate 110 may have a semiconductor substrate. For example, the substrate 110 may include a silicon substrate, a germanium substrate, a silicon-germanium substrate, or the like. The substrate 110 may include a memory cell array area in which memory cells are formed, and a peripheral circuit area in which peripheral circuits are formed to operate the memory cells.

A first insulating thin layer 110a may be formed on a surface of the substrate 110. The first insulating thin layer 110a may be formed between the isolation patterns 170. The first insulating thin layer 110a may include oxidized silicon.

The isolation patterns 170 may be vertically disposed on the substrate 110. The isolation patterns 170 may have line shapes spaced apart from each other in a top view. The isolation patterns 170 may have dam shapes which extend in parallel to each other A lower end of the isolation patterns 170 may extend into the substrate 110. The isolation pattern 170 may be formed of an insulating material such as silicon oxide.

A second insulating thin layer 110b may be conformally formed on the surface of the substrate 110 in contact with a lower part of the isolation patterns 170. The second insulating thin layer 110b may include oxidized silicon.

The word lines 140 may be spaced apart in a direction perpendicular to the surface of the substrate 110, and stacked on the first insulating thin layer 110a. The word lines 140 each may include an insulating barrier pattern 141, a conductive barrier pattern 142, and a word line electrode 143.

The word line electrode 143 may include a conductive material such as a metal. For example, the word line electrode 143 may include tungsten (W).

The conductive barrier pattern 142 may include a conductive metal nitride. For example, the conductive barrier pattern 142 may include titanium nitride (TiN). The conductive barrier pattern 142 may entirely or partially surround the word line electrode 143. For example, the conductive barrier pattern 142 may entirely surround the word line electrode 143 located between the channel structures 130. Further, the conductive barrier pattern 142 may partially surround the word line electrode 143 located between the channel structure 130 and the isolation pattern 170. For example, the conductive barrier pattern 142 may surround a part, which is adjacent to the channel structure 130, of the word line electrode 143 located between the channel structure 130 and the isolation pattern 170, and need not surround a part adjacent to the isolation pattern 170. For example, the conductive barrier pattern 142 need not surround a side surface, a part of a top surface, and a part of a bottom surface, which are adjacent to the isolation pattern 170, of the word line electrode 143. Here, the side surface of the word line electrode 143 may be perpendicular to the surface of the substrate 110 and the top surface and the bottom surface of the word line electrode 143 may be in parallel to the surface of the substrate 110.

The insulating barrier pattern 141 may be formed on the conductive barrier pattern 142 to surround the word line electrode 143. The insulating barrier pattern 141 may also entirely or partially surround the word line electrode 143. For example, the insulating barrier pattern 141 may surround the part, which is adjacent to the channel structure 130, of the word line electrode 143, and need not surround a part adjacent to the isolation pattern 170 like the conductive barrier pattern 142. For example, the insulating barrier pattern 141 need not surround the side surface, the part of the top surface, and the part of the bottom surface, which are adjacent to the isolation pattern 170, of the word line electrode 143.

A side surface of the insulating barrier pattern 141 may be vertically aligned with a side surface of the conductive barrier pattern 142. For example, the side surface of the insulating barrier pattern 141 and the side surface of the conductive barrier pattern 142 each may be perpendicular to the surface of the substrate 110, and may be close to the isolation pattern 170. The insulating barrier pattern 141 may include a metal oxide such as aluminum oxide ($Al_2O_3$).

The dielectric patterns 120 may include the blocking patterns 121, the first charge trap patterns 122, the second charge trap patterns 123, and the tunneling insulating patterns 124.

The blocking patterns 121 may be formed on the insulating barrier patterns 141 to surround the word lines 140. The blocking patterns 121 may have a charge blocking pattern. The blocking patterns 121 may include silicon oxide. The blocking pattern 121 may entirely or partially surround the word lines 140. For example, the blocking patterns 121 may entirely surround the word lines 140 located between the channel structures 130, and partially surround the word lines 140 located between the channel structures 130 and the isolation patterns 170. For example, the blocking patterns 121 may surround parts of the word lines 140 which are close to the channel structures 130, and need not surround parts of the word lines 140 which are close to the isolation patterns 170. Accordingly, the blocking patterns 121 may be formed to expose a side surface of the word lines 140 facing the isolation patterns 170. The side surface of the word line 140 may be perpendicular to the surface of the substrate 110.

In this case, since the insulating barrier pattern 141 and the conductive barrier pattern 142 need not surround a side surface, a part of the top surface, and a part of the bottom surface, which are close to the isolation patterns 170, of the word line electrodes 143, a separation space 119 (see FIG. 37) may be formed between the word line electrodes 143 and the blocking patterns 121. The semiconductor device 100A may further include the second capping pattern 160 formed to fill the separation space 119. The second capping pattern 160 may include silicon oxide.

The blocking pattern 121 may include a first part perpendicular to the surface of the substrate 110, and a second part parallel to the surface of the substrate 110. The first part of the blocking pattern 121 may have a part facing the channel structure 130 to be described below, and the second part of the blocking pattern 121 may have a part in contact with the isolation pattern 170.

The first charge trap patterns 122 may be interposed between the first part of the blocking patterns 121 and the channel structure 130. The first charge trap patterns 122 may include silicon nitride. The first charge trap patterns 122, as described in FIG. 2C, may be formed to have a length less than the first part of the blocking patterns 121. Here, a direction of the length may be substantially perpendicular to the surface of the substrate 110. The first charge trap patterns 122 may serve as an etch stopper in an etching process where a second sacrificial pattern 50 is removed to form the air gap 180. Such process will be described below. Further, the first charge trap patterns 122 and the second charge trap patterns 123 to be described below may serve to store information in a non-volatile memory device.

The second charge trap patterns 123 may be formed on the first charge trap patterns 122. The second charge trap patterns 123 may include a material in which a charge injected from a channel active pattern 131 of the channel structure 130 may be trapped or retained, or from which such trapped charge may be removed, according to an operational condition of the non-volatile memory device. For example, the second charge trap patterns 123 may include silicon nitride.

The second charge trap patterns 123 may have the substantially same vertical length as the first charge trap patterns 122. The vertical length may have a length substantially perpendicular to the surface of the substrate 110. The first charge trap patterns 122 and the second charge trap patterns 123 may be formed only on the side surface of the word line 140, and need not be formed in the air gaps 180. For example, the air gaps 180 may be disposed between the first charge trap patterns 122 and between the second charge trap patterns 123. For example, the first charge trap patterns 122 may be formed to be vertically spaced apart from each other. Also, the second charge trap patterns 123 may be formed to be vertically spaced apart from each other.

The tunneling insulating patterns 124 may be interposed between the second charge trap patterns 123 and the channel structure 130. The tunneling insulating patterns 124 may be contiguous along a substantially vertical direction and formed on the substrate 110. The tunneling insulating patterns 124 may include silicon oxide.

The air gaps 180 may be formed between the word lines 140. For example, the air gaps 180 may be formed between the blocking patterns 121 surrounding the word lines 140. The air gaps 180 may be defined by the isolation patterns 170. The isolation patterns 170 may be conformally formed on the blocking patterns 121, the first charge trap patterns 122, the second charge trap patterns 123, and the tunneling insulating patterns 124.

The air gaps 180 each may include a first part located between the blocking patterns 121, and a second part located between the first charge trap patterns 122 and the second charge trap patterns 123. The first part of the air gap 180 may have a vertical width D1. The second part of the air gap 180 may have a vertical width D2. Here, the vertical widths D1 and D2 may be substantially perpendicular to the surface of the substrate 110.

The semiconductor device 100A may further include an uppermost insulating layer 12a formed on the uppermost word line 140. The uppermost insulating layer 12a may include silicon oxide. The uppermost insulating layer 12a may be formed between the isolation patterns 170.

The semiconductor device 100 may further include lower insulating layers 12c formed between three word lines 140, close to an upper surface of the substrate 110, among the word lines 140. The lower insulating layers 12c may include silicon oxide. The lower insulating layers 12c may be formed between the isolation patterns 170.

The channel structures 130 may be vertically formed on the substrate 110. The channel structures 130 may be formed in channel holes CH (see FIG. 11). The channel holes CH may penetrate the word lines 140, the air gaps 180, the uppermost insulating layer 12a, the lower insulating layers 12c, and the first insulating thin layer 110a. The channel structures 130 may include channel active patterns 131, channel core patterns 132, and channel pad patterns 133.

The semiconductor device 100A may further include epitaxial layers 117 formed under the channel holes CH. The epitaxial layers 117 may be in contact with the surface of the substrate 110. The epitaxial layer 117 may be formed by using a selective epitaxial growth (SEG) process. The upper surface of the epitaxial layer 117 may be adjacent to the side surface of the lowermost word line 140 formed on the lower insulating layer 12c.

The channel active patterns 131 may be formed of a semiconductor material in which a channel area of a transistor may be formed. For example, the channel active patterns 131 may include polysilicon. The channel active patterns 131 may include first channel active patterns 131a formed on the tunneling insulating patterns 124, and second channel active patterns 131b formed on the first channel active patterns 131a.

The channel core patterns 132 may be formed on the channel active patterns 131 to fill the inside of the channel hole CH. For example, the channel core patterns 132 may include silicon oxide.

The channel pad patterns 133 may be formed on the channel active patterns 131 and the channel core patterns 132 to fill the inside of the channel hole CH. For example, the channel pad patterns 133 may include polysilicon.

The semiconductor device 100A may further include a first capping pattern 150. The first capping pattern 150 may cover a top surface of the uppermost insulating layer 12a, top surfaces of the channel structures 130, and top surfaces of the dielectric patterns 120. For example, the first capping pattern 150 may include silicon oxide. The first capping pattern 150 may be formed between the isolation patterns 170.

According to an exemplary embodiment of the inventive concept, the air gaps 180 having low permittivity are formed between the word lines 140, and thus coupling between adjacent word lines 140 may be suppressed if the distance between the word lines 140 decreases.

According to an exemplary embodiment of the inventive concept, the air gaps 180 having low permittivity are disposed between the adjacent first charge trap patterns 122 and between the adjacent second charge trap patterns 123, and thus a coupling between memory cells may be suppressed if thicknesses of the word lines 130 and the air gaps 180 are reduced. Accordingly, errors in an operation including a read operation due to coupling between memory cells may be prevented.

Figure 3A:
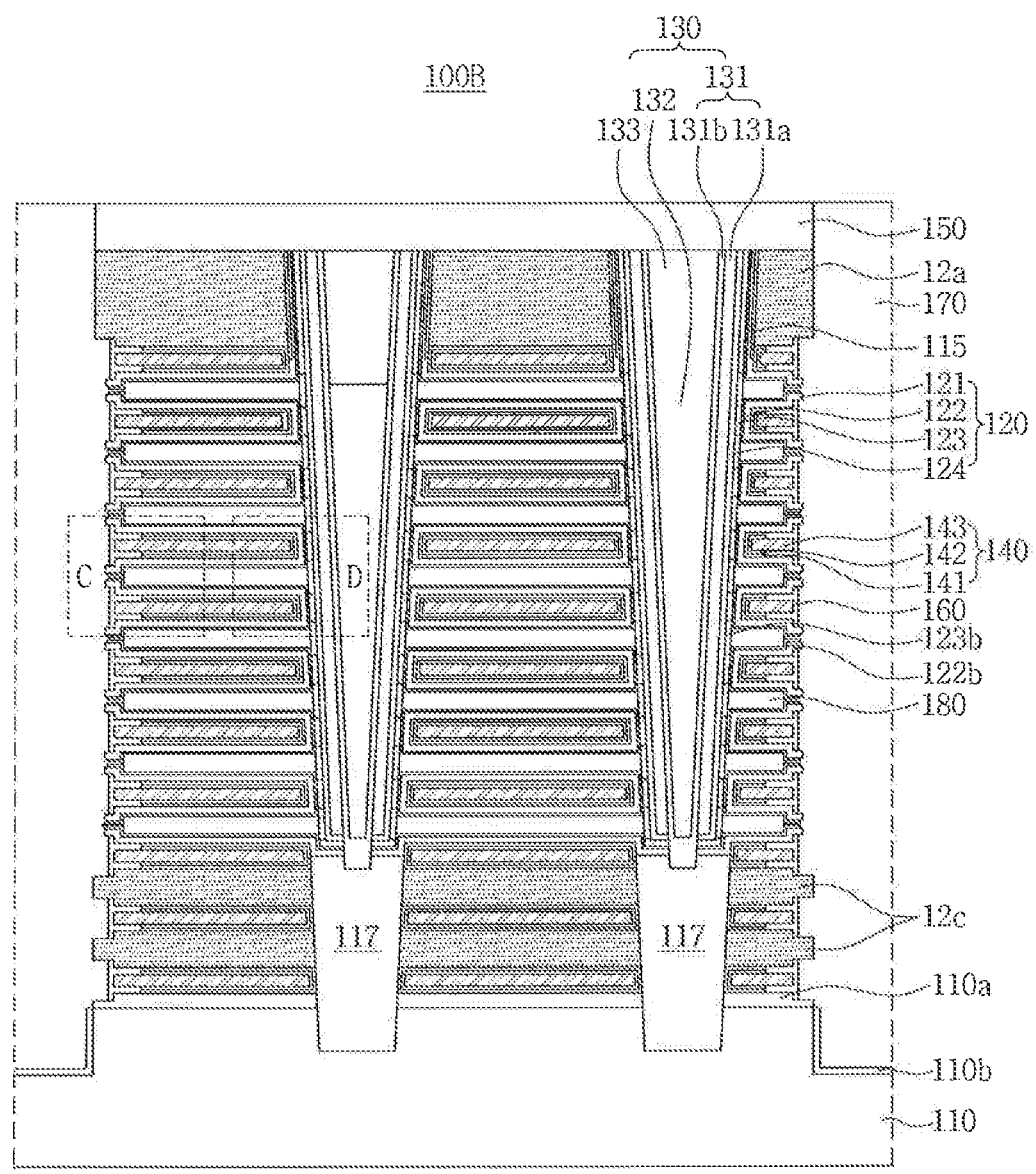
FIGS. 3A to 3C are cross-sectional views taken along line I-I' of FIG. 1 in accordance with an exemplary embodiment of the inventive concept.
Figure 3B:
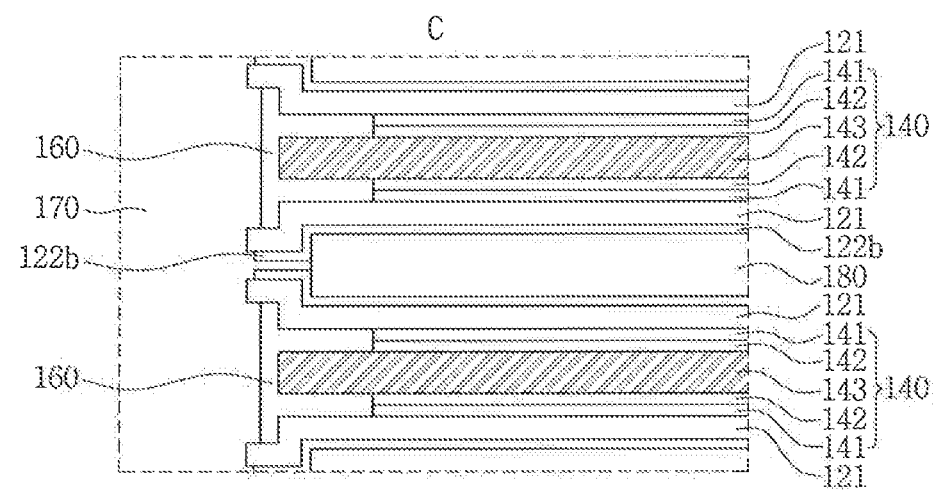
Figure 3C:
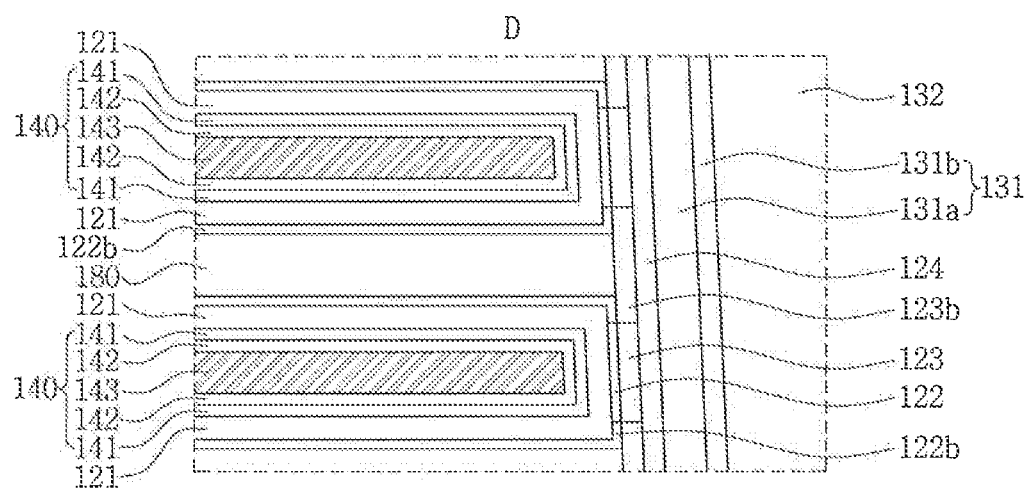

FIGS. 1 and 3A are a top view and a cross-sectional view showing a semiconductor device in accordance with an exemplary embodiment of the inventive concept. FIGS. 3B and 3C are an enlarged view of a region C and an enlarged view of a region D of FIG. 3A, respectively.

Referring to FIGS. 1 to 3C, a semiconductor device 100B in accordance with the embodiment of the inventive concept may include a substrate 110, dielectric patterns 120, channel structures 130, word lines 140, air gaps 180, and isolation patterns 170.

The dielectric patterns 120 may include blocking patterns 121, first charge trap patterns 122, second charge trap patterns 123, and tunneling insulating patterns 124.

The blocking pattern 121 may be formed to surround the word line 140. The blocking pattern 121 may be a charge blocking pattern. The blocking pattern 121 may include silicon oxide. The blocking pattern 121 may include a first part substantially perpendicular to a surface of the substrate 110, and a second part in substantially parallel to the surface of the substrate 110. The first part of the blocking pattern 121 may be a part facing the channel structure 130, and the second part of the blocking pattern 121 may be a part disposed on a top surface and a bottom surface of the word line 140.

The first charge trap pattern 122 may be formed on the first part of the blocking pattern 121. The first charge trap pattern 122 may include silicon nitride. The first charge trap pattern 122, as shown in FIG. 3C, may be formed to have a length less than the first part of the blocking pattern 121. The direction of the length may be perpendicular to the surface of the substrate 110. The first charge trap pattern 122 may serve as an etch stopper in an etching process where a second sacrificial pattern 50 is removed to form the air gap 180. The etching process will be described later. Further, the first charge trap pattern 122 and the second charge trap pattern 123 to be described below may serve to store information in a non-volatile memory device.

The second charge trap pattern 123 may be formed on the first charge trap pattern 122. For example, the second charge trap pattern 123 may include silicon nitride. The second charge trap pattern 123 may have substantially the same vertical length as the first charge trap pattern 122. The first charge trap pattern 122 and the second charge trap pattern 123 may be formed only on the side surface of the word line 140, and need not be formed in the air gap 180. The first charge trap patterns 122 may be spaced apart from each other in a direction substantially perpendicular to the surface of the substrate 110, and the second charge trap patterns 123 may be spaced apart from each other in a direction substantially perpendicular to the surface of the substrate 110.

The semiconductor device 100B may further include a first oxide layer 122b. The first oxide layer 122b may be in contact with an upper surface and a bottom surface of the first charge trap pattern 122. The first oxide layer 122b may further be in contact with the blocking pattern 121 formed on the upper surface and the bottom surface of the word line 140. Here, the upper surface and the bottom surface of the first charge trap pattern 122 may be in substantially parallel to the surface of the substrate 110. The first oxide layer 122b may be conformally formed on the blocking pattern 121. The first oxide layer 122b may include oxidized silicon.

The semiconductor device 100B may further include a second oxide layers 123b formed between the second charge trap patterns 123. The second oxide layers 123b may be vertically aligned with the second charge trap patterns 123. For example, the second charge trap patterns 123 and the second oxide layers 123b may be alternately and repeatedly formed in a vertical direction. Here, the vertical direction may be a direction substantially perpendicular to the surface of the substrate 110. The second oxide layer 123b may include oxidized silicon.

The tunneling insulating pattern 124 may be thrilled to contact the second charge trap pattern 123. The tunneling insulating pattern 124 may be vertically and continuously formed on the substrate 110. The tunneling insulating pattern 124 may include silicon oxide.

The air gap 180 may be formed between the word lines 140. For example, the air gap 180 may be formed between the blocking patterns 121 configured to surround the word lines 140. The air gap 180 may be defined by the first oxide layer 122b, the second oxide layer 123b, and the isolation pattern 170. For example, the air gap 180 located between the channel structures 130 may be defined by the first oxide layer 122b and the second oxide layer 123b, and the air gap 180 located between the channel structure 130 and the isolation pattern 170 may be defined by the first oxide layer 122b, the second oxide layer 123b, and the isolation pattern 170.

FIGS. 4 to 42C are views for describing a method of manufacturing the semiconductor device of FIGS. 2A to 2C in accordance with an exemplary embodiment of the inventive concept. FIGS. 43A to 43C are views for describing a method of manufacturing the semiconductor device of FIGS. 3A to 3C in accordance with an exemplary embodiment of the inventive concept.

Figure 4:
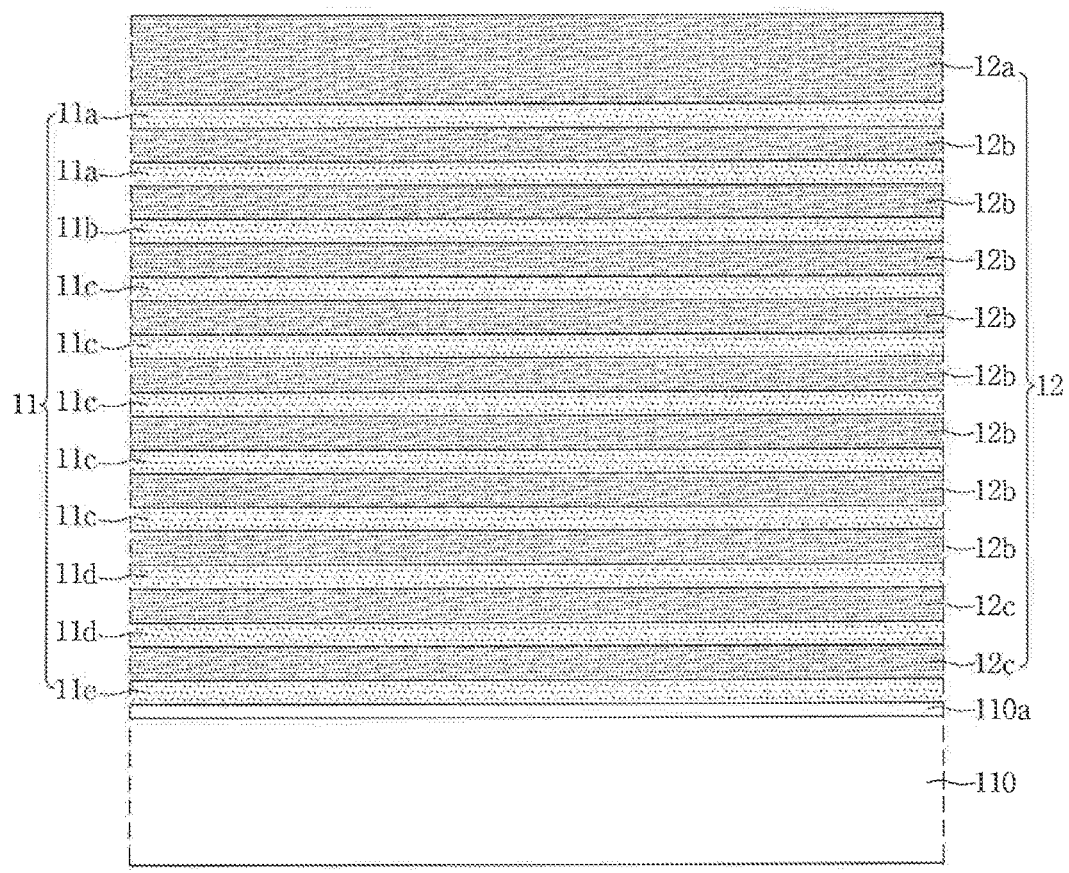
FIGS. 4 to 42C are cross-sectional views for describing a method of manufacturing the semiconductor device of FIGS. 2A to 2C in accordance with an exemplary embodiment of the inventive concept.

Referring to FIG. 4, a method of manufacturing the semiconductor device 100A of FIG. 2A may include forming a first insulating thin film 110a on a substrate 110, and forming a plurality of first insulating layers 11 and a plurality of second insulating layers 12 on the first insulating thin film 110a.

The substrate 110 may have a semiconductor substrate. For example, the substrate 110 may include a silicon substrate, a germanium substrate, a silicon-germanium substrate, or the like.

The formation of the first insulating thin film 110a may include oxidizing a surface of the substrate 110 using a wet oxidation process.

The first insulating layers 11 and the second insulating layers 12 may be alternately and repeatedly formed using a deposition process. The first insulating layers 11 may include a silicon nitride layer, and the second insulating layers 12 may include a silicon oxide layer.

The first insulating layers 11 may include upper dummy insulating layers 11a, an upper insulating layer 11b, intermediate insulating layers 11c, lower dummy insulating layers 11d, and a lower insulating layer 11e. Although the upper dummy insulating layers 11a and the lower dummy insulating layers 11d are each described to have two layers in FIG. 4, the numbers of the upper dummy insulating layers 11a and the lower dummy insulating layers 11d are not limited thereto, and the upper dummy insulating layers 11a and the lower dummy insulating layers 11d may include one layer or three or more layers.

The second insulating layers 12 may include an uppermost insulating layer 12a, intermediate insulating layers 12b, and lower insulating layers 12c.

Figure 5:
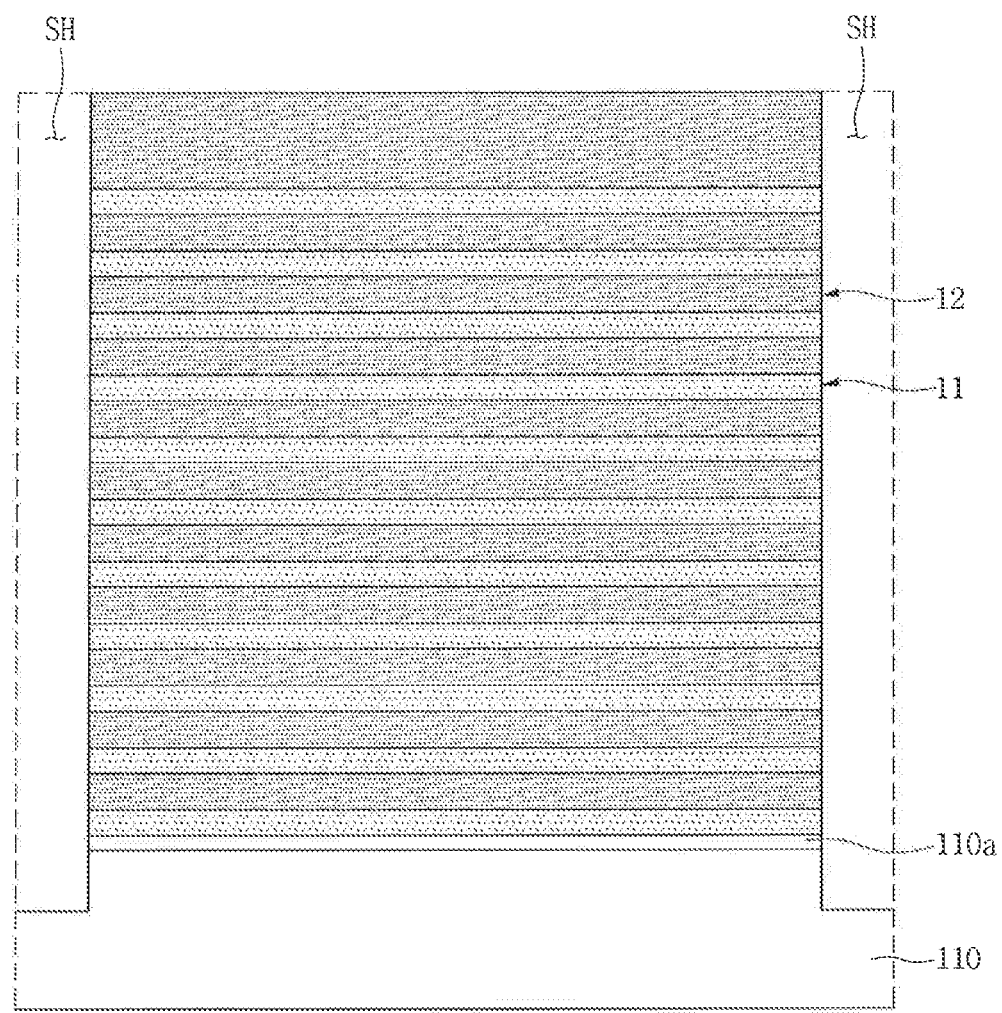

Referring to FIG. 5, isolation trenches SH may be formed. The isolation trenches SH may penetrate through the first insulating layers 11 and the second insulating layers 12 to expose the substrate 110. In this case, side surfaces of the first insulating layers 11, side surfaces of the second insulating layers 12, and a part of the surface of the substrate 110 may be exposed through the isolation trench SH.

Figure 6:
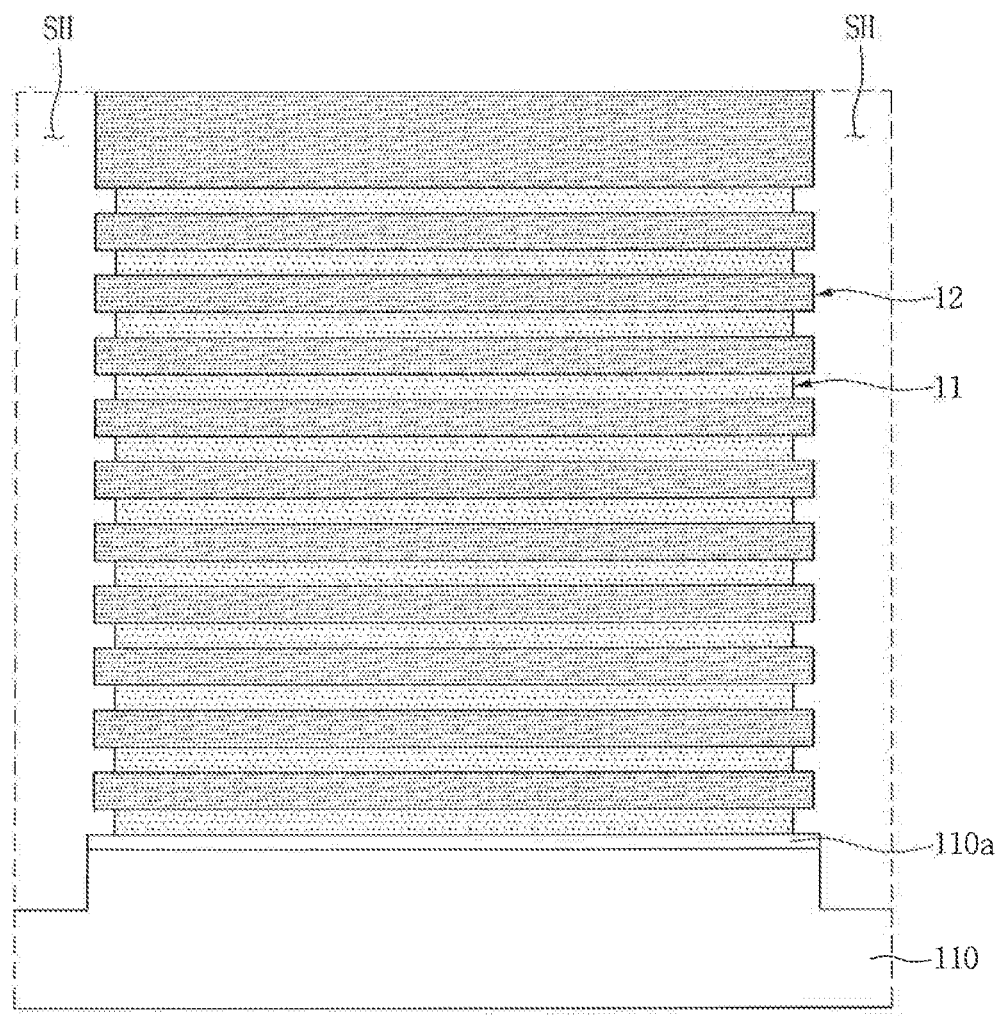

Referring to FIG. 6, the side surfaces of the first insulating layers 11 may be recessed through the isolation trenches SH. Thus, the first insulating layer 11 may be shorter than the second insulating layer 12. Further, edge parts of the second insulating layers 12 may be exposed by recessing the side surfaces of the first insulating layers 11 through the isolation trenches SH. For example, parts of upper surfaces and parts of bottom surfaces of parts, adjacent to the isolation trenches SH, of the second insulating layers 12 may be exposed. Accordingly, a corrugated surface may be formed in the isolation trenches SH.

Figure 7:
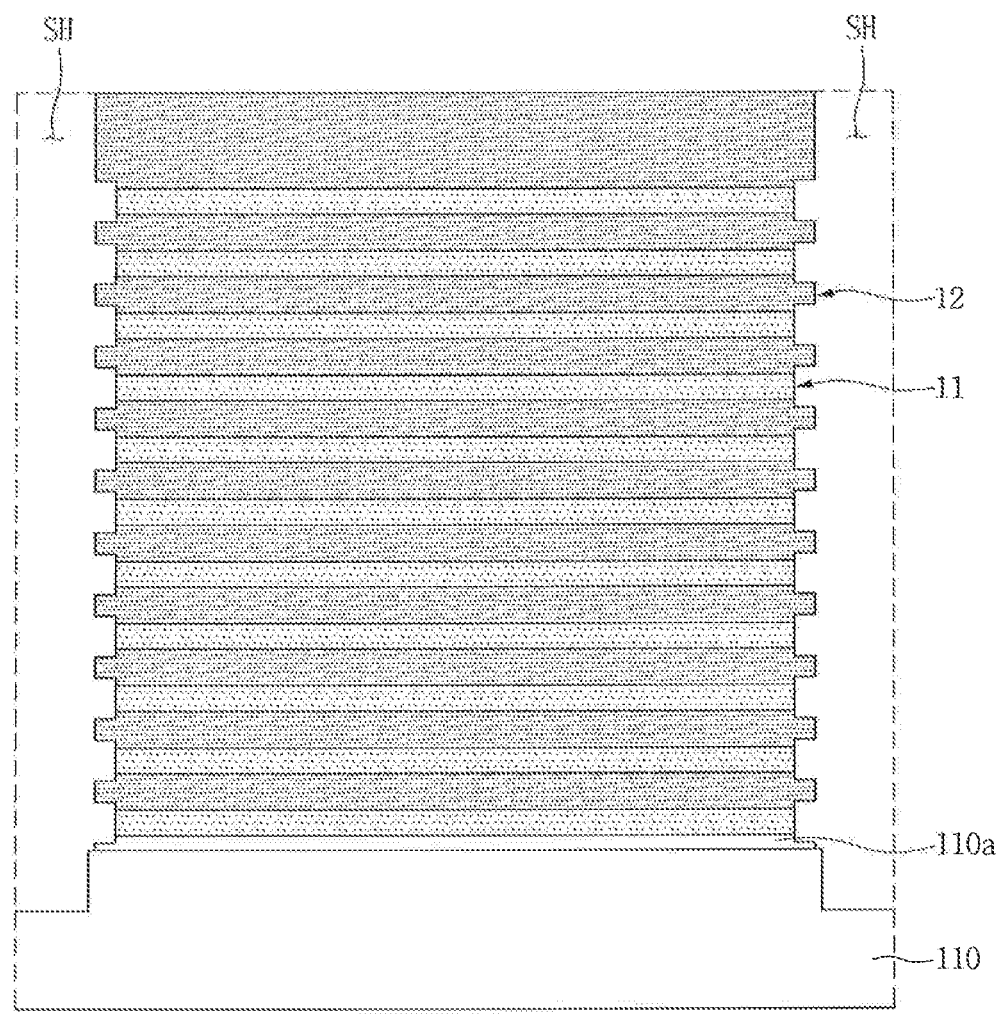

Referring to FIG. 7, the second insulating layers 12 exposed through the isolation trenches SH and the recessed first insulating layers 11 may be recessed. For example, the side surfaces, the upper surfaces and the bottom surface of the second insulating layers 12 exposed by the recessed first insulating layers 11 and the isolation trenches SH may be partially removed. The thickness of the recessed second insulating layers 12 may be smaller than that of the first insulating layers 11.

Figure 8:
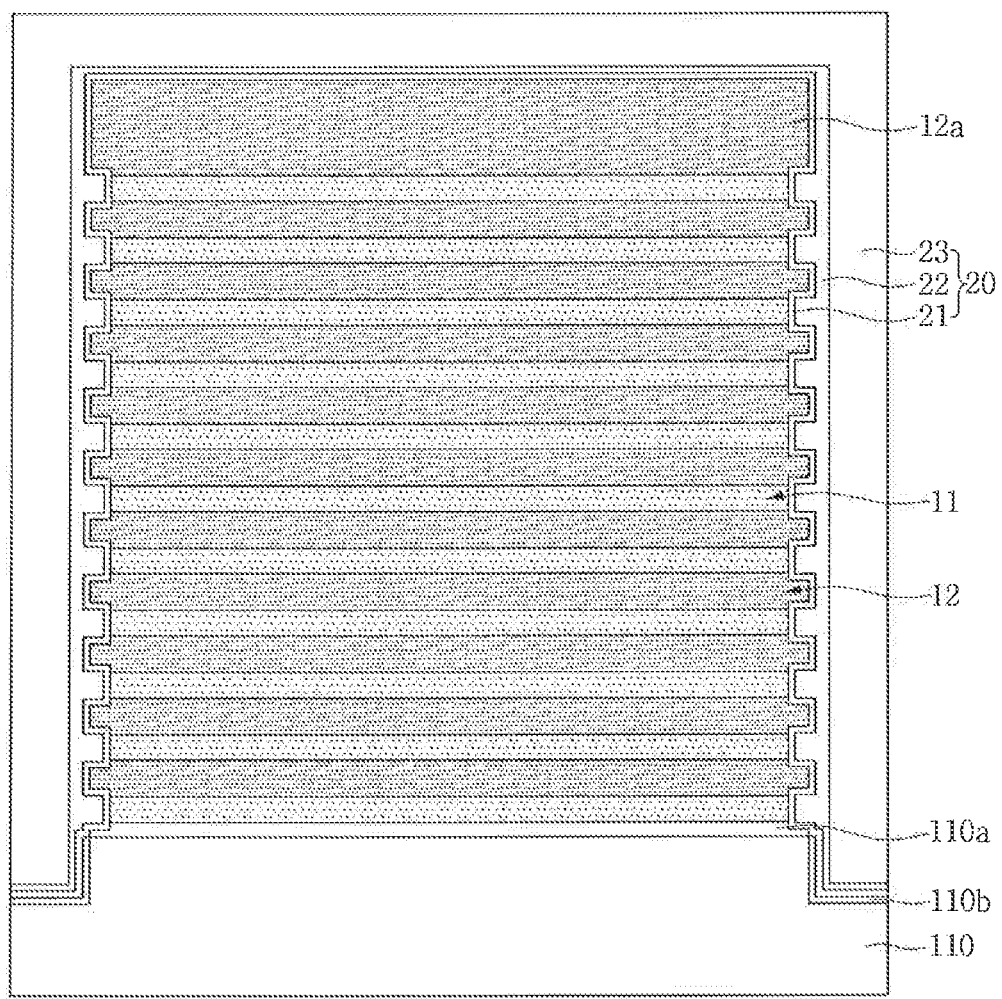

Referring to FIG. 8, a protection layer 20 may be formed in the isolation trenches SH. The protection layer 20 may also be formed on the uppermost insulating layer 12a of the second insulating layers 12. The protection layer 20 may include a first protection layer 21, a second protection layer 22, and a third protection layer 23.

The first protection layer 21 may be conformally formed on the corrugated surface of the resulting structure of FIG. 7. For example, the surface of the first protection layer 21 formed on the uppermost insulating layer 12a may be planar, and the surface of the first protection layer 21 formed on the inside wall of the isolation trenches SH may be stepped along the corrugated side surface of the first and second insulating layers 11 and 12. Here, the surface of the first protection layer 21 formed on the inside wall of the isolation trench SH may be substantially perpendicular to the substrate 110. The first protection layer 21 may include silicon nitride. The first protection layer 21 may be formed using a deposition process.

The second protection layer 22 may be conformally formed on the first protection layer 21. For example, the surface of the second protection layer 22 disposed on the uppermost insulating layer 12a, and the surface of the second protection layer 22 formed inside the isolation trench SH may be planar. The second protection layer 22 may include polysilicon. The second protection layer 22 may be formed using a deposition process.

The third protection layer 23 may be formed on the second protection layer 22 to fill the inside of the isolation trench SH. The third protection layer 23 may be formed to have a thickness greater than the first protection layer 21 and the second protection layer 22. The third protection layer 23 may include silicon oxide. The third protection layer 23 may be formed using a deposition process.

Figure 9:
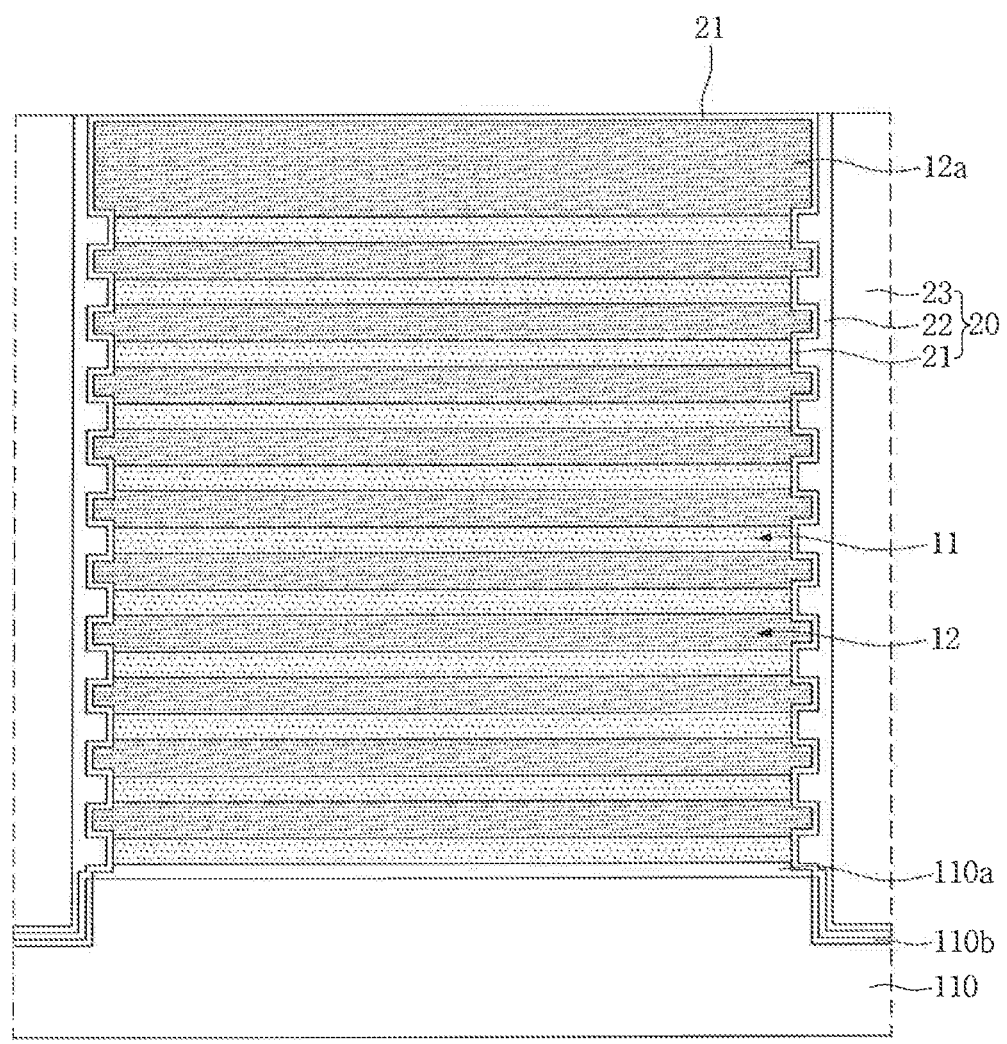

Referring to FIG. 9, the first protection layer 21 formed on the uppermost insulating layer 12a may be exposed using a planarization process. For example, the planarization process may include an etch-back process or a chemical mechanical polishing (CMP) process. In this case, the surfaces of the second protection layer 22 and the third protection layer 23 formed in the isolation trench SH may be exposed. The surface of the first protection layer 21 exposed through the planarization process may be located at substantially the same level as the surfaces of the second protection layer 22 and the third protection layer 23. The surface of the first protection layer 21 and the surfaces of the second protection layer 22 and the third protection layer 23 may be in substantially parallel to the substrate 110.

Figure 10:
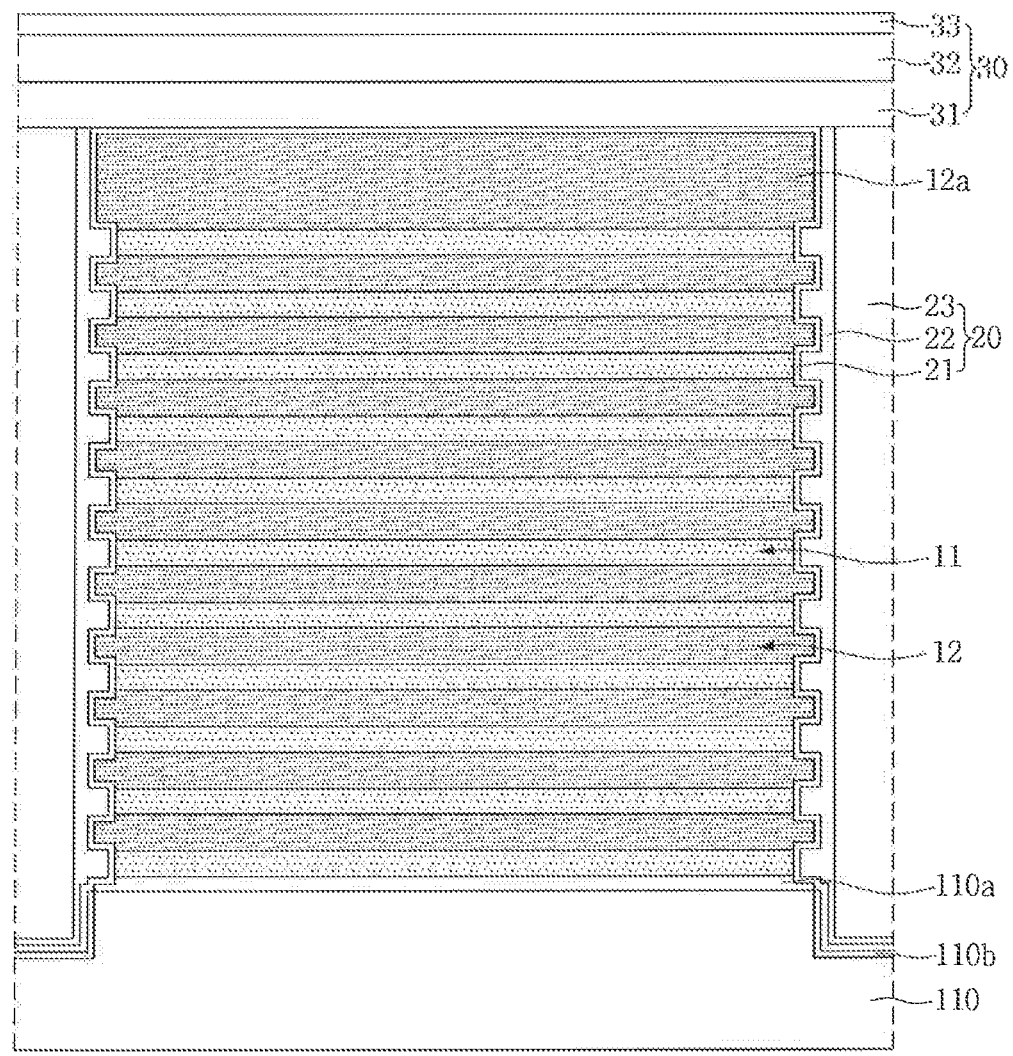

Referring to FIG. 10, a mask 30 may be formed on the first protection layer 21, the second protection layer 22, and the third protection layer 23. The mask 30 may include a first mask 31, a second mask 32, and a third mask 33.

The first mask 31 may be formed on the first protection layer 21, the second protection layer 22 and the third protection layer 23. The first mask 31 may include silicon nitride or polysilicon. The second mask 32 may be formed on the first mask 31. The second mask 32 may include silicon oxide. The third mask 33 may be formed on the second mask 32. The third mask 33 may include polysilicon. The first mask 31, the second mask 32, and the third mask 33 each may be formed using a deposition process.

Figure 11:
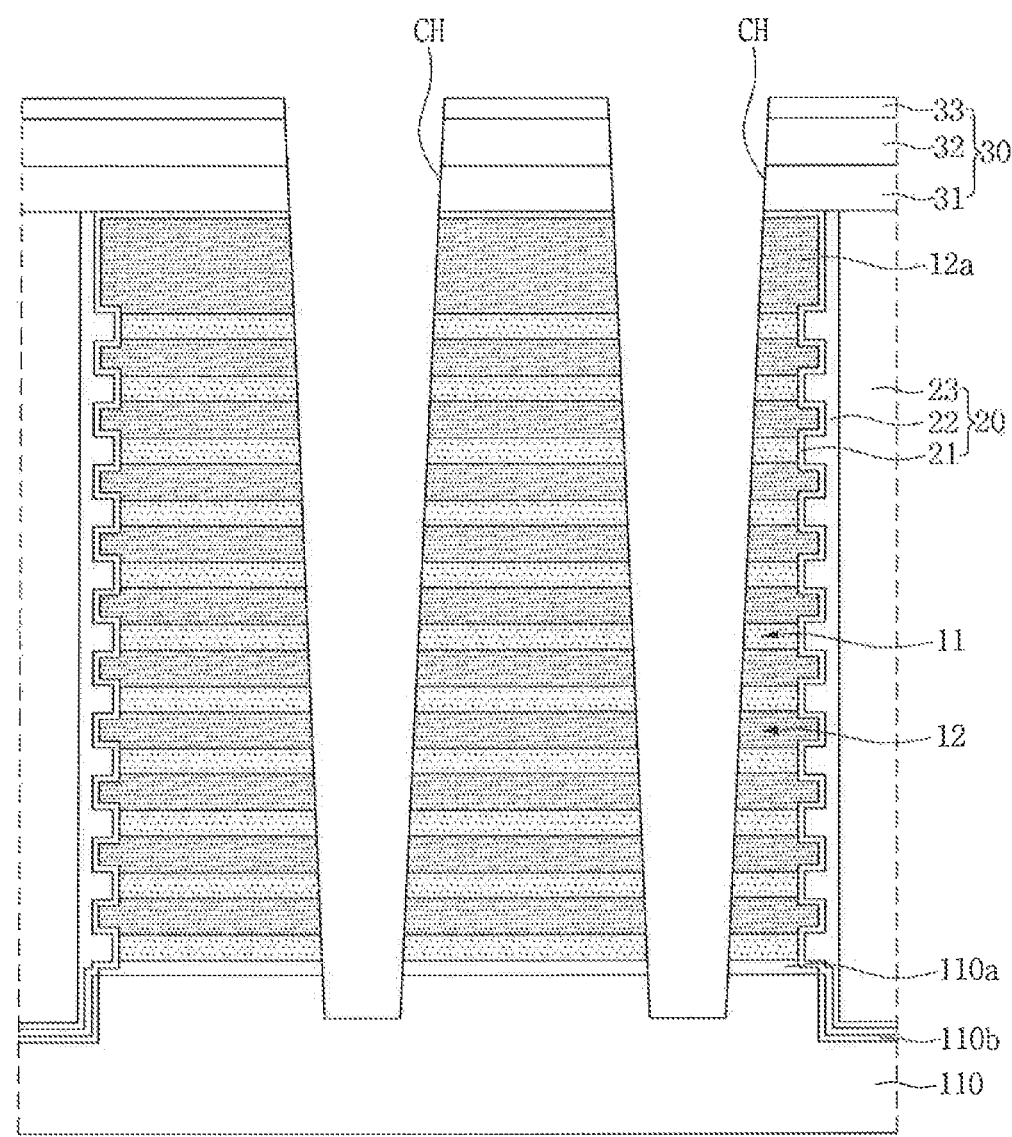

Referring to FIG. 11, channel holes CH may be formed using an etching process. The channel holes CH may penetrate through the mask 30, the first insulating layers 11, the second insulating layers 12, and the first insulating thin film 110a to expose a part of the surface of the substrate 110. The part of the surface of the substrate 110 exposed to a lower part of the channel hole CH may be recessed.

Figure 12:
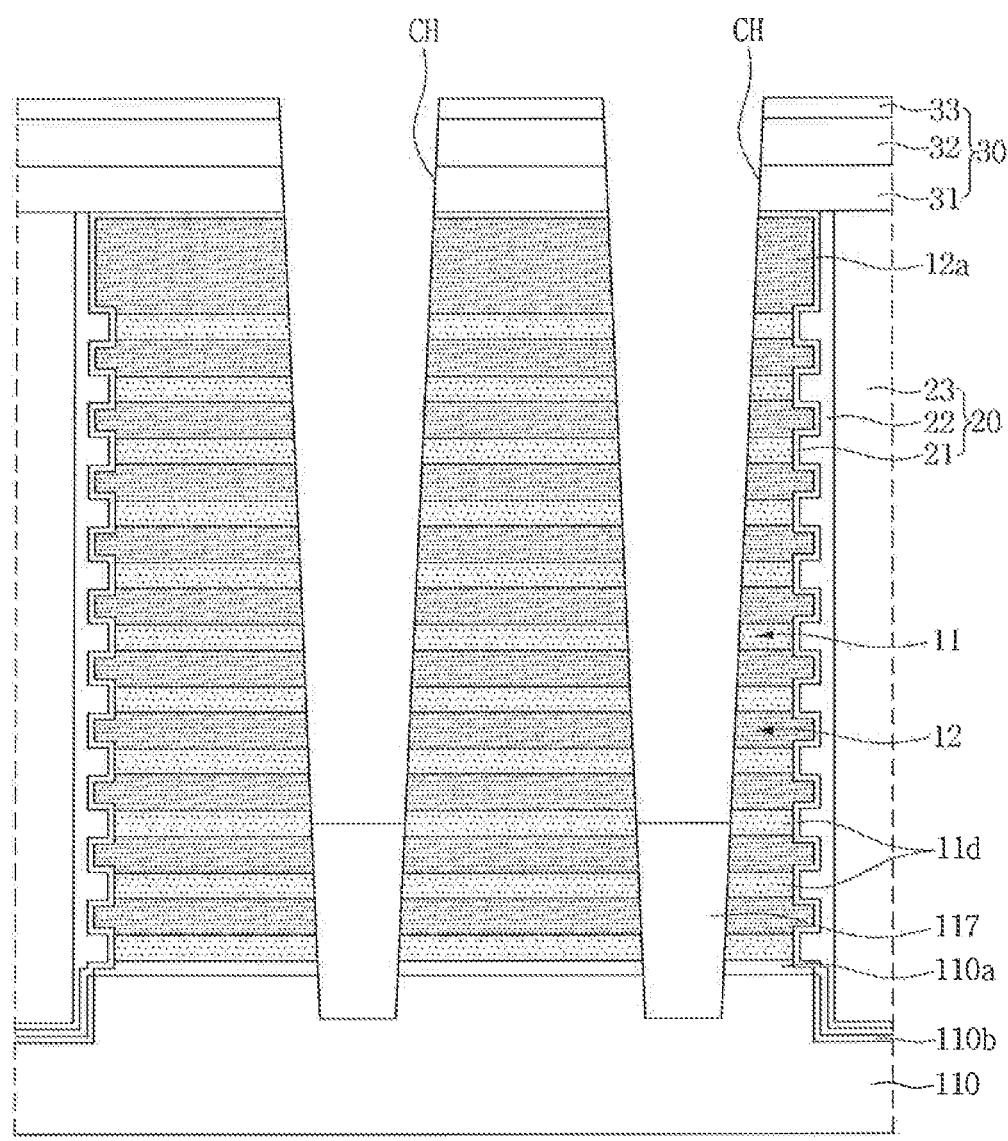

Referring to FIG. 12, epitaxial layers 117 may be formed on the surface of the substrate 110 through the channel holes CH. The epitaxial layer 117 may be formed using a selective epitaxial growth (SEG) process. The epitaxial layer 117 may have a thickness such that the upper surface of the epitaxial layer 117 may be adjacent to one of the lower dummy insulating layers 11d of the first insulating layers 11.

Figure 13:
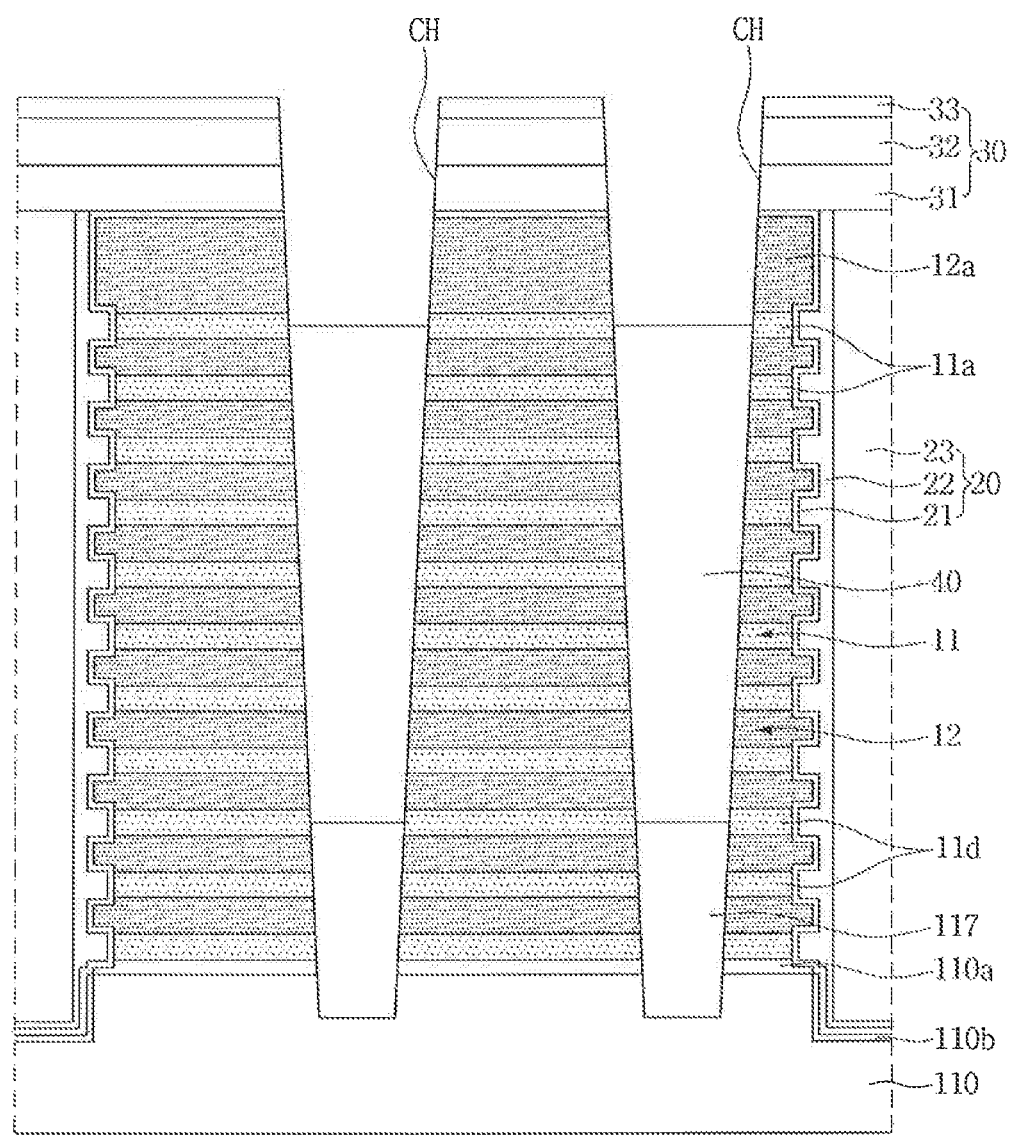

Referring to FIG. 13, first sacrificial patterns 40 may be formed on the epitaxial layer 117 disposed in the channel holes CH. The first sacrificial pattern 40 may have etch selectivity with respect to the first insulating layers 11, second insulating layers 12, and the mask 30. For example, the first sacrificial pattern 40 may include silicon oxycarbide (SiOC) which contains carbon (C) to the extent that such silicon oxycarbide (SiOC) may be used as a spin on hardmask (SOH). The formation of the first sacrificial pattern 40 in the channel holes CH may include forming a sacrificial material in the channel hole CH and on the mask 30 by performing a deposition process. The sacrificial material formed on the mask 30 and the sacrificial material filled in an upper part of the channel holes CH may be removed using an etch-back process. The first sacrificial patterns 40 may be formed to have its upper surface adjacent to one of the upper dummy insulating layers 11a. For example, the upper surface of the first sacrificial patterns 40 may be adjacent to the upper dummy insulating layer 11a which is in contact with the uppermost insulating layer 12a.

Figure 14:
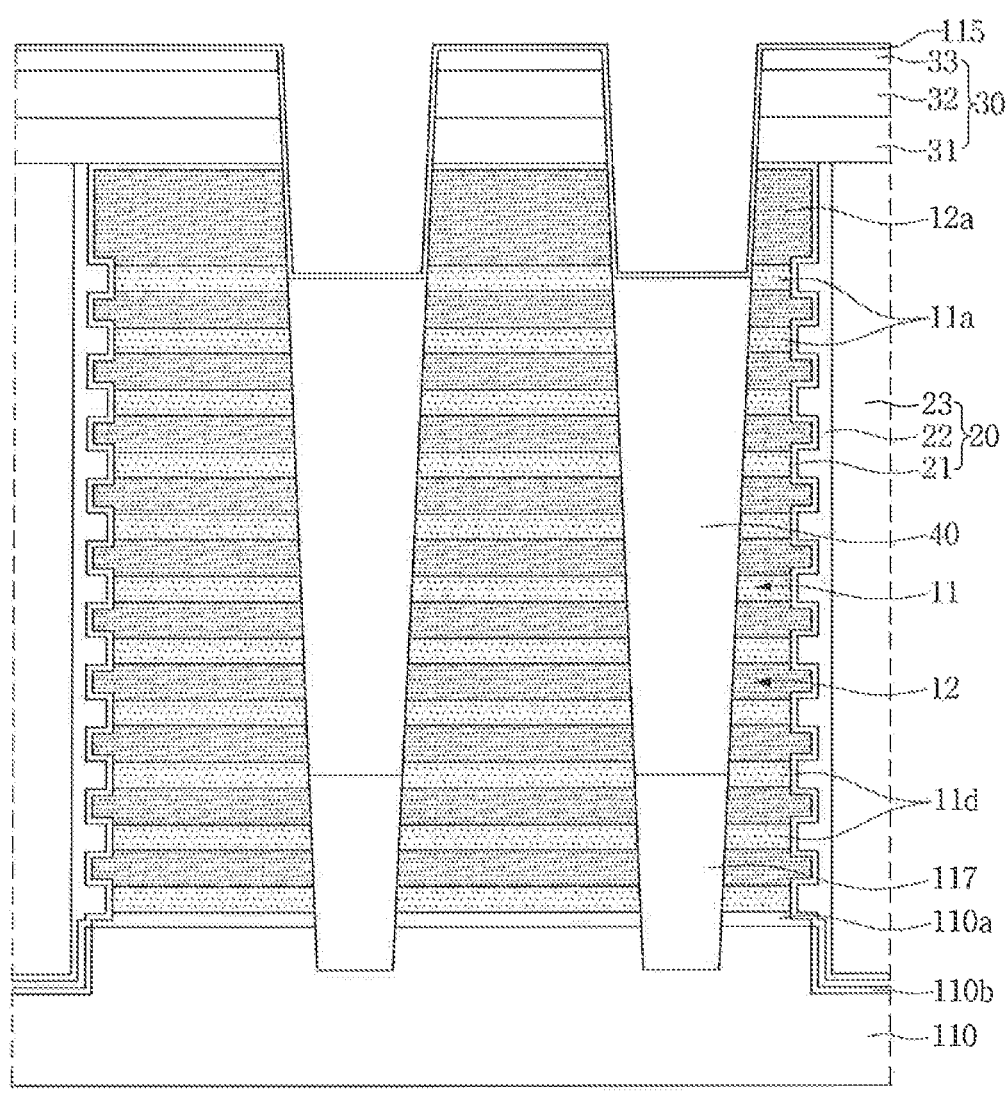

Referring to FIG. 14, a buffer layer 115 may be formed on the surface of the first sacrificial pattern 40, on upper inside walls of the channel holes CH, and on the mask 30. The buffer layer 115 may be conformally formed. The buffer layer 115 may include polysilicon.

Figure 15:
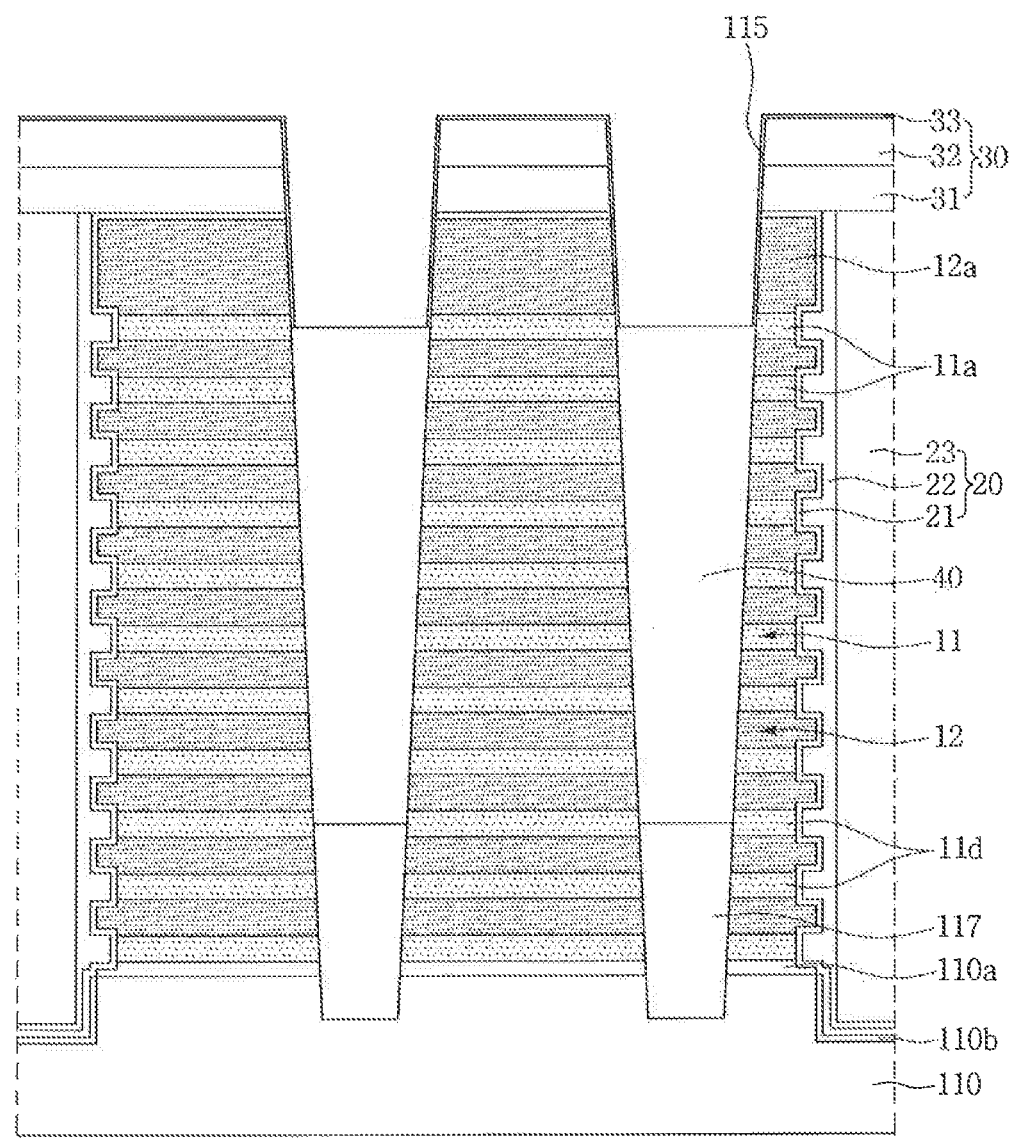

Referring to FIG. 15, the buffer layer 115 formed on the first sacrificial pattern 40 may be removed to expose an upper surface of the first sacrificial pattern 40 using a dry etching process. In this process, the buffer layer 115 formed on the mask 30 may be removed, and the third mask 33 may be partially removed in a thickness direction. Thus, as shown in FIG. 15, the buffer layer 115 may remain only on the upper inside walls of the channel holes CH.

Figure 16:
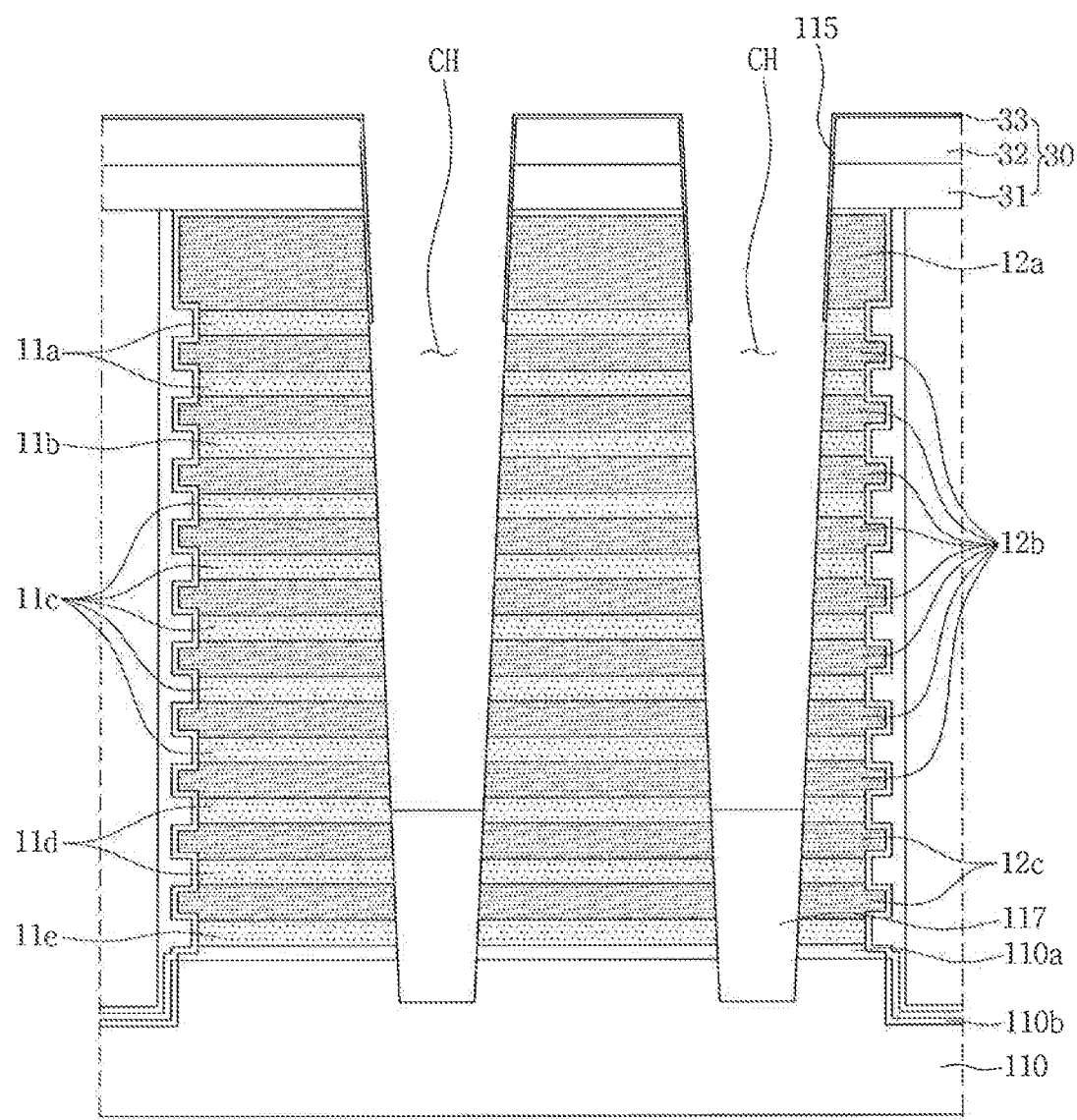

Referring to FIG. 16, the first sacrificial pattern 40 formed in the channel hole CH may be removed using a dry etching process. For example, the first sacrificial pattern 40 may be removed using a plasma etching process. As the first sacrificial pattern 40 formed in the channel holes CH is removed, the side surfaces of the first insulating layers 11 and the second insulating layers 12 may be exposed to the inside of the channel hole CH.

For example, side surfaces of the upper dummy insulating layers 11a, the upper insulating layer 11b, the intermediate insulating layers 11c, and one of the lower dummy insulating layers 11d among the first insulating layers 11 may be exposed to the inside of the channel holes CH, and sides of the intermediate insulating layers 12b of the second insulating layers 12 may also be exposed. In this case, sides of the uppermost insulating layer 12a of the second insulating layers 12 need not be exposed to the inside of the channel holes CH due to the buffer layer 115, and sides of the lower insulating layers 12c need not be exposed to the inside of the channel hole CH due to the epitaxial layer 117. Likewise, side surfaces of one of the lower dummy insulating layers 11d and the lower insulating layer 11e among the first insulating layers 11 need not be exposed to the inside of the channel hole CH due to the epitaxial layer 117.

Figure 17:
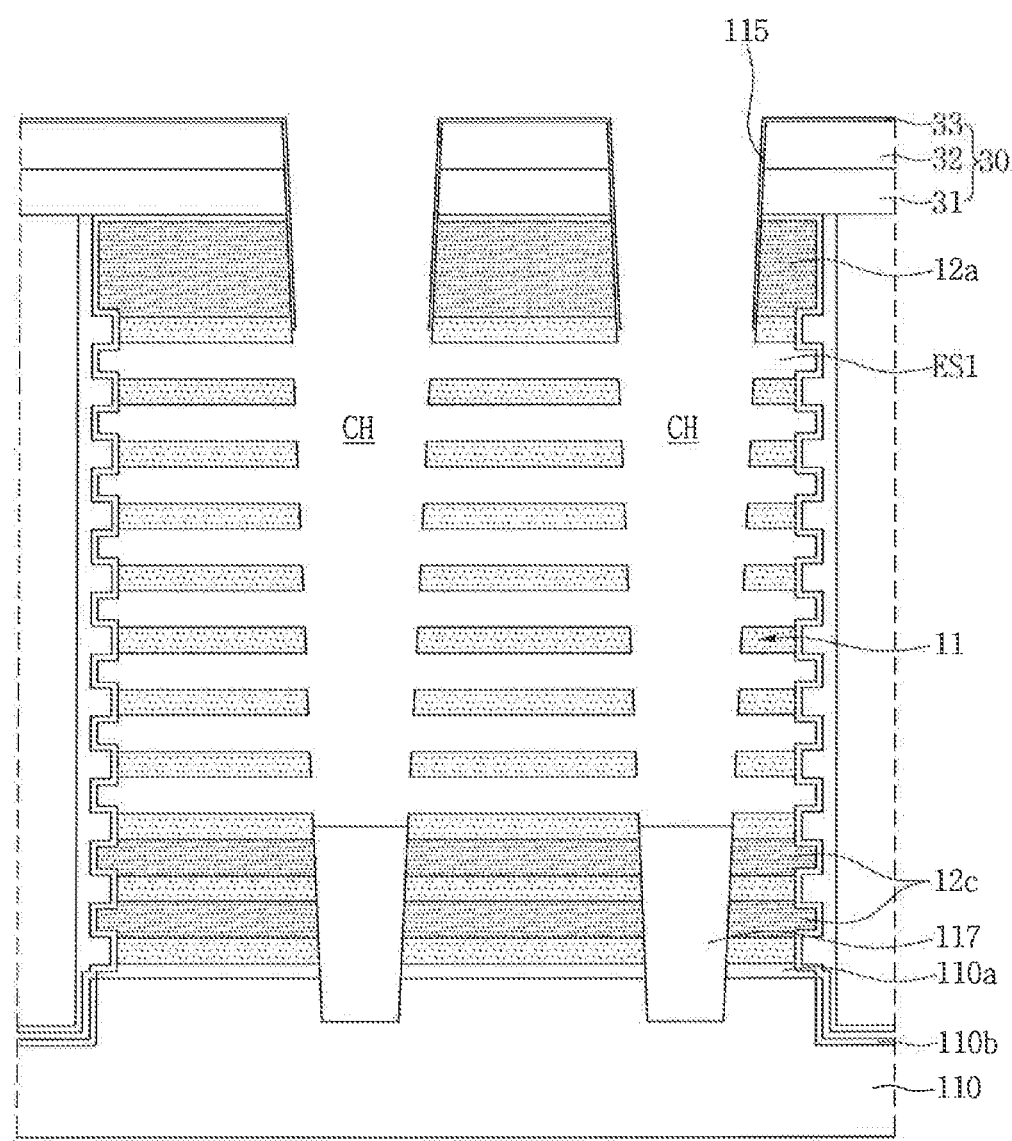

Referring to FIG. 17, the intermediate insulating layers 12b may be removed through the channel holes CH. Such removal of the intermediate insulating layers 12b may form first spaces ES1 disposed between the first insulating layers 11. The first space ES1 may be a space to be an air gap in a subsequent process.

Figure 18:
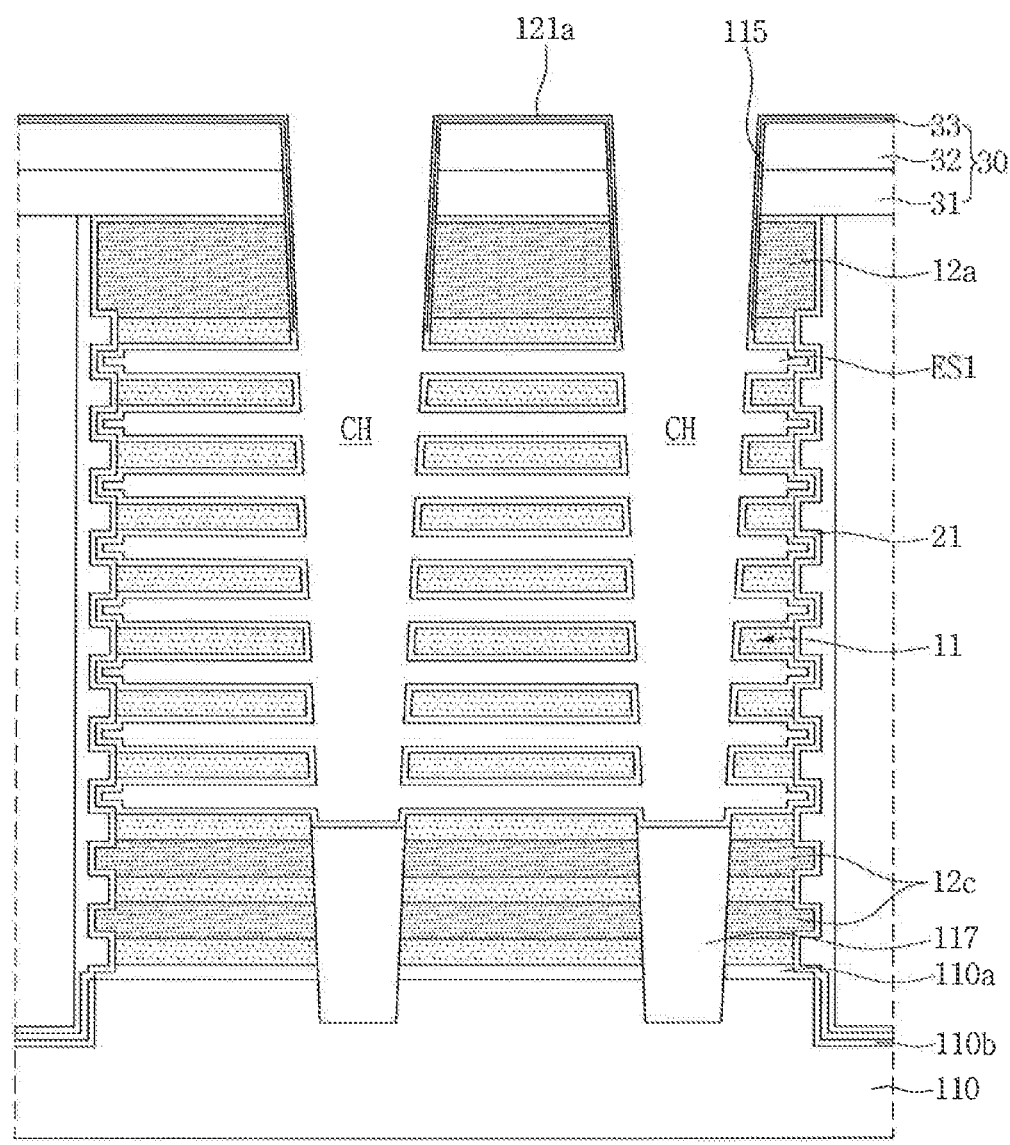

Referring to FIG. 18, a blocking layer 121a may be conformally formed on the resulting structure of FIG. 17.

For example, the blocking layer 121a may be conformally formed on the mask 30, inside walls of the channel holes CH, the first insulating layers 11, the first protection layer 21, and the epitaxial layer 117. The blocking layer 121a may include silicon oxide. The blocking layer 121a may be formed using a deposition process.

Figure 19:
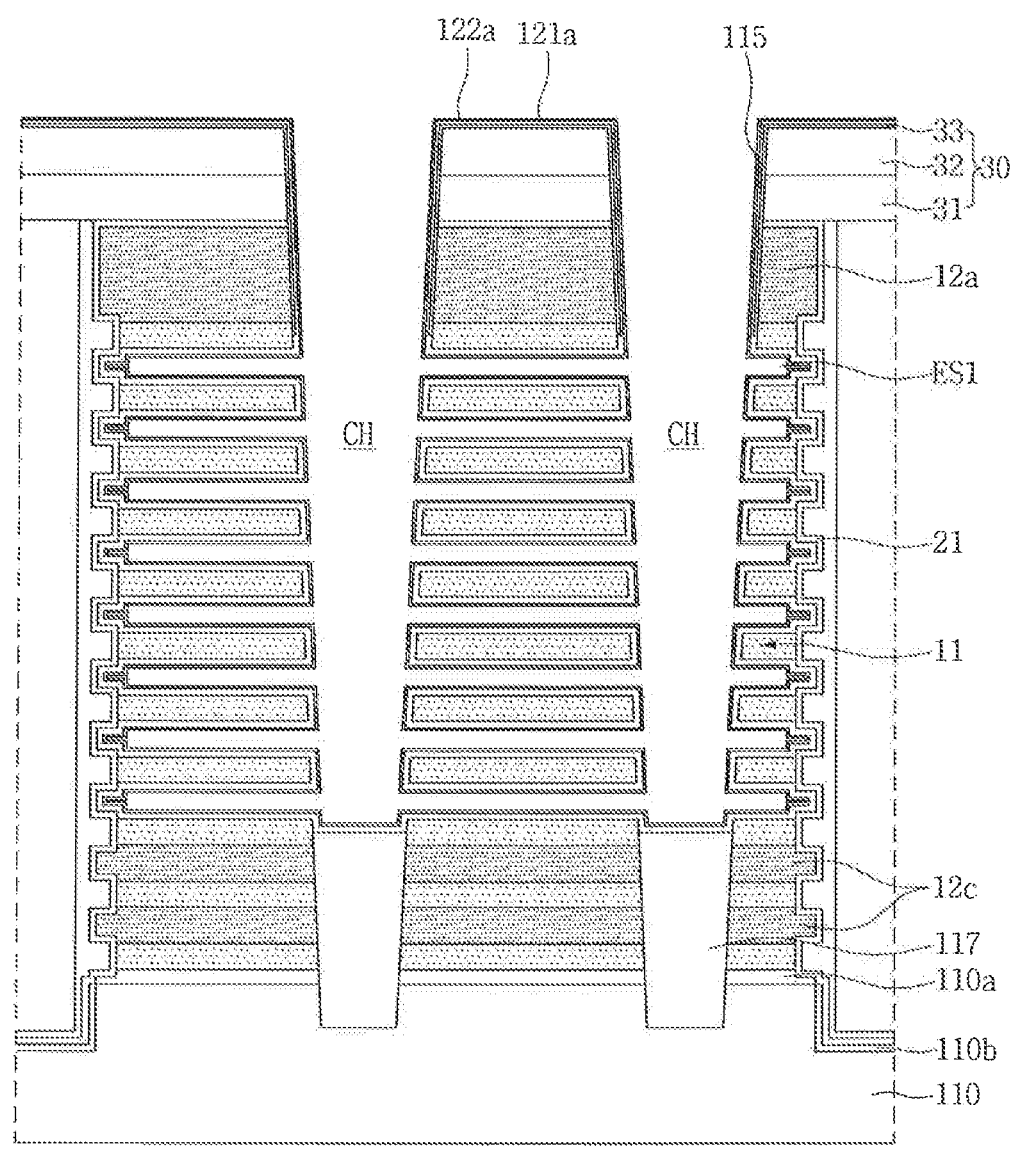

Referring to FIG. 19, the method may include forming a first charge trap layer 122a on the blocking layer 121a. The first charge trap layer 122a may be conformally formed on the blocking layer 121a. The first charge trap layer 122a may include silicon nitride. The first charge trap layer 122a may be formed using a deposition process.

Figure 20:
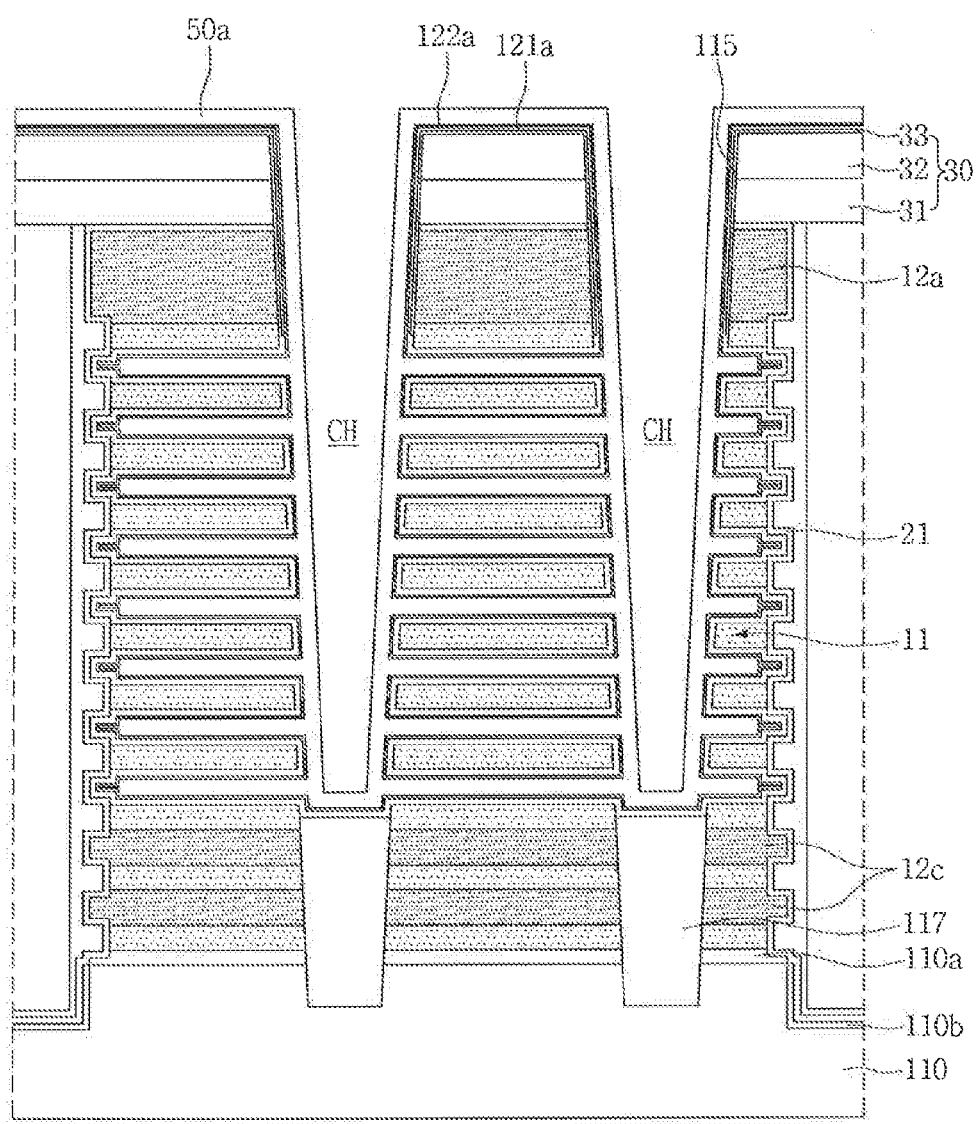

Referring to FIG. 20, a sacrificial layer 50a may be formed on the first charge trap layer 122a. The sacrificial layer 50a may be formed to fill insides of the first spaces ES1. The sacrificial layer 50a may include polysilicon. The sacrificial layer 50a may be formed using a deposition process.

Figure 21:
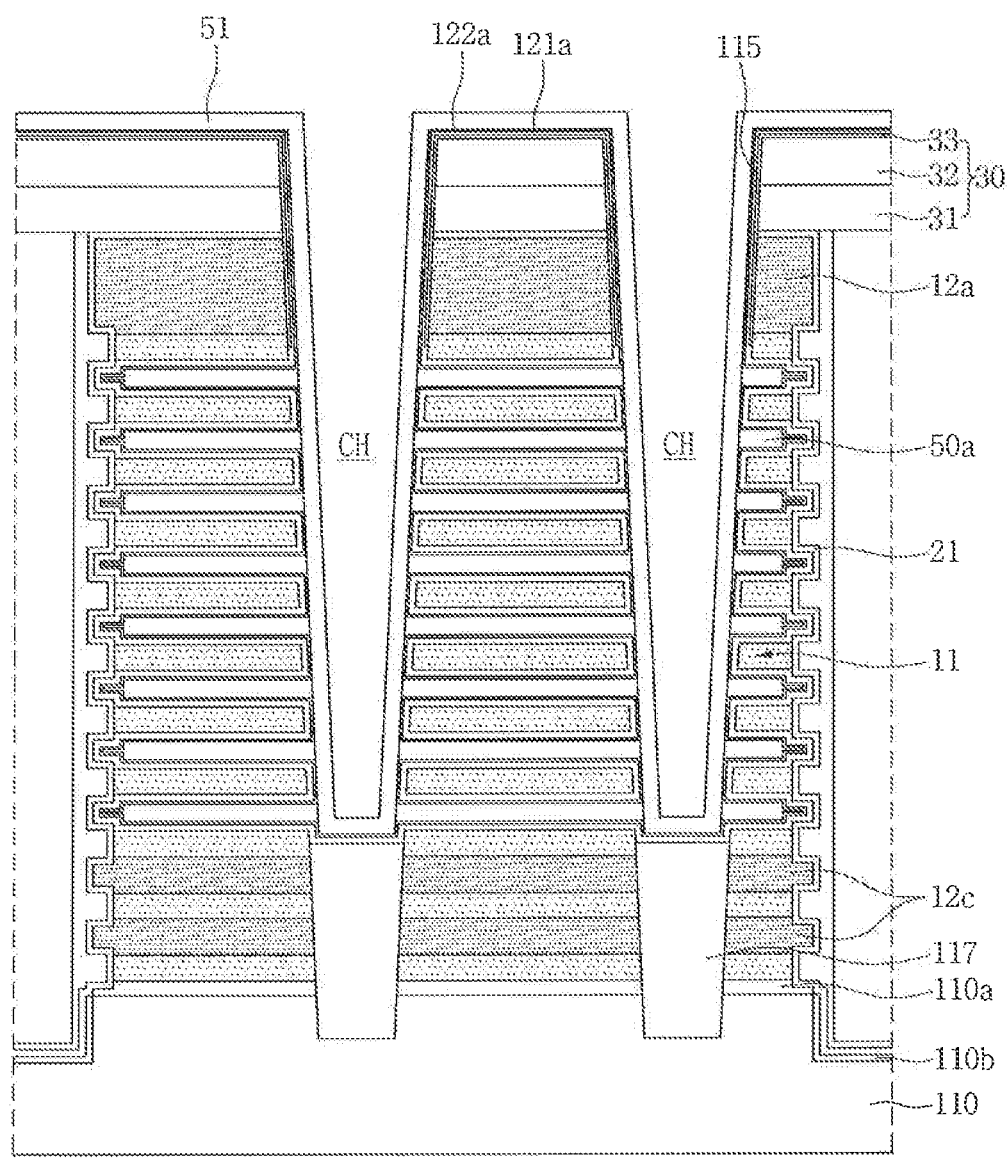

Referring to FIG. 21, an oxide layer 51 may be formed by oxidizing the sacrificial layers 50a except for the sacrificial layers 50a formed in the insides of the first spaces ES1. The sacrificial layers 50a formed in the insides of the first spaces ES1 may remain unoxidized. For example, the sacrificial layer 50a may be converted to the oxide layer 51 using a wet oxidation process.

Figure 22:
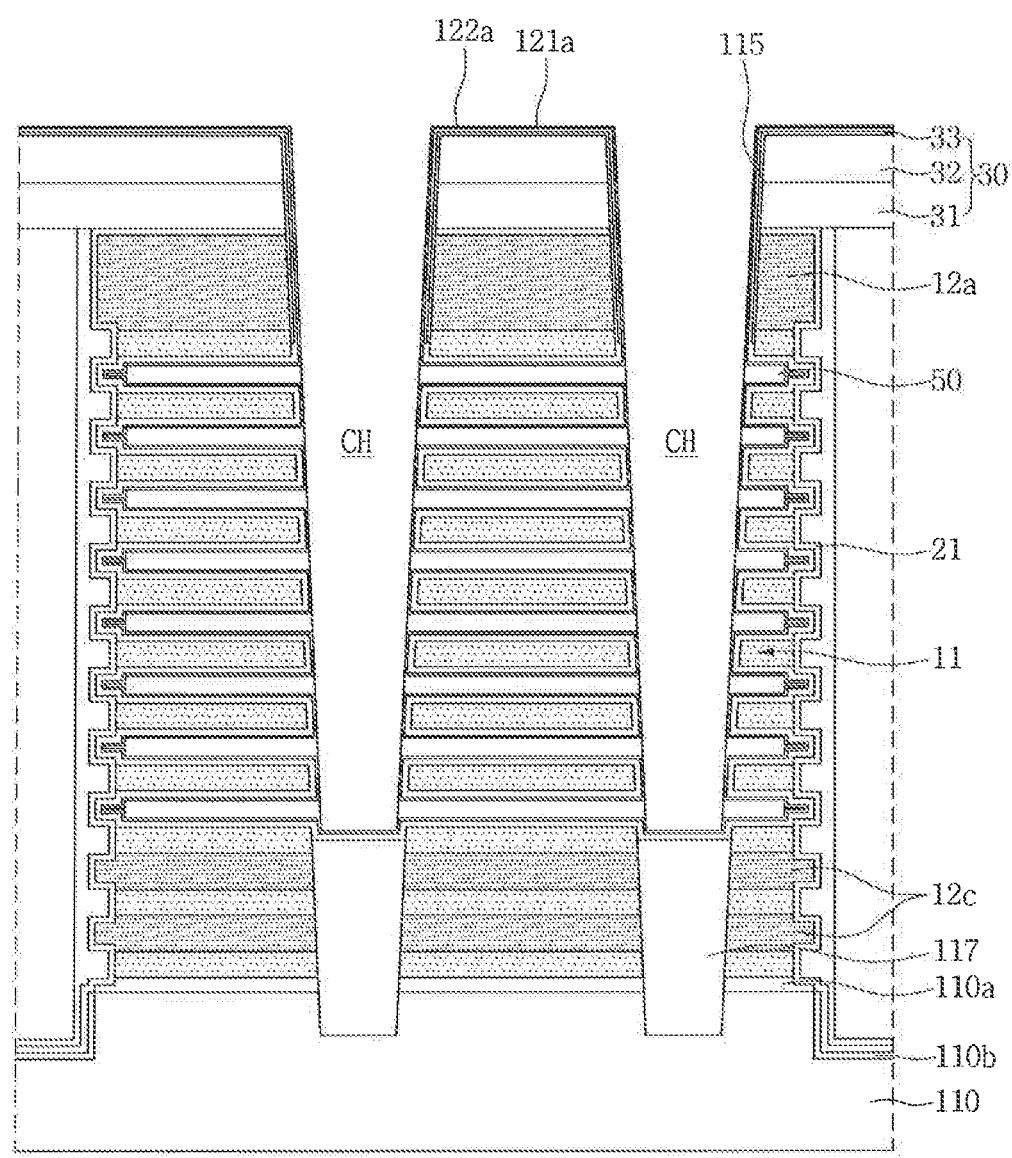

Referring to FIG. 22, the oxide layer 51 may be removed, and thus the second sacrificial layer may remain in the first spaces ES1. The second sacrificial pattern 50 may include polysilicon. Side surfaces of the second sacrificial patterns 50 may be exposed to the insides of the channel holes CH. Further, the first charge trap layer 122a disposed underneath the oxide layer 51 may be exposed by removing the oxide layer 51. The side surfaces of the second sacrificial patterns 50 may be vertically aligned with the first charge trap layer 122a formed on the first insulating layers 11.

Figure 23:
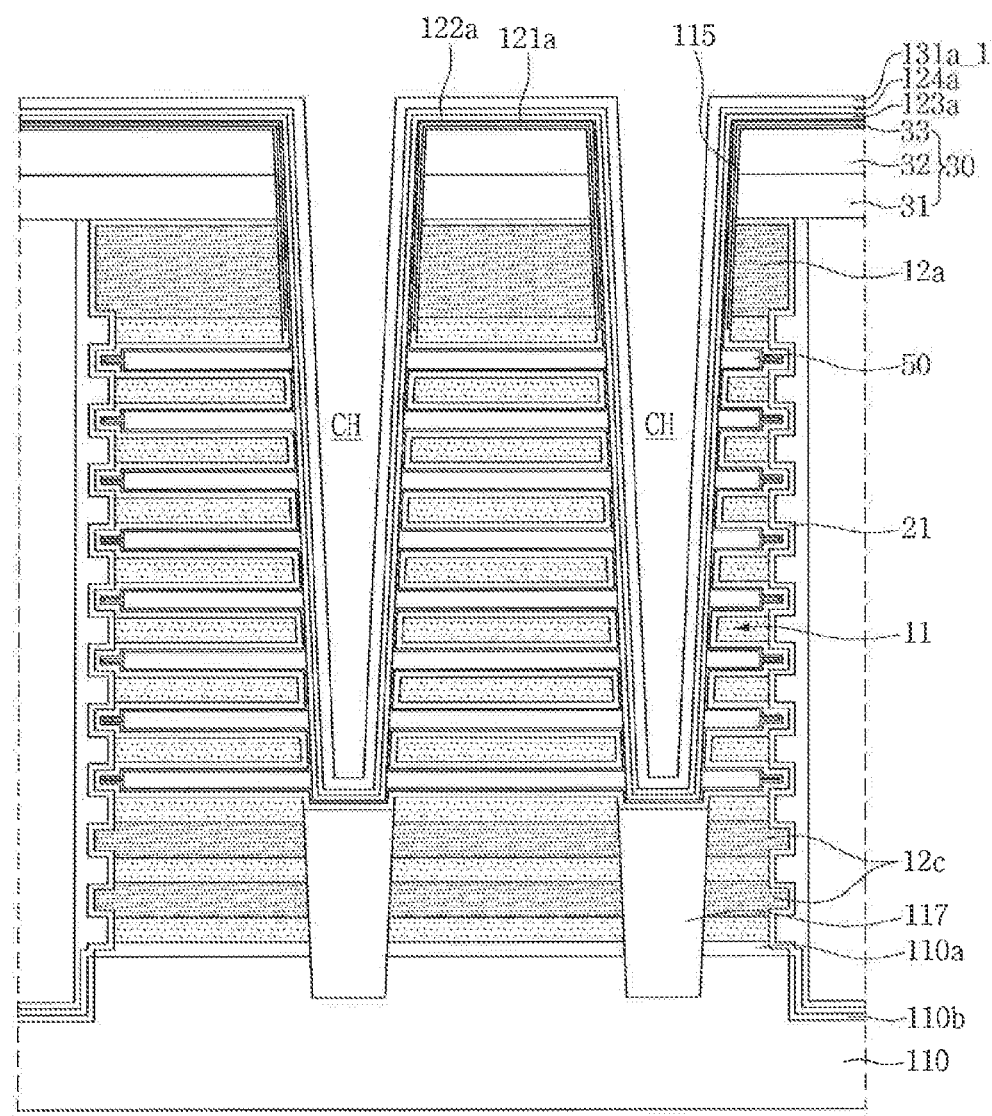

Referring to FIG. 23, a second charge trap layer 123a, a tunneling insulating layer 124a, and a first channel active layer 131a_1 are sequentially formed on the first charge trap layer 122a and the side surfaces of the second sacrificial patterns 50. Here, the side surface of the second sacrificial pattern 50 may be substantially perpendicular to the substrate 110. The second charge trap layer 123a may include silicon nitride. The tunneling insulating layer 124a may include silicon oxide. The first channel active layer 131a_1 may include polysilicon. The second charge trap layer 123a, the tunneling insulating layer 124a, and the first channel active layer 131a_1 each may be formed using a deposition process.

Figure 24:
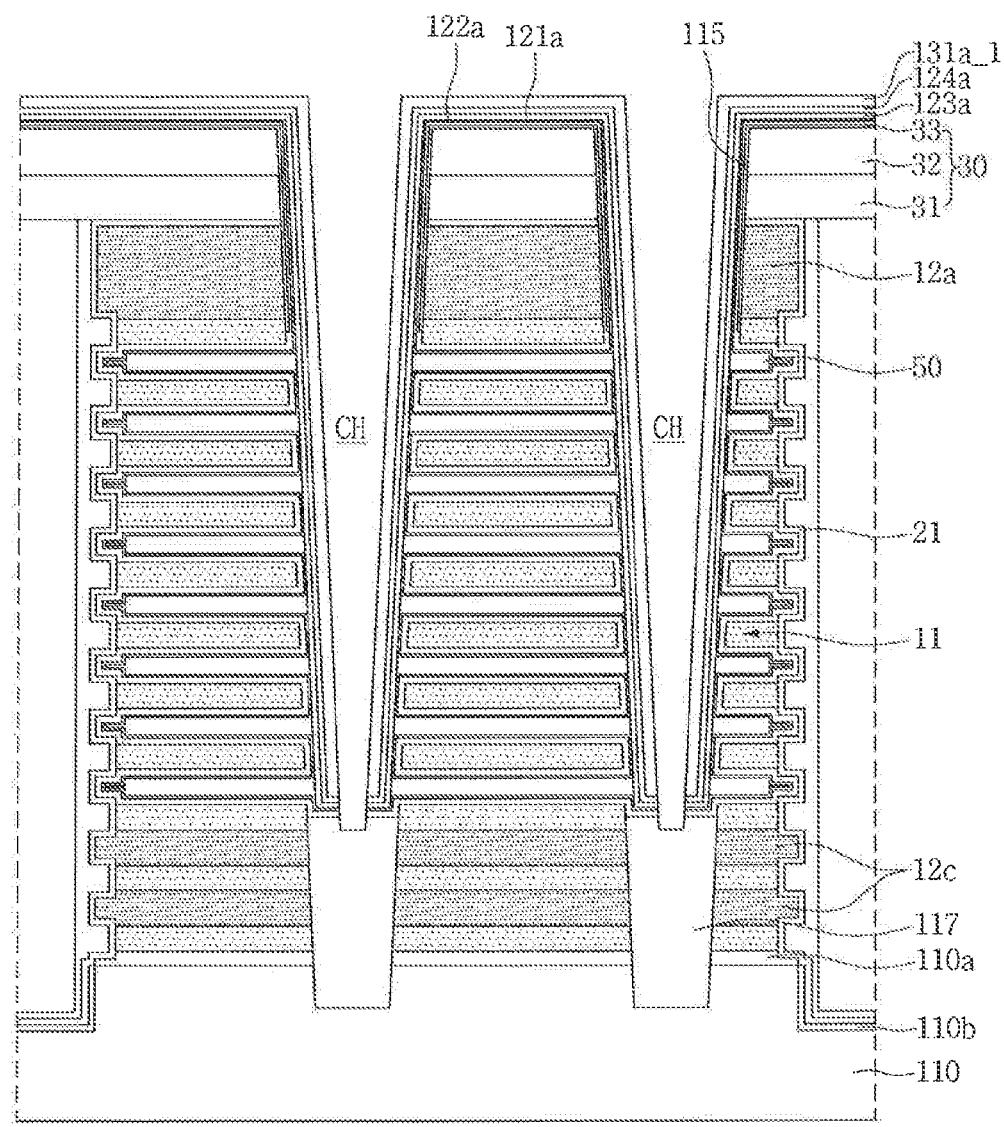

Referring to FIG. 24, the first channel active layer 131a_1, the tunneling insulating layer 124a, the second charge trap layer 123a, the first charge trap layer 122a, and the blocking layer 121a may partially removed to expose a part of a top surface of the epitaxial layer 117 using a dry etching process. In this case, exposed parts of the epitaxial layer 117 may be recessed.

Figure 25:
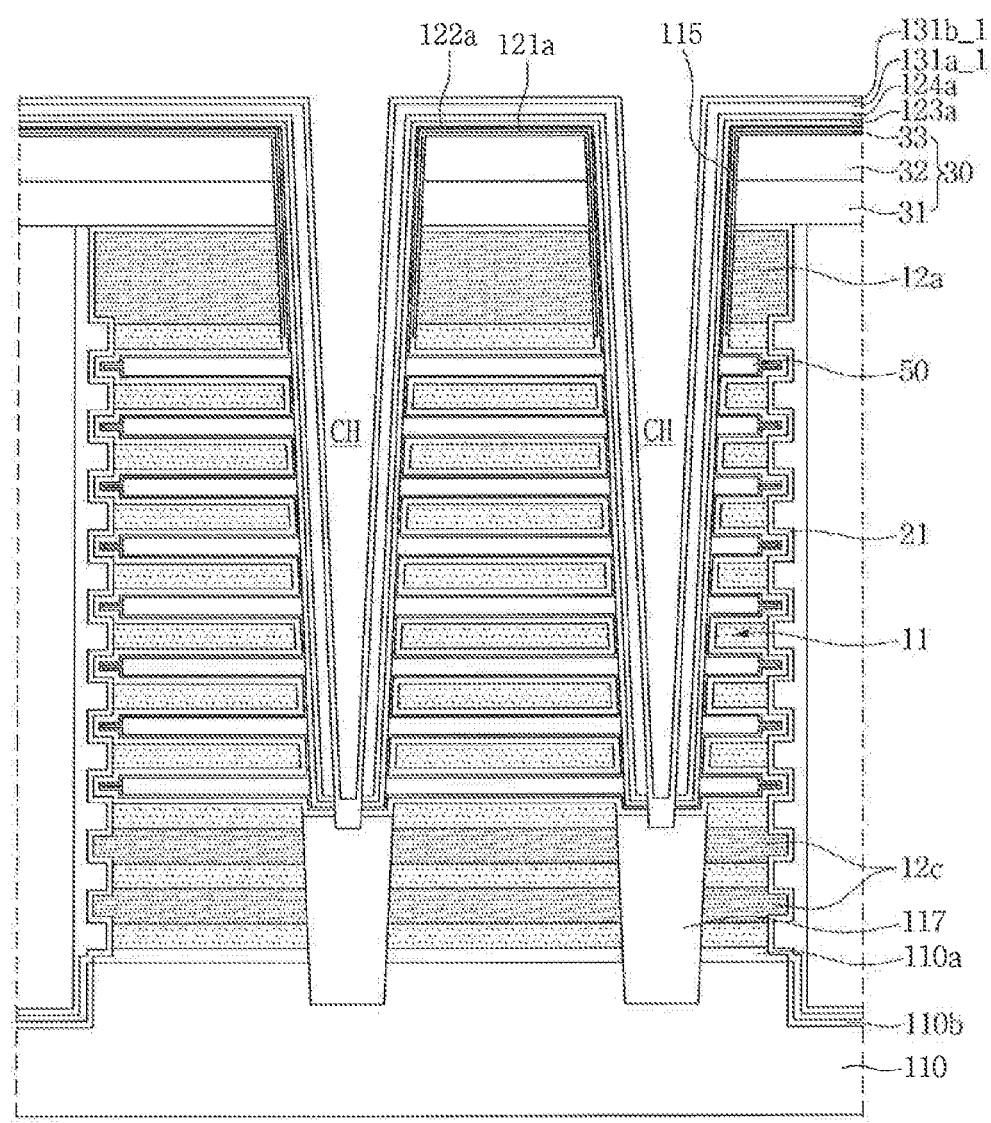

Referring to FIG. 25, the method may include forming a second channel active layer 131b_1 on the first channel active layer 131a_1. The second channel active layer 131b_1 may include polysilicon, and may be formed using a deposition process. The second channel active layer 131b_1 may be in contact with the exposed parts of the epitaxial layer 117.

Figure 26:
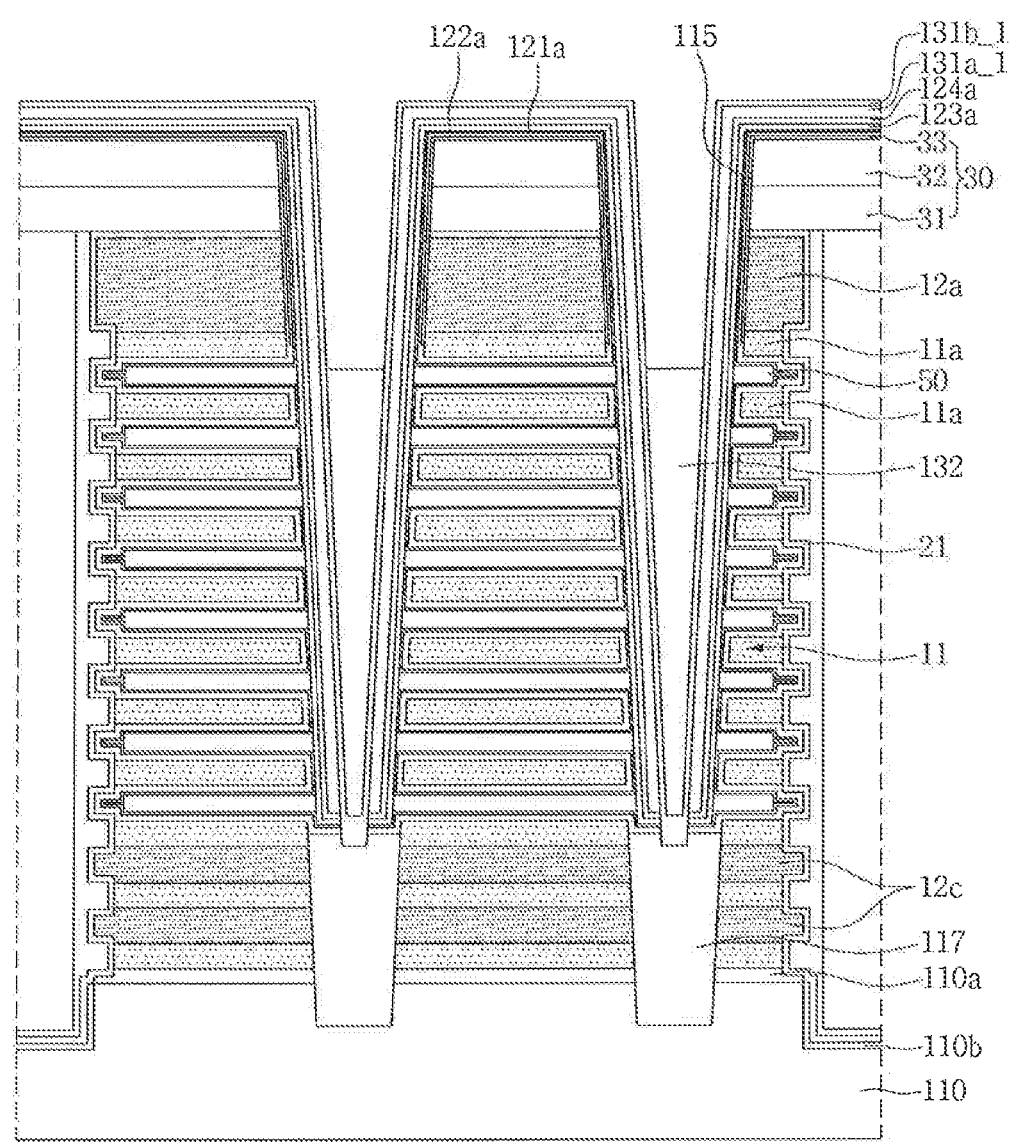

Referring to FIG. 26, a channel core pattern 132 may be formed in the channel holes CH, partially filling the channel holes CH. For example, the channel core pattern 132 need not be funned on upper parts of the channel holes CH. For example, a top surface of the channel core pattern 132 may be located lower than a top surface of the uppermost insulating layer 12a. The channel core pattern 132 may include silicon oxide. The formation of the channel core pattern 132 may include thrilling a channel core layer including the silicon oxide, completely filling the channel holes CH, and then removing an upper part of the channel core layer using an etch-back process to form the channel core pattern 132 which partially fills the channel holes CH.

Figure 27:
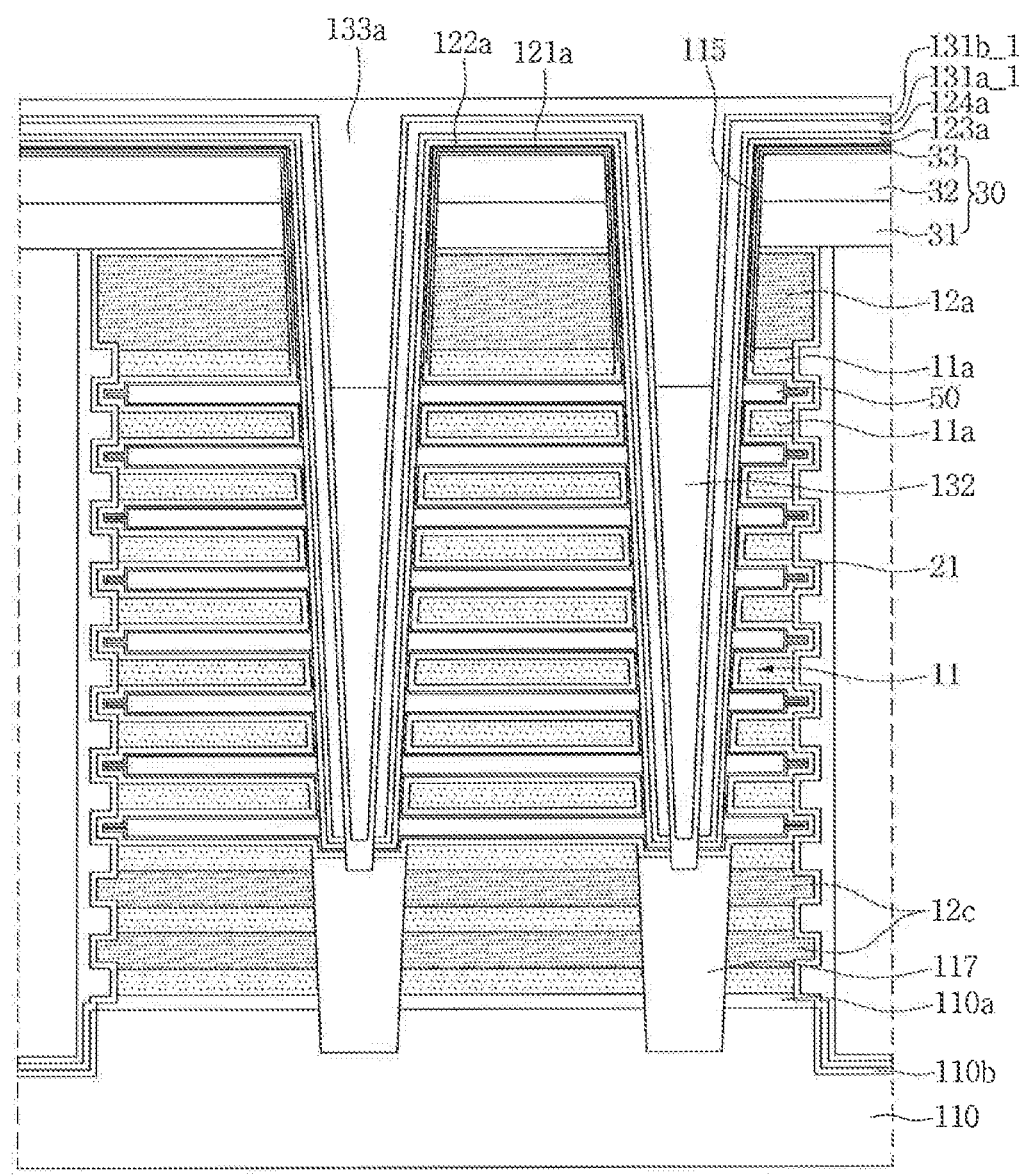

Referring to FIG. 27, a channel pad layer 133a may be formed on the second channel active layer 131b_1 and the channel core pattern 132. The channel pad layer 133a may be formed to fill the upper parts of the channel holes CH. The channel pad layer 133a may include polysilicon.

Figure 28:
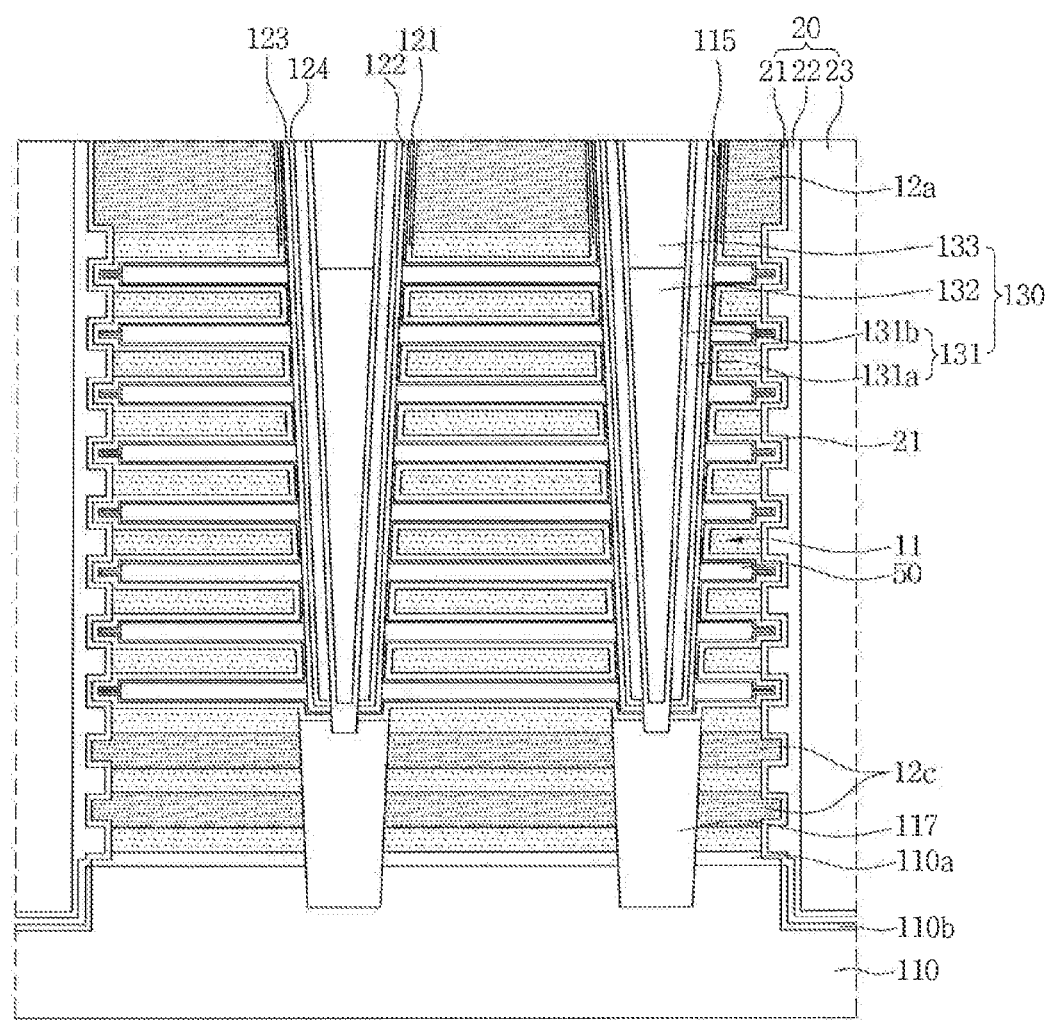

Referring to FIG. 28, channel pad patterns 133 may be formed by performing a planarization process such as a CMP process on the channel pad layer 133a. The planarization process may be performed until the top surface of the uppermost insulating layer 12a and the top surface of the protection layer 20 are exposed. Further, the first channel active layer 131a_1 and the second channel active layer 131b_1 may become a first channel active pattern 131a and a second channel active pattern 131b, respectively, by performing the planarization process. The first channel active pattern 131a and the second channel active pattern 131b may serve as one channel active pattern 131.

Figure 29:
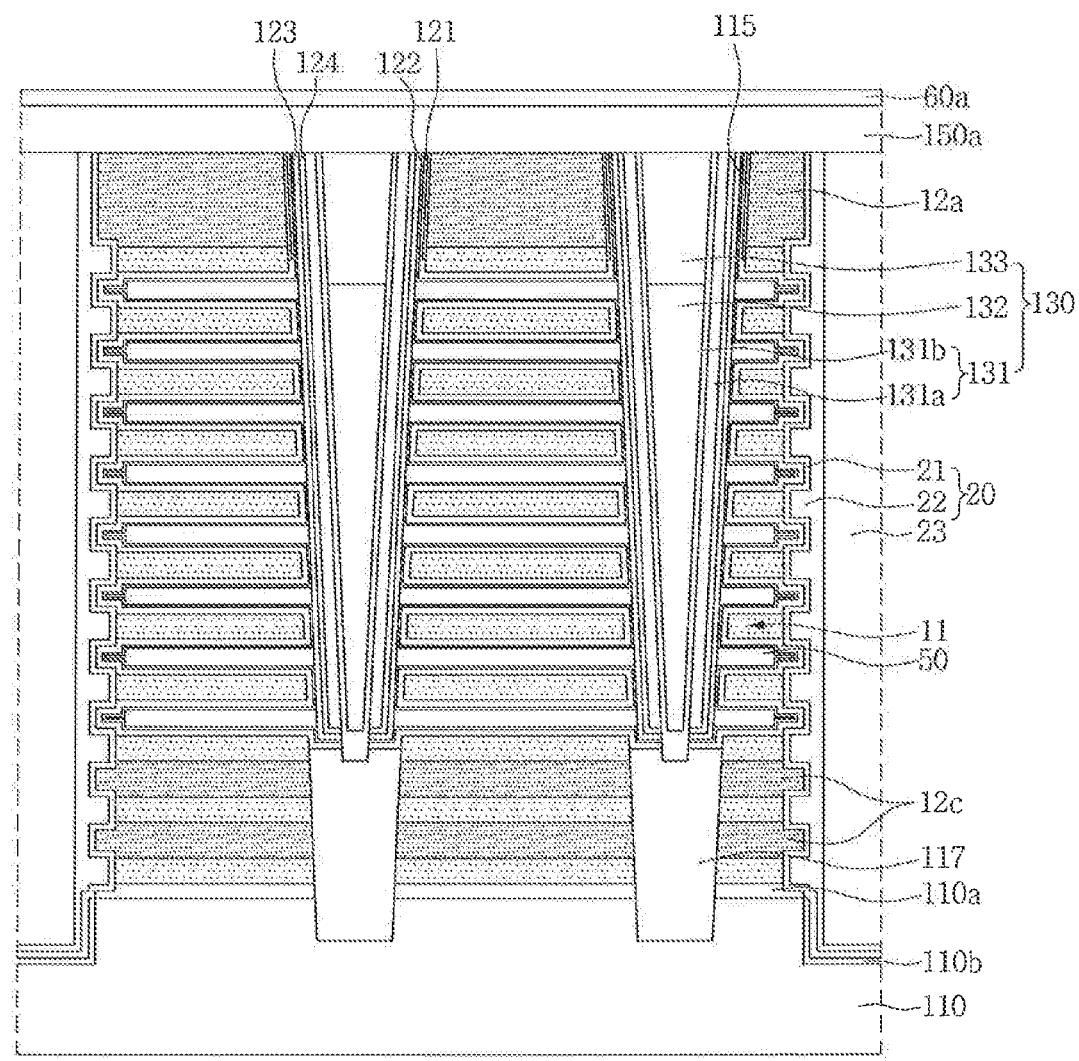

Referring to FIG. 29, a first capping layer 150a and a first spacer layer 60a may be sequentially formed on the channel pad pattern 133, the uppermost insulating layer 12a, and the protection layer 20. The first capping layer 150a may include silicon oxide. The first capping layer 150a may be formed using a deposition process. The first spacer layer 60a may include polysilicon. The first spacer layer 60a may be formed using a deposition process.

Figure 30:
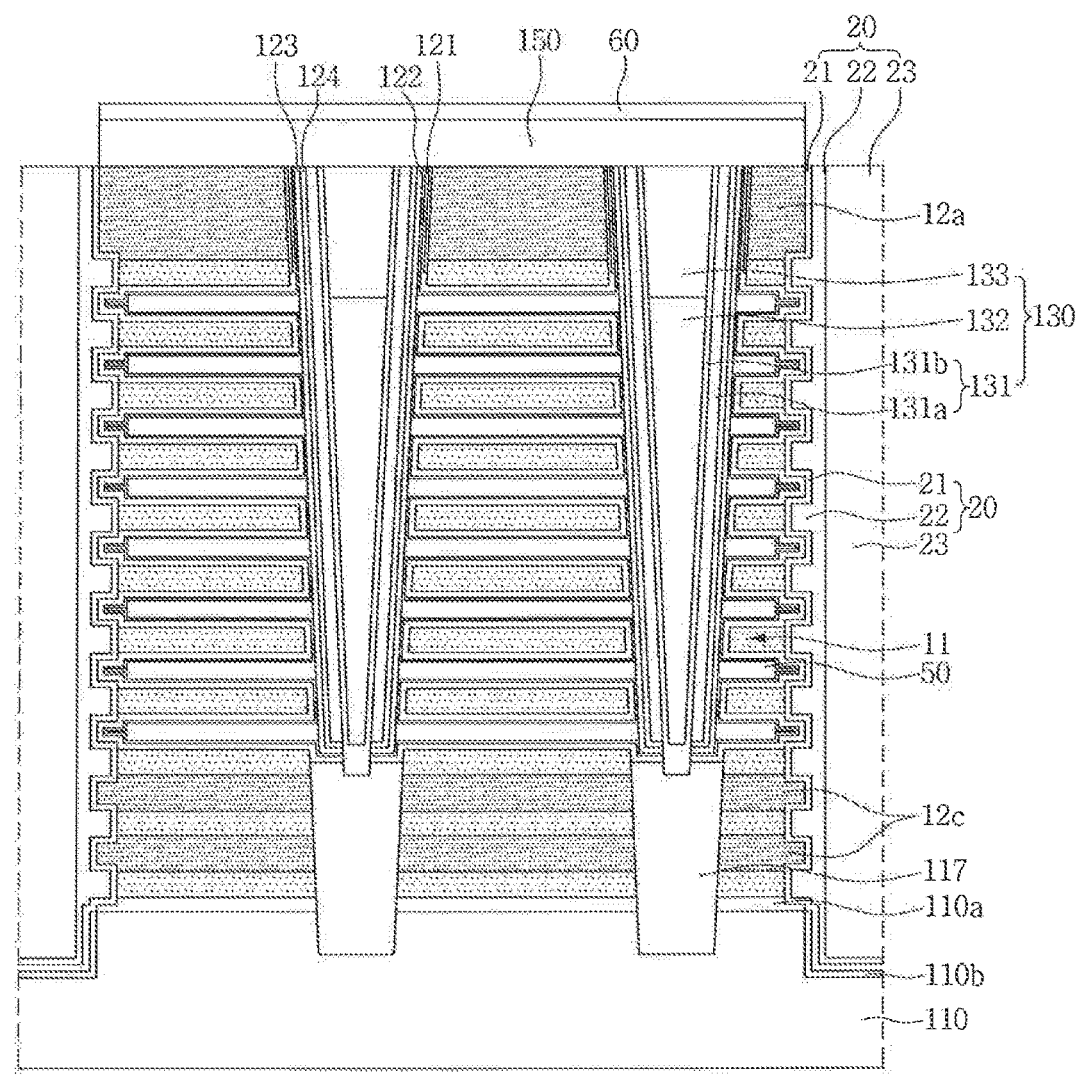

Referring to FIG. 30, a first capping pattern 150 and a first spacer pattern 60 may be formed to partially remove the first capping layer 150a and the first spacer layer 60a to expose the protection layer 20 formed in the isolation trenches SH.

Figure 31:
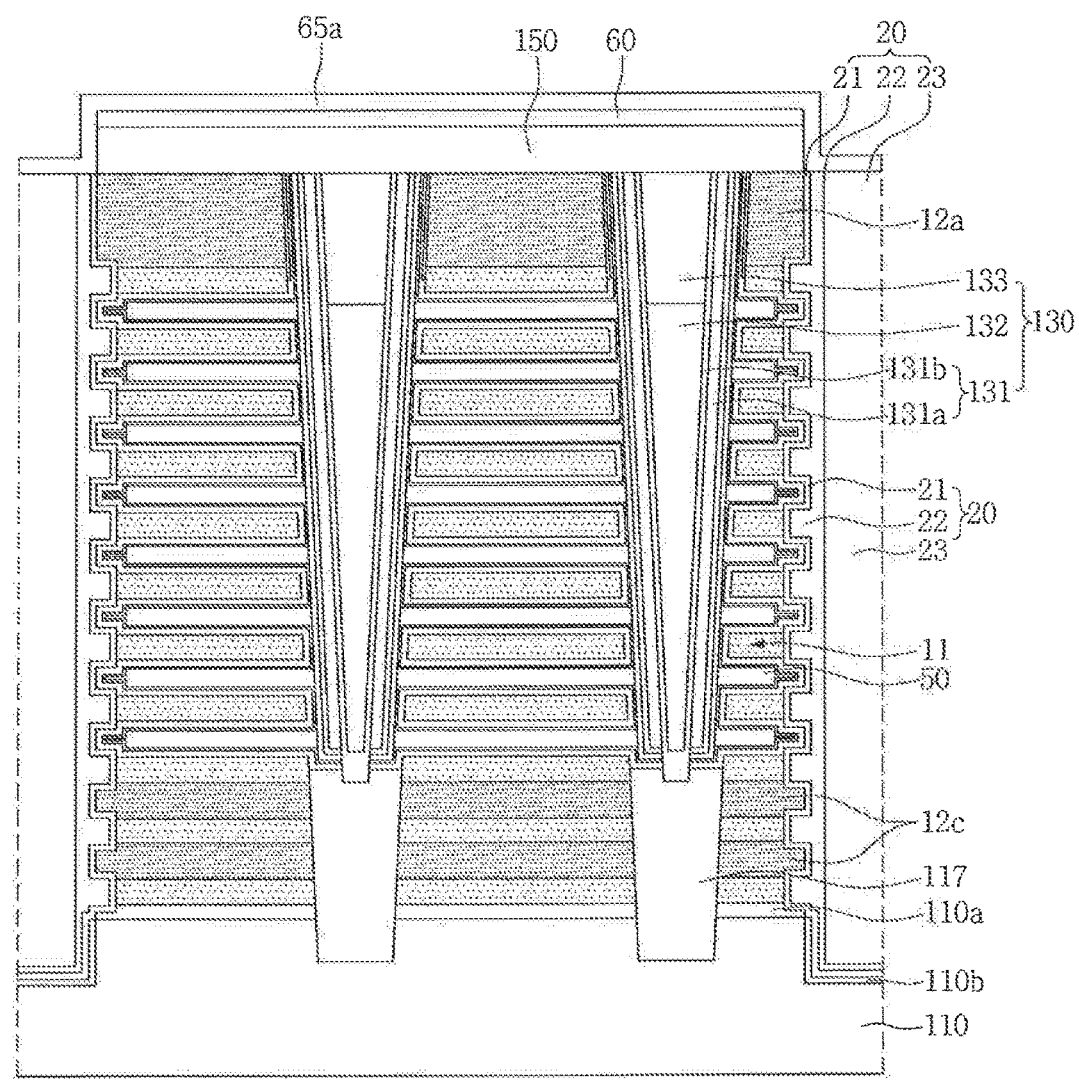

Referring to FIG. 31, a second spacer layer 65a may be conformity formed on the first spacer pattern 60 and the exposed protection layer 20. The second spacer layer 65a may include polysilicon. The second spacer layer 65a may be formed using a deposition process.

Figure 32:
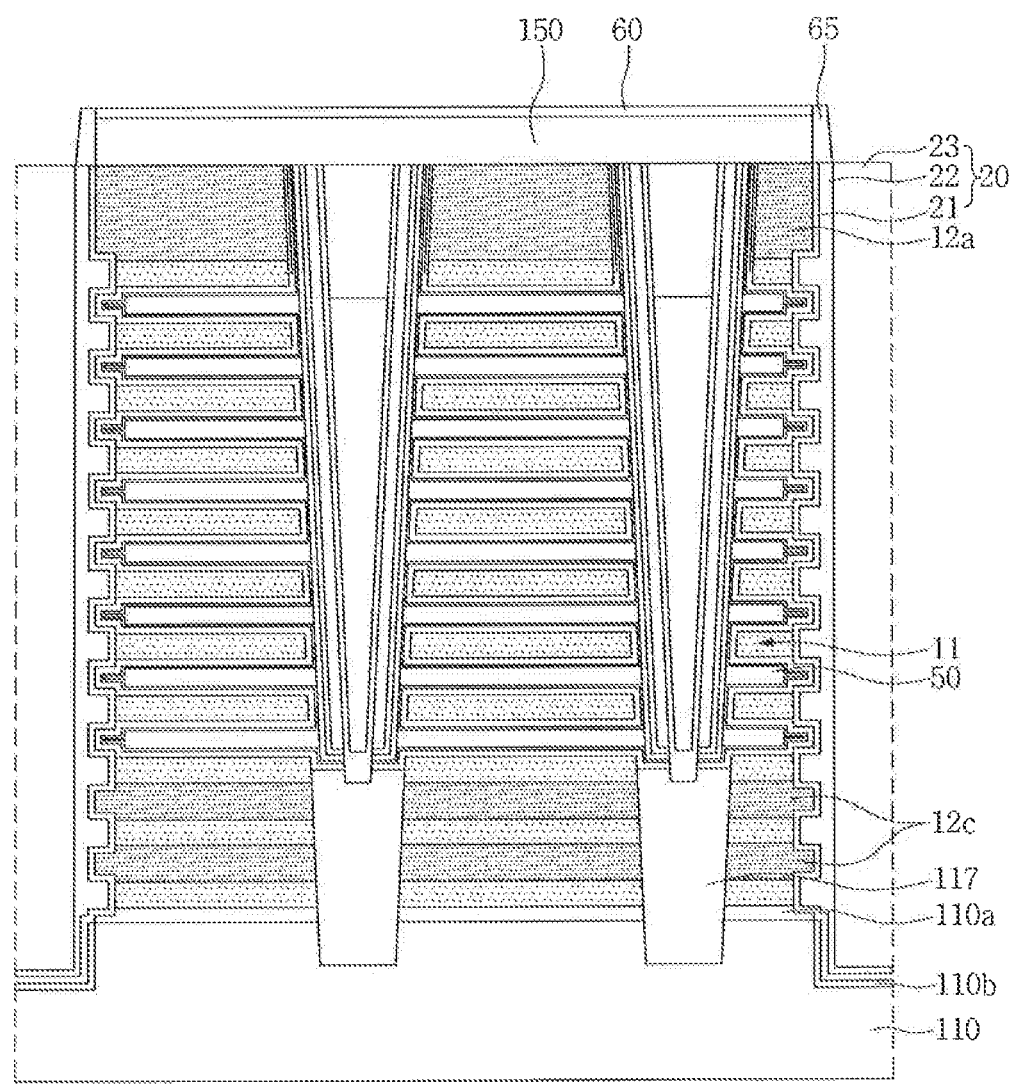

Referring to FIG. 32, a second spacer pattern 65 may be formed to expose the third protection layer 23 of the protection layer 20 using a dry etching process. For example, the second spacer pattern 65 may be formed by removing the second spacer layer 65a located on the first spacer pattern 60, and the second spacer layer 65a located on the protection layer 20. The second spacer pattern 65 may be formed to cover a side surface of the first spacer pattern 60, a side surface of the first capping pattern 150, a top surface of the first protection layer 21, and a top surface of the second protection layer 22. Here, the side surface of the first spacer pattern 60 and the side surface of the first capping pattern 150 each may be substantially perpendicular to the substrate 110, and the top surface of the first protection layer 21 and the top surface of the second protection layer 22 may be in substantially parallel to the surface of the substrate 110. Further, the second spacer pattern 65 may partially cover a part of the third protection layer 23 which is in contact with the surface of the second protection layer 22. The first spacer pattern 60 may be partially removed in a thickness direction in the dry etching process of thrilling the second spacer pattern 65.

Figure 33:
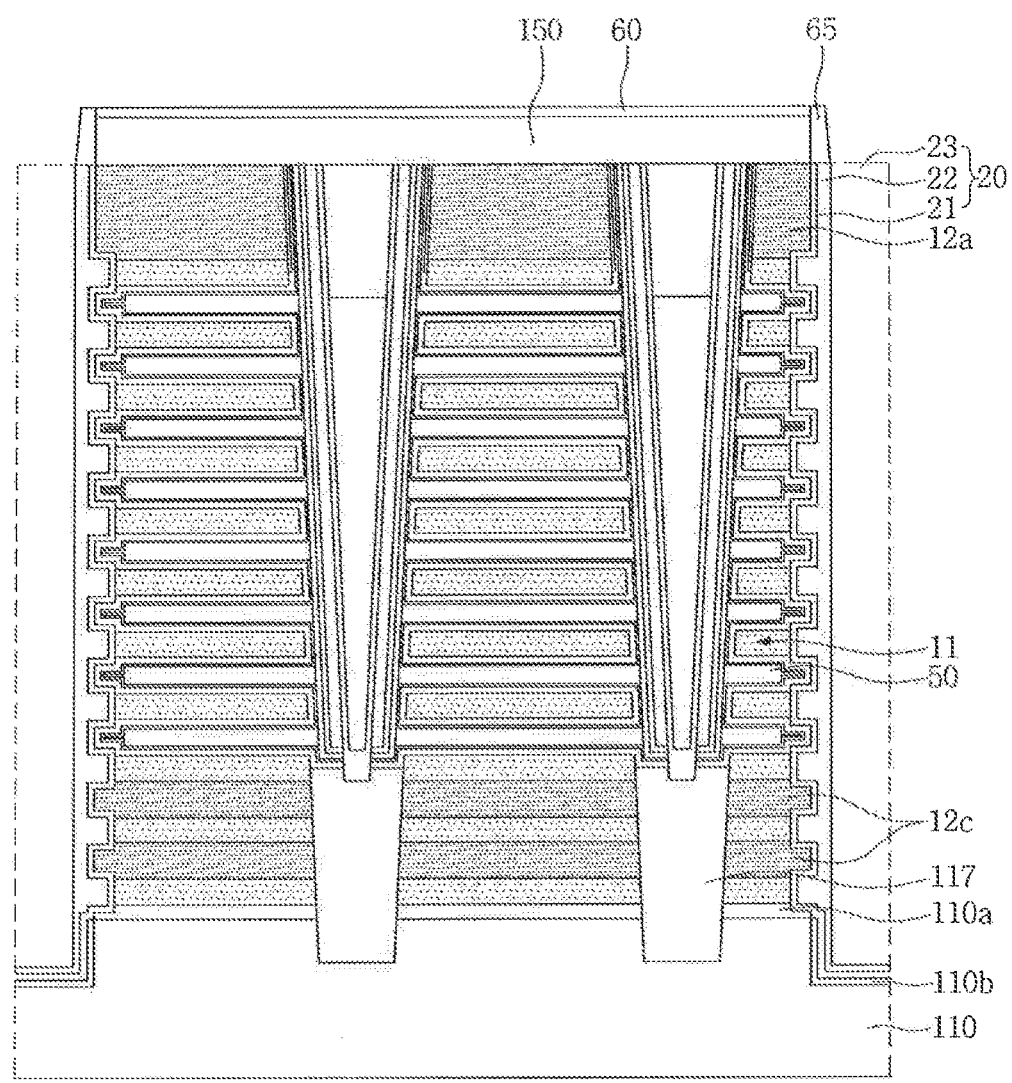

Referring to FIG. 33, the exposed third protection layer 23 may be removed using the second spacer 65 as an etch mask. For example, the third protection layer 23 may be removed using an etching process which may have etch selectivity of the third protection layer 23 with respect to the second protection layer 22, the first spacer pattern 60, and the second spacer pattern 65, and thus the third protection layer 23 may be mostly removed.

Figure 34:
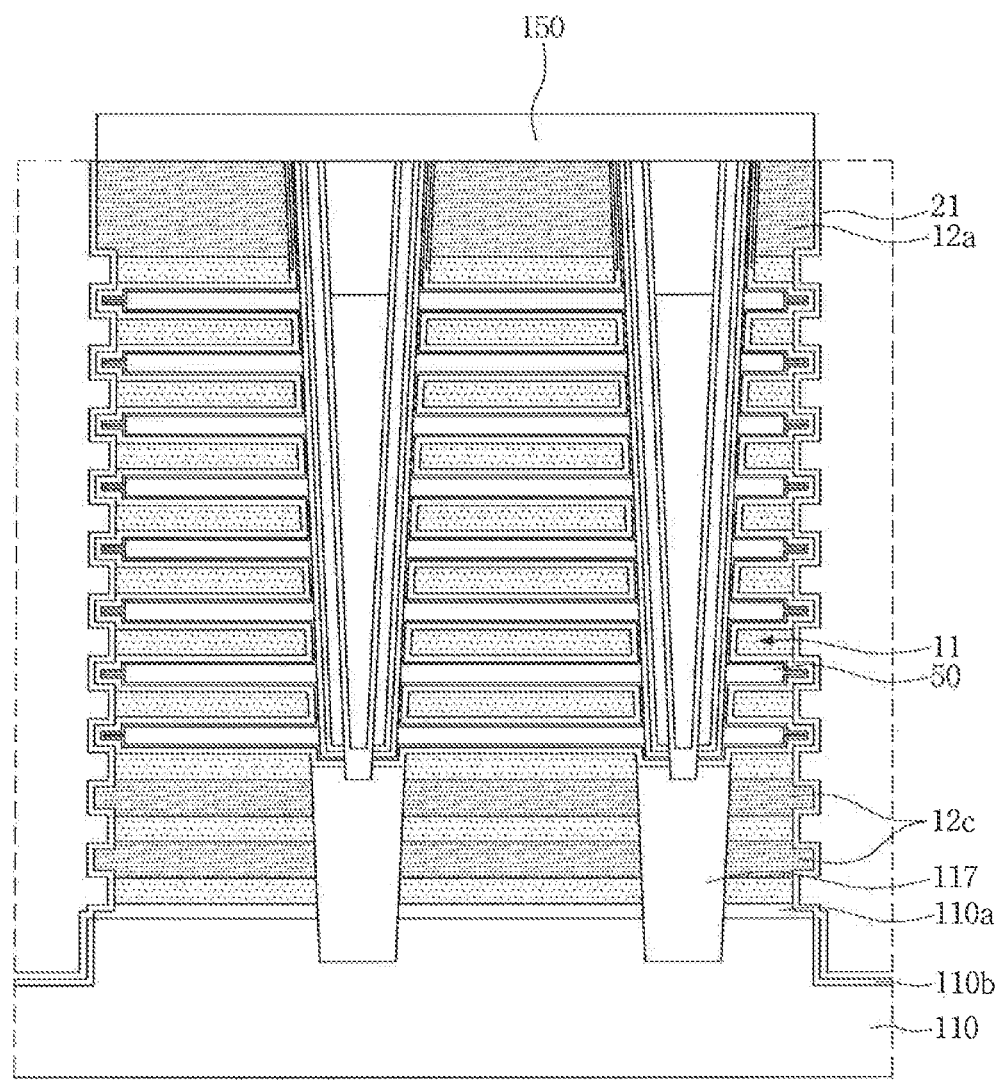

Referring to FIG. 34, the second protection layer 22 may be removed. At this time, both the first spacer pattern 60 and the second spacer pattern 65 including the substantially same material as the second protection layer 22 may be removed.

Figure 35:
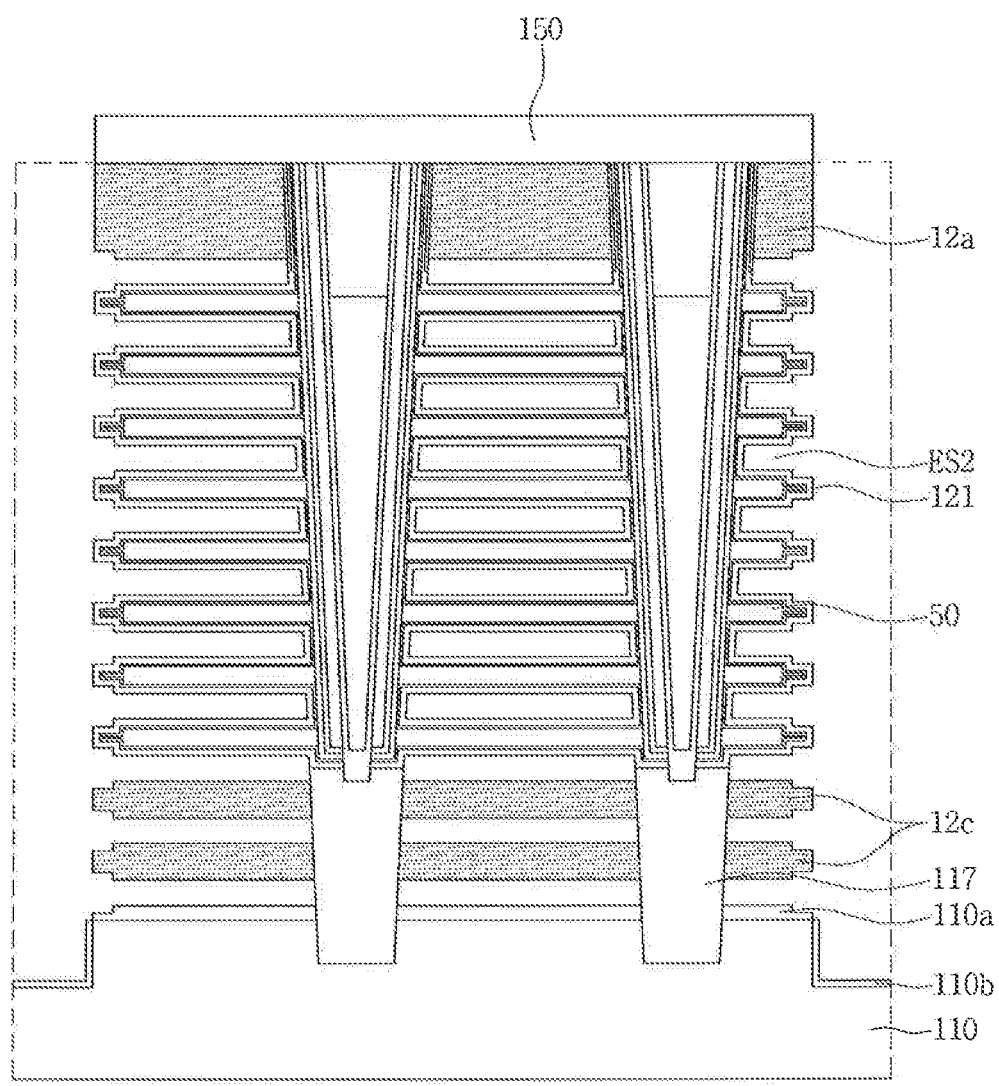

Referring to FIG. 35, second spaces ES2 may be formed by removing the first protection layer 21 and the first insulating layers 11. The second spaces ES2 may be formed between the uppermost insulating layer 12a and the second sacrificial pattern 50, between two adjacent second sacrificial patterns 50, between the second sacrificial pattern 50 and the lower insulating layer 12c of the second insulating layers 12, and between two adjacent lower insulating layers 12c. Word lines may be formed in the second spaces ES2 in a subsequent process.

Figure 36:
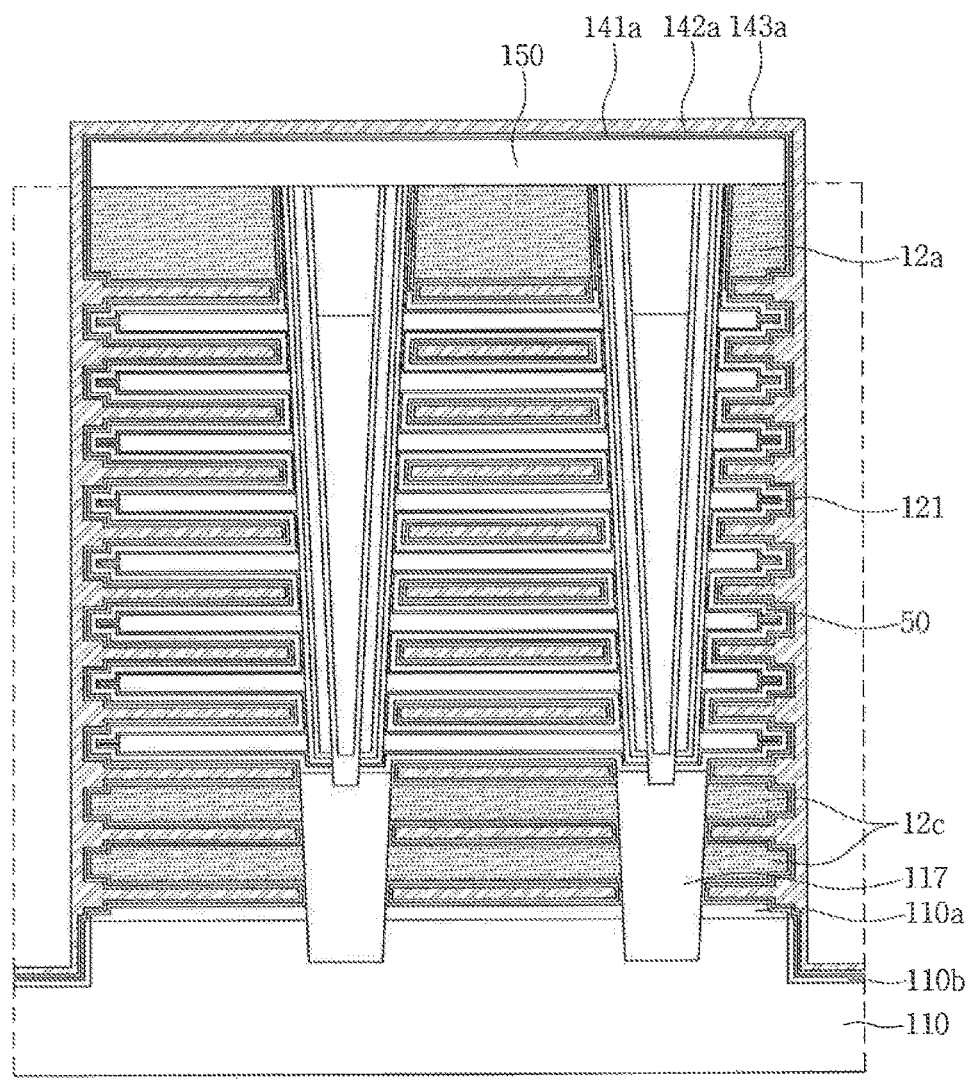

Referring to FIG. 36, an insulating barrier layer 141a, a conductive barrier layer 142a, and a conductive layer 143a may be formed in the second spaces ES2. For example, the insulating barrier layer 141a may be conformally formed on the blocking patterns 121 in the second spaces ES2. The conductive barrier layer 142a may be conformally formed on the insulating barrier layer 141a. The conductive layer 143a may be conformally formed on the conductive barrier layer 142a. The conductive layer 143a may be formed to fill the second spaces ES2. The insulating barrier layer 141a may include a metal oxide. The metal oxide may include aluminum oxide. The conductive barrier layer 142a may include a metal nitride. The metal nitride may include titanium nitride. The conductive layer 143a may include a metal material such as tungsten (W).

Figure 37:
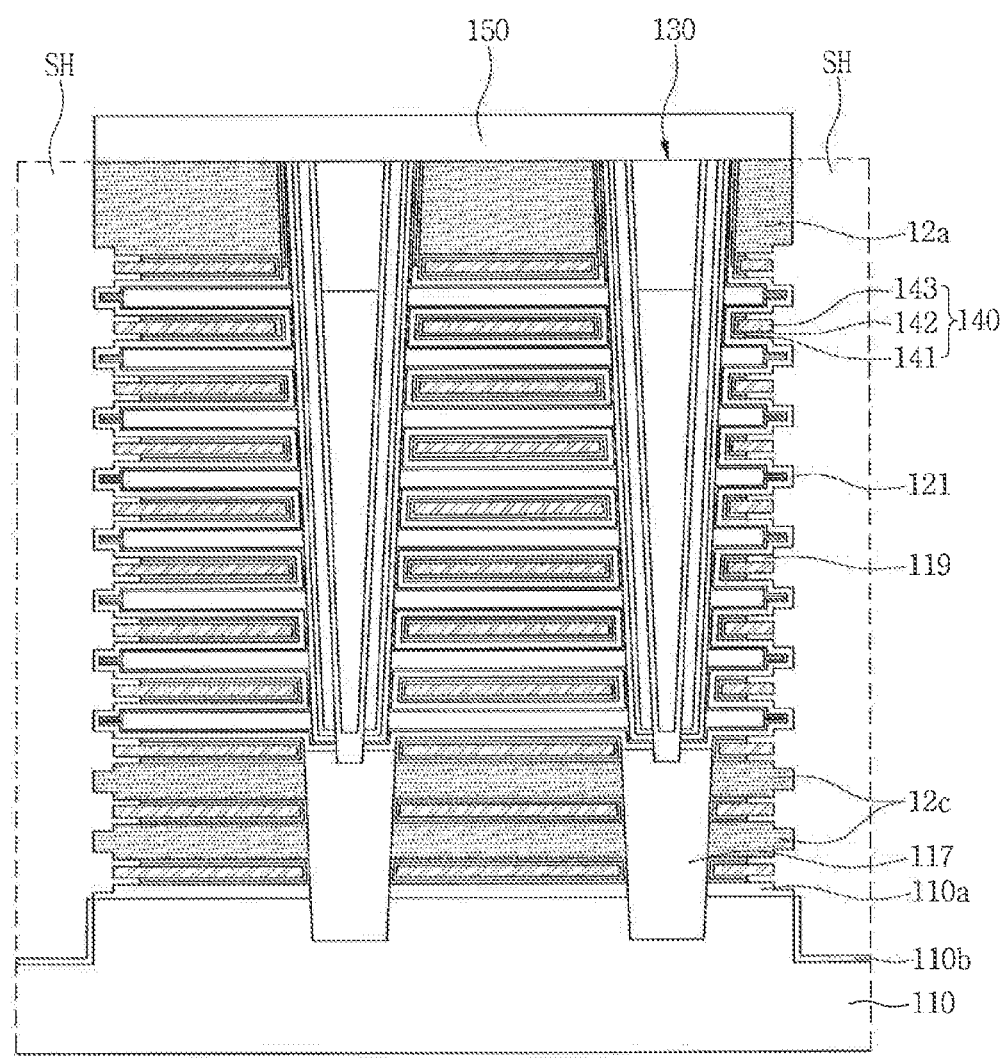

Referring to FIG. 37, the insulating barrier layer 141a, the conductive barrier layer 142a, and the conductive, layer 143a may be partially removed to form word lines 140 including insulating barrier patterns 141, conductive barrier patterns 142, and word line electrodes 143 using an etch-back process. The insulating barrier patterns 141 and the conductive barrier patterns 142 may entirely or partially surround the word line electrodes 143 depending on the position of the word line electrode 143. For example, the insulating barrier patterns 141 and the conductive barrier patterns 142 of the word lines 140 located between the isolation trenches SH may entirely surround the word line electrodes 143. Meanwhile, the insulating barrier patterns 141 and the conductive barrier patterns 142 of the word lines 140 located between the channel structures 130 and the isolation trenches SH may partially surround the word line electrodes 143. For example, the insulating barrier pattern 141 and the conductive barrier pattern 142 need not surround a side surface, a part of a top surface, and a part of a bottom surface of a part, adjacent to the isolation trench SH, of the word line electrode 143. Here, the side surface of the word line electrode 143 may be substantially perpendicular to the surface of the substrate 110, and the top surface and the bottom surface of the word line electrode 143 may be in substantially parallel to the surface of the substrate 110. The side surface of the insulating barrier pattern 141 may be vertically aligned with the side surface of the conductive barrier patterns 142. Here, the side surface of the insulating barrier patterns 141 and the side surface of the conductive barrier patterns 142 each may be substantially perpendicular to the surface of the substrate 110, and close to the isolation trenches SH.

Figure 38:
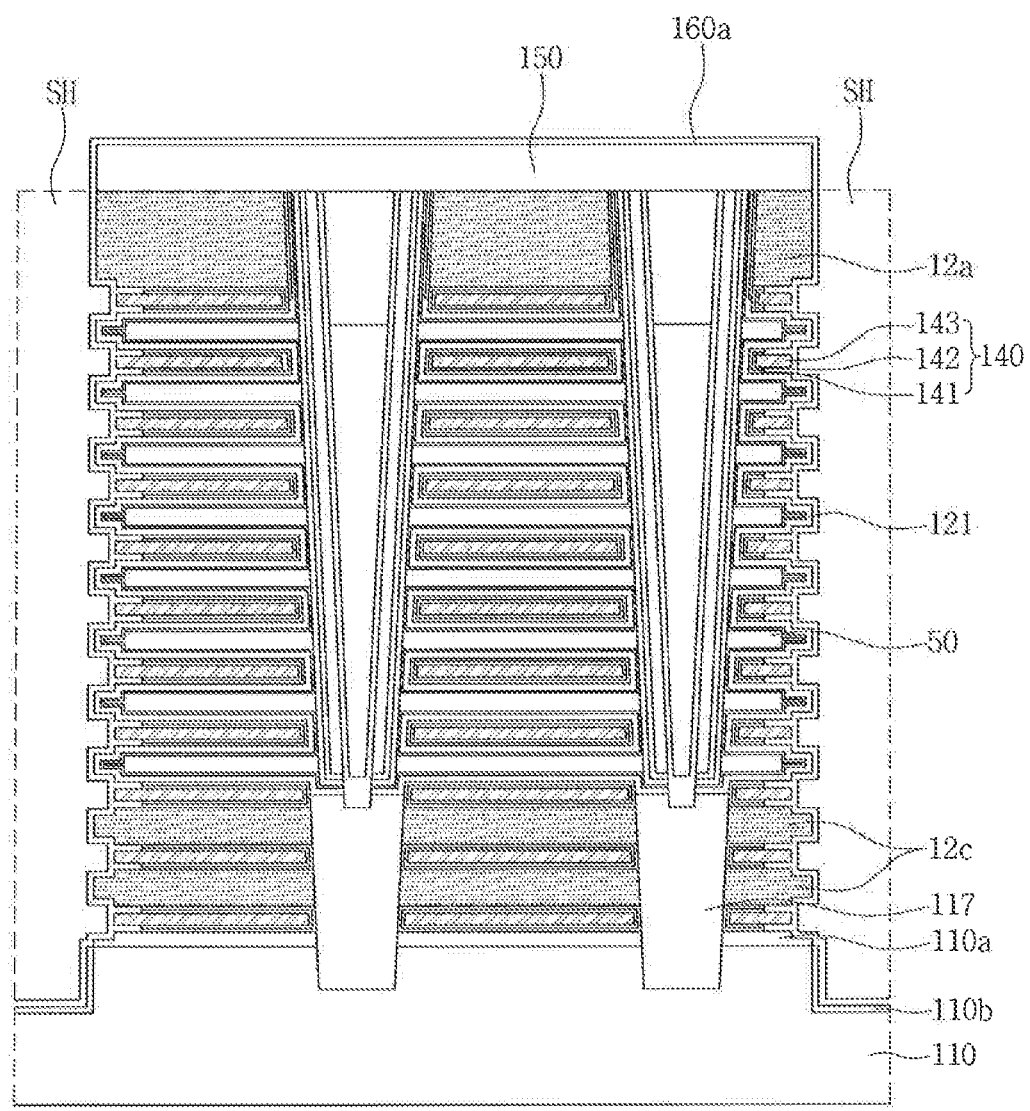

Referring to FIG. 38, a second capping layer 160a may be formed on the resulting structure of FIG. 37. For example, the second capping layer 160a may be formed in the isolation trenches SH and on the first capping pattern 150. The second capping layer 160a may be conformity formed on an upper part of the first capping pattern 150 and insides of the isolation trenches SH. The second capping layer 160a may include silicon oxide. The second capping layer 160a may be formed using a deposition process.

Figure 39A:
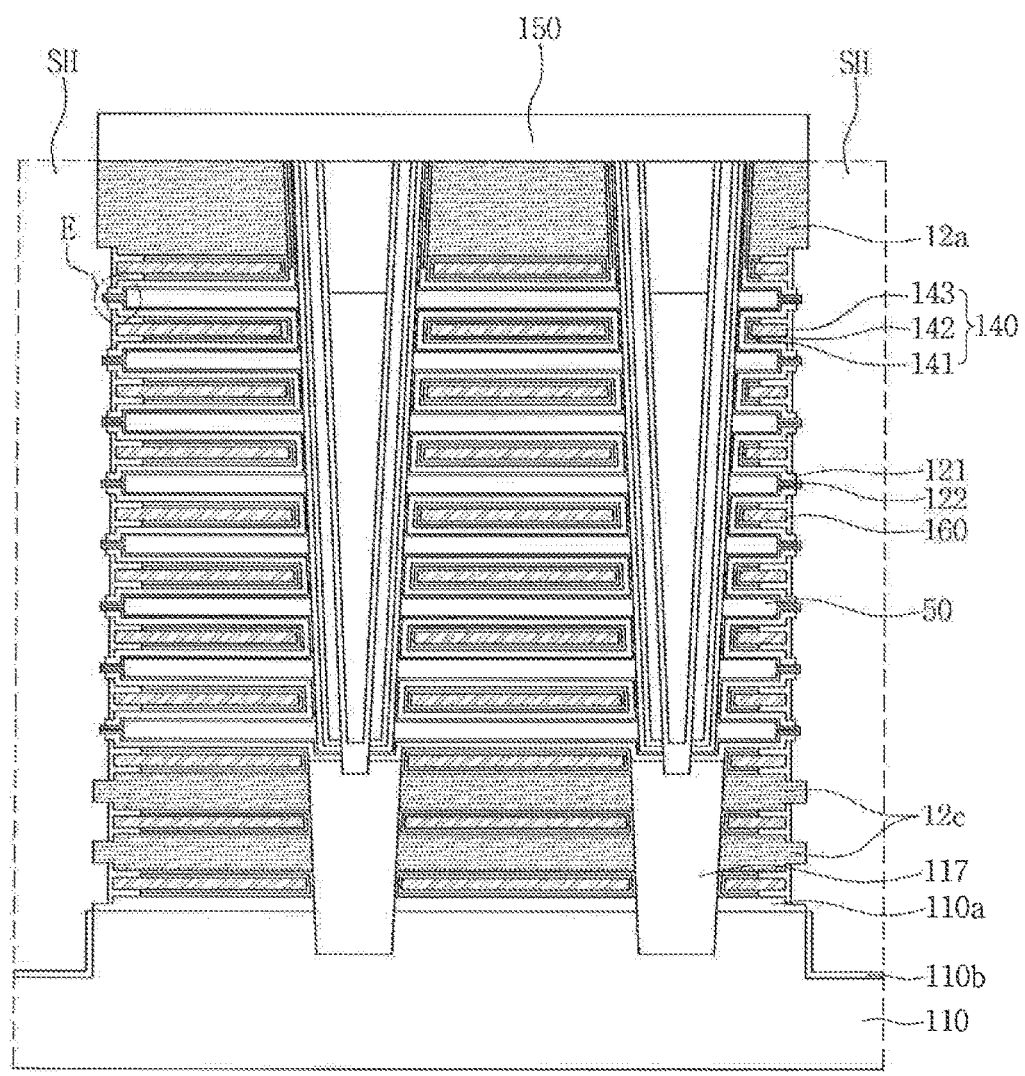
Figure 39B:
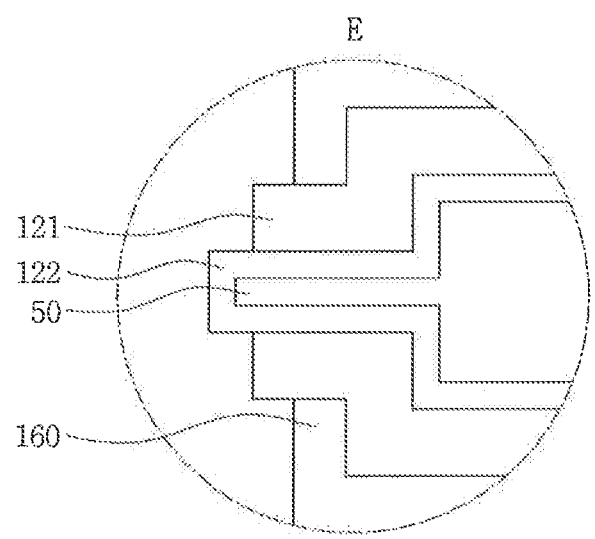

Referring to FIGS. 39A and 39B, a second capping pattern 160 may formed by partially removing the second capping layer 160a and the blocking patterns 121 to expose a part of the first charge trap pattern 122 surrounding the second sacrificial pattern 50. In this case, the second capping pattern 160 may cover the sides of the word lines 140 exposed to the inside of the isolation trench SH.

Figure 40A:
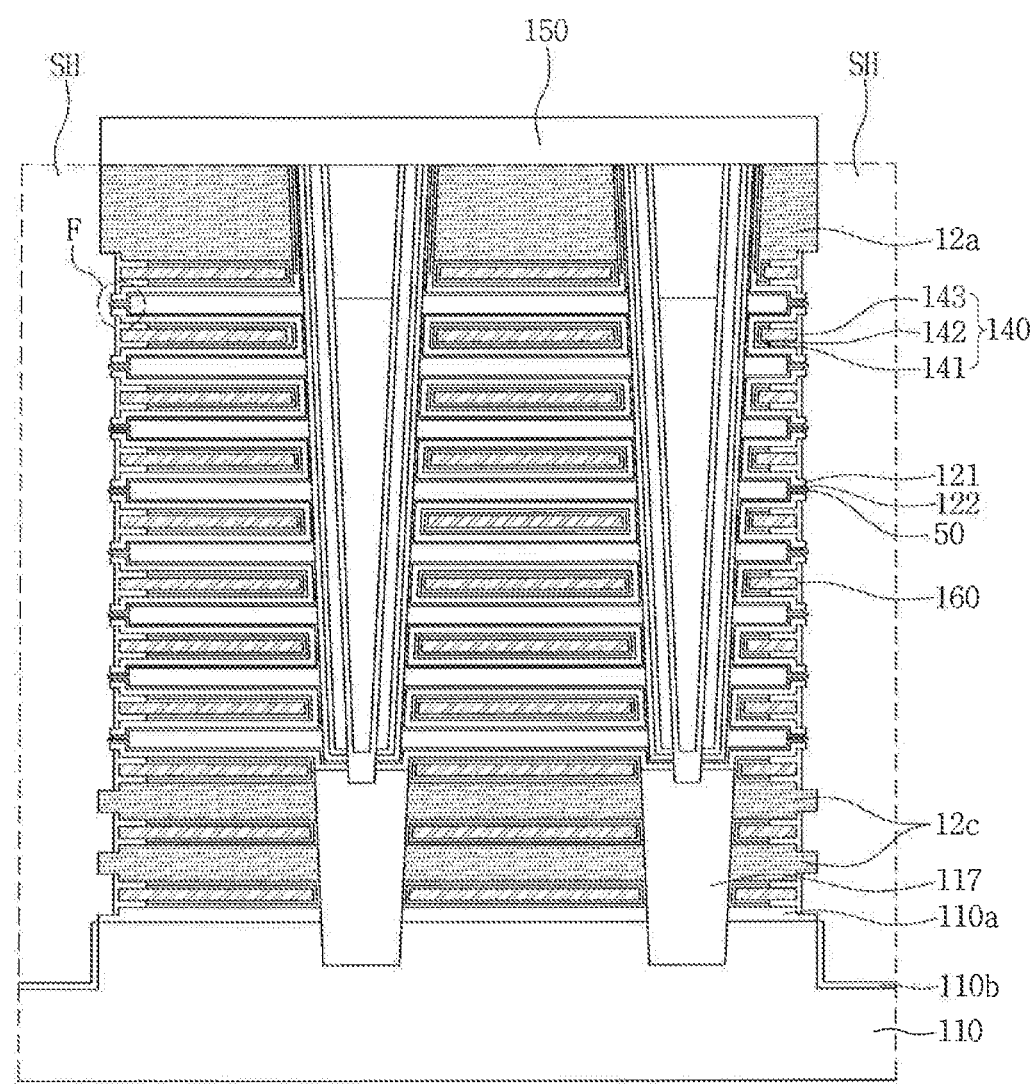
Figure 40B:
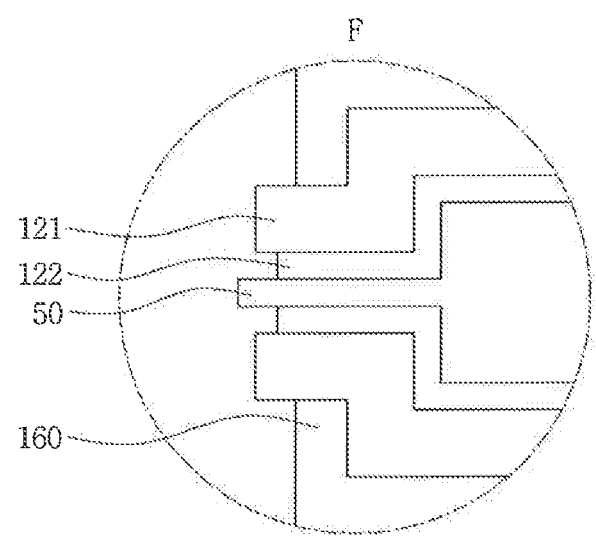

Referring to FIGS. 40A and 40B, the first charge trap patterns 122 exposed to the inside of the isolation trenches SH may be partially removed to expose a part of the second sacrificial pattern 50 to the inside of the isolation trenches SH.

Figure 41A:
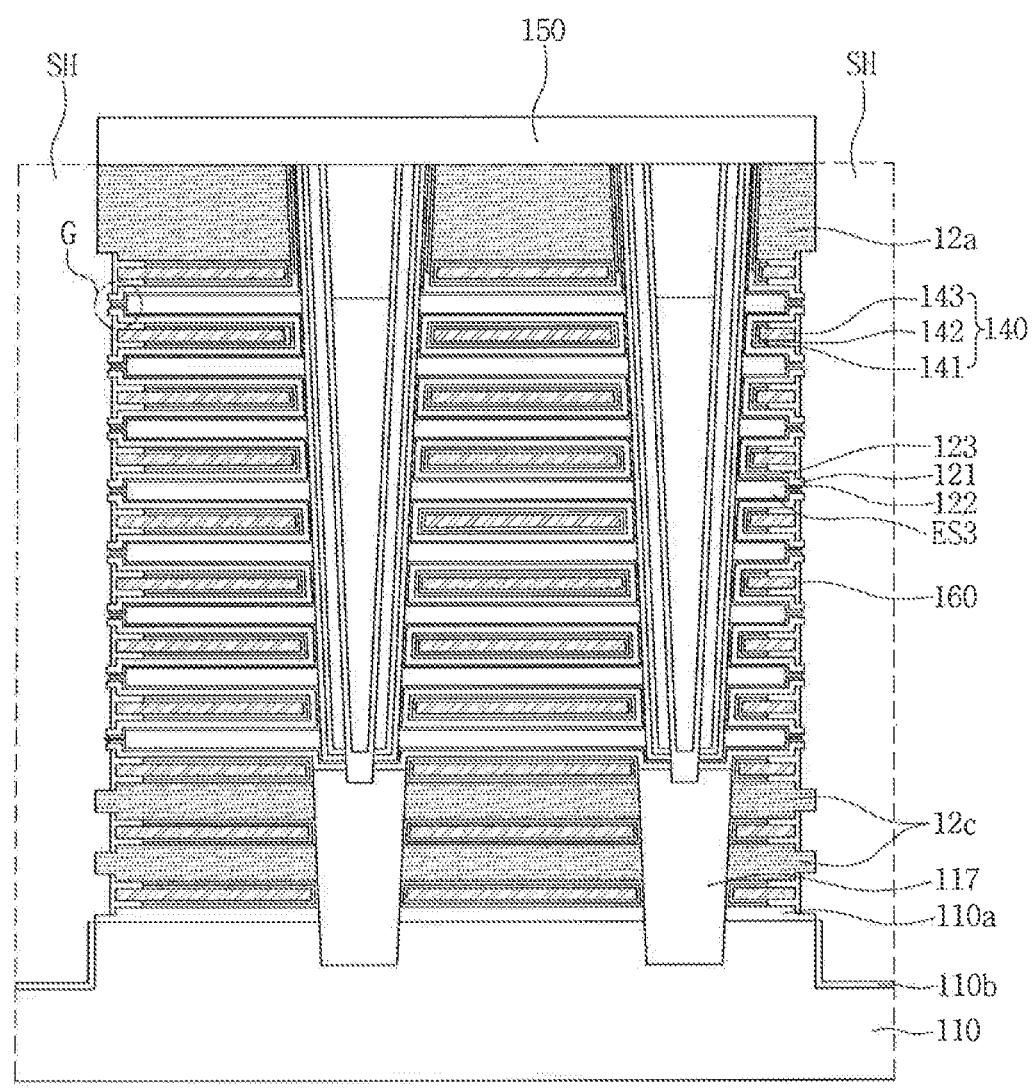
Figure 41B:
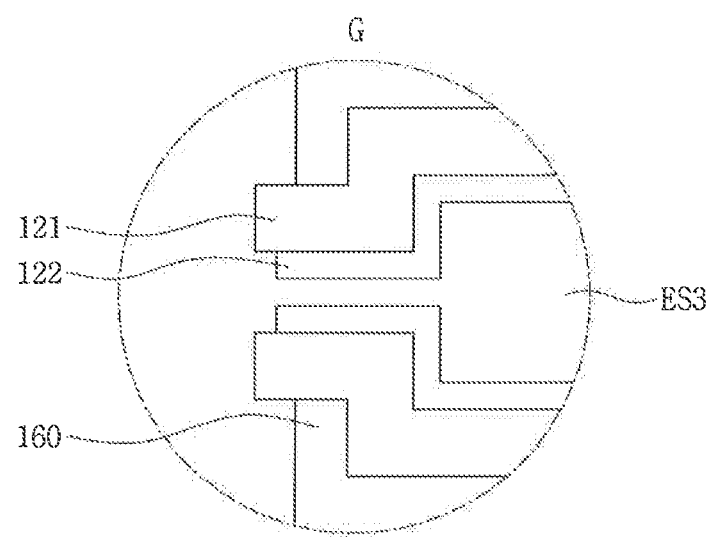

Referring to FIGS. 41A and 41B, the second sacrificial patterns 50 exposed to the inside of the isolation trenches SH may be removed so that third spaces ES3 may be formed between the word lines 140. In this case, the second sacrificial pattern 50 may have etch selectivity with respect to the first charge trap pattern 122 and second charge trap pattern 123. Thus, the first charge trap patterns 122 and the second charge trap patterns 123 may serve as an etch stopper, and the second sacrificial patterns 50 located between the word, lines 140 may be fully removed. Further, a part of the first charge trap pattern 122 and a part of the second charge trap pattern 123 may be exposed to an inside of the third space ES3.

Figure 42A:
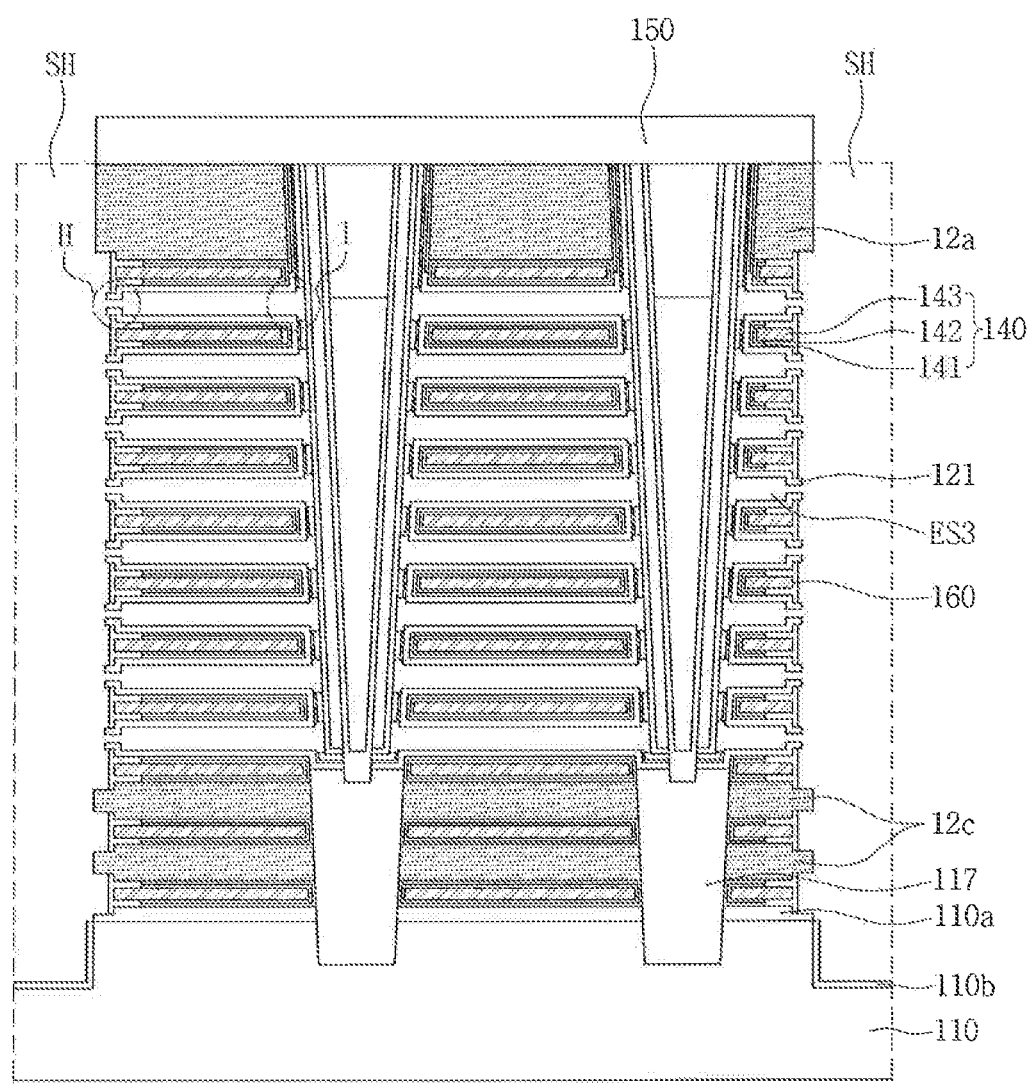
Figure 42B:
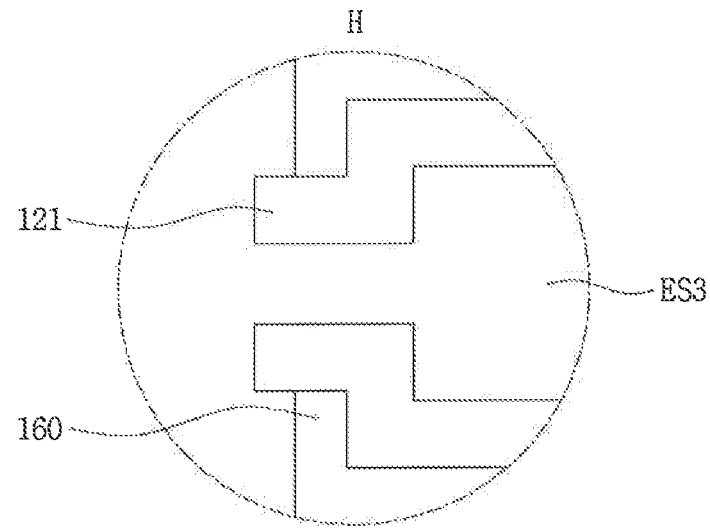
Figure 42C:
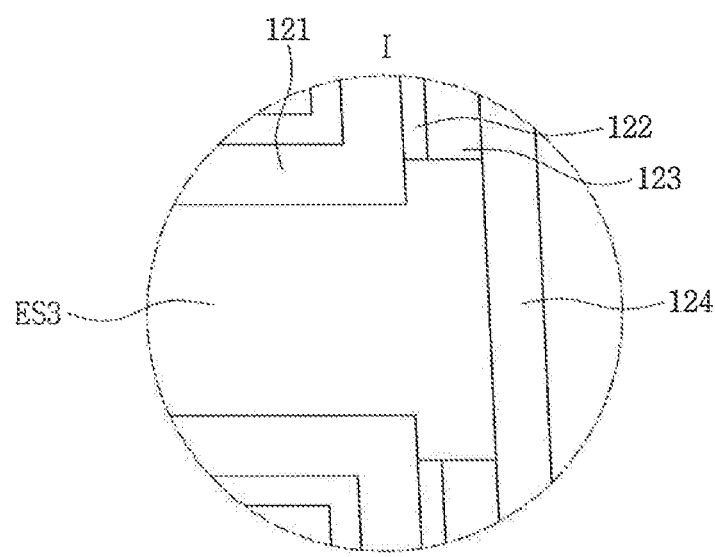
Figure 43A:
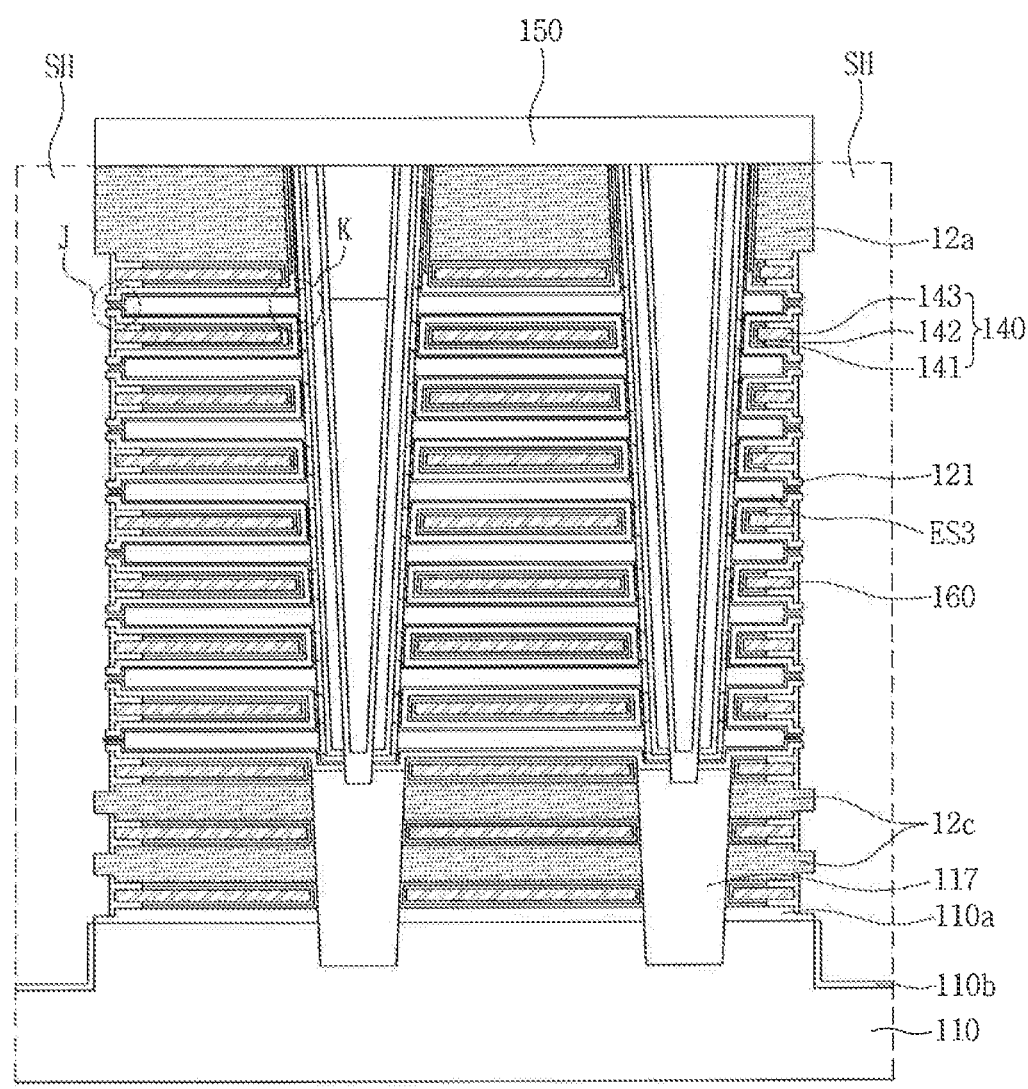
FIGS. 43A to 43C are cross-sectional views for describing a method of manufacturing the semiconductor device of FIGS. 3A to 3C in accordance with an exemplary embodiment of the inventive concept.
Figure 43B:
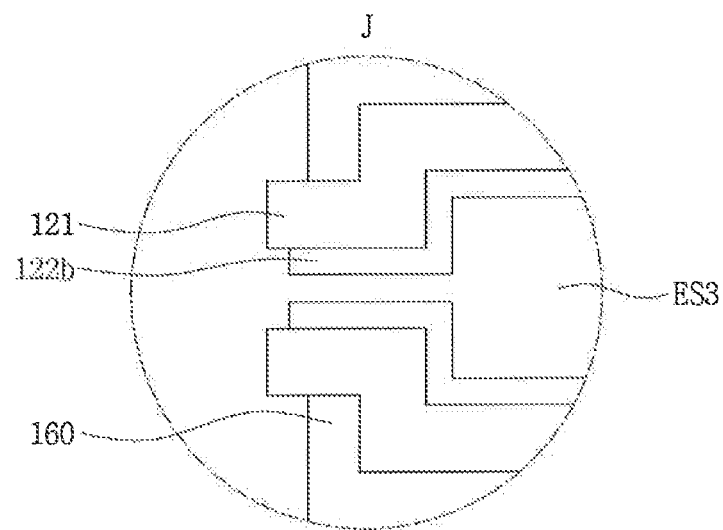
Figure 43C:
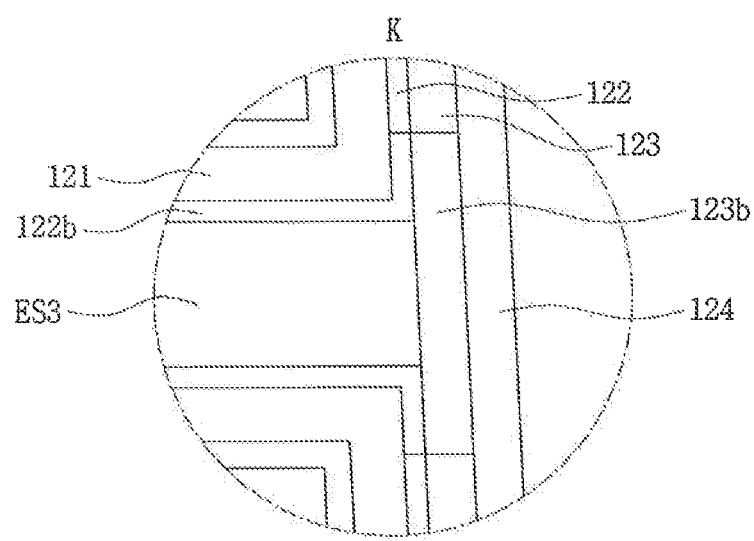

Referring to FIGS. 42A to 42C, the first charge trap patterns 122 and the second charge trap patterns 123 may be removed through the third spaces ES3 to form the first charge trap patterns 122 and the second charge trap patterns 123 which are disposed only on the side surfaces of the word lines 140. For example, the first charge trap patterns 122 and the second charge trap patterns 123 may be interposed between the side surfaces of the word lines 140 and the tunneling insulating patterns 124. In this case, vertical lengths of the first charge trap pattern 122 and the second charge trap pattern 123 may be less than a vertical length of the word line 140. Here, the vertical length may be a length perpendicular to the surface of the substrate 110.

Referring back to FIG. 2A, the isolation patterns 170 may be formed in the isolation trenches SH. The isolation patterns 170 may fill the isolation trenches SH. The isolation patterns 170 may flow into the third spaces ES3, and be conformally formed on the blocking patterns 121, the first charge trap patterns 122, the second charge trap patterns 123, and the tunneling insulating patterns 124 in the third spaces ES3.

Meanwhile, referring to FIGS. 43A to 43C, the first charge trap patterns 122 and the second charge trap patterns 123 exposed in the third spaces ES3 may be selectively oxidized. The oxidized first charge trap patterns 122 and the oxidized second charge trap patterns 123 may be disposed only on the side surfaces of the word lines 140. For example, the oxidized first charge trap patterns 122 and the oxidized second charge trap patterns 123 may be formed as oxide layers except the parts interposed between the side surfaces of the word lines 140 and the tunneling insulating patterns 124. In this case, the vertical lengths of the oxidized first charge trap pattern 122 and the oxidized second charge trap pattern 123 may be smaller than the vertical length of the word line 140. Here, the vertical length may be a length perpendicular to the surface of the substrate 110.

Further, a first oxide layer 122b and a second oxide layer 123b may be formed in the third space defined by the blocking patterns 121, the first charge trap patterns 122, the second charge trap patterns 123, and the tunneling insulating pattern 124. For example, the first and the second oxide layers 122b and 123b may be formed on the blocking patterns 121, the first charge trap patterns 122, the second charge trap patterns 123, and the tunneling insulating pattern 124 which defines the third space. Accordingly, the second oxide layers 123b may be interposed between two second charge trap patterns 123 which are vertically aligned so that the second charge trap patterns 123 and the second oxide layers 123b may be alternately and repeatedly formed. The second charge trap patterns 123 and the second oxide layers 123b may be vertically aligned.

Referring back to FIG. 3A, the isolation patterns 170 may be formed to fill the isolation trenches SH. The isolation patterns 170 may block open parts of the third spaces ES3 located at the inside of the isolation trench SH to form the air gaps 180.

Figure 44:
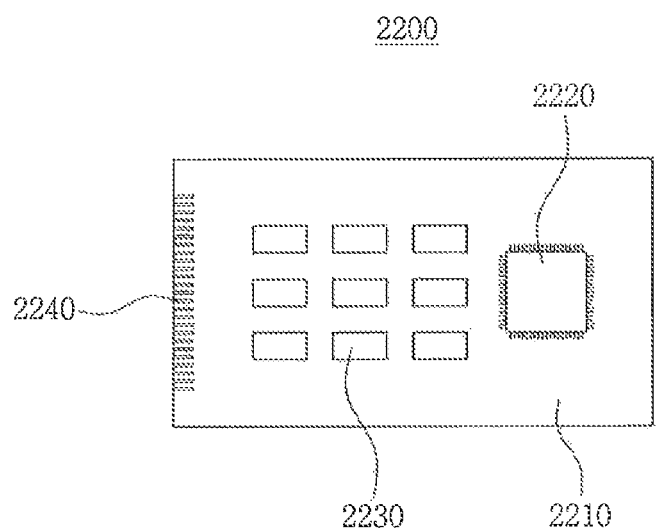
FIG. 44 shows a semiconductor module in accordance with an exemplary embodiment of the inventive concept.

FIG. 44 shows a semiconductor module 2200 in accordance with an exemplary embodiment of the inventive concept. Referring to FIG. 44, the semiconductor module 2200 in accordance with an exemplary embodiment of the inventive concept may include a processor 2220 and semiconductor devices 2230 which are mounted on a module substrate 2210. The processor 2220 or the semiconductor devices 2230 may include at least one of the semiconductor devices 100A and 100B in accordance with an exemplary embodiment of the inventive concept. Conductive input/output terminals 2240 may be disposed on at least one side of the module substrate 2210.

Figure 45:
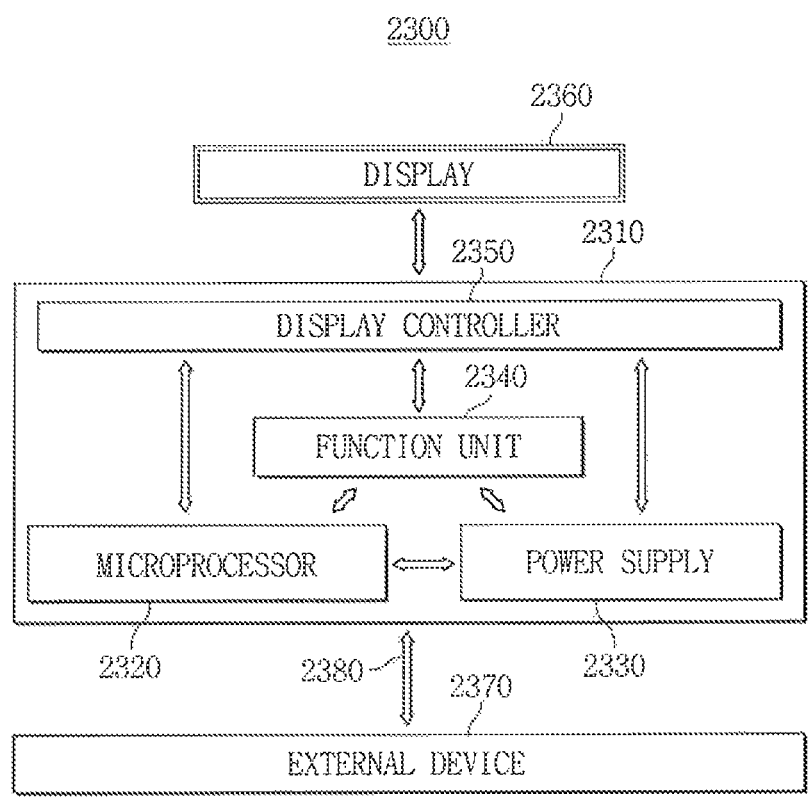
FIGS. 45 and 46 show block diagrams of electronic systems in accordance with exemplary embodiments of the inventive concept.

FIG. 45 shows an electronic system 2300 in accordance with an exemplary embodiment of the inventive concept. Referring to FIG. 45, the electronic system 2300 may include a body 2310, a display 2360, and an external device 2370. The body 2310 may include a microprocessor 2320, a power supply 2330, a function unit 2340, and/or a display controller 2350. The body 2310 may include a system board or a motherboard having a PCB or the like. The microprocessor 2320, the power supply 2330, the function unit 2340, and the display controller 2350 may be mounted or disposed on an upper surface of the body 2310 or inside the body 2310. The display 2360 may be disposed on the upper surface of the body 2310 or inside/outside the body 2310. The display 2360 may display an image processed by the display controller 2350. For example, the display 2360 may include a liquid crystal display (LCD), active matrix organic light emitting diodes (AMOLED), or various display panels. The display 2360 may include a touch screen. Therefore, the display 2360 may have an input/output function. The power supply 2330 may supply a current or a voltage to the microprocessor 2320, the function unit 2340, the display controller 2350, etc. The power supply 2330 may include a charging battery, a socket for a dry cell, or a voltage/current converter. The microprocessor 2320 may receive a voltage from the power supply 2330 to control the function unit 2340 and the display 2360. For example, the microprocessor 2320 may include a CPU or an application processor (AP). The function unit 2340 may include a touch pad, a touch screen, a volatile/non-volatile memory, a memory card controller, a camera, a light, an audio and moving picture recording processor, a wireless radio antenna, a speaker, a microphone, a USB port, or a unit having other various functions. The microprocessor 2320 or the function unit 2340 may include at least one of the semiconductor devices 100A and 100B in accordance with an exemplary embodiment of the inventive concept.

Figure 46:
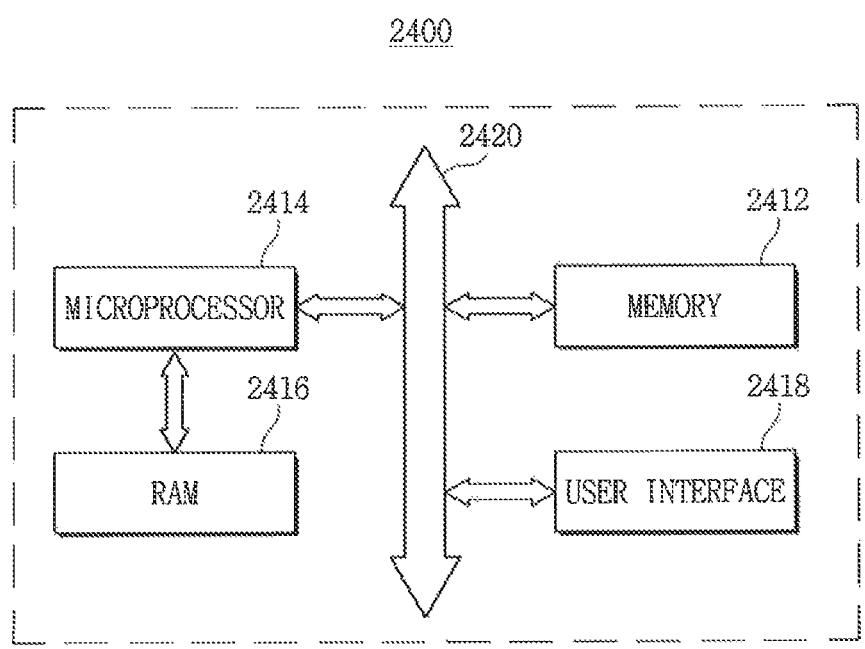

Referring to FIG. 46, an electronic system 2400 in accordance with an exemplary embodiment of the inventive concept may include a microprocessor 2414, a memory 2412, and a user interface 2418 configured to perform data communication using a bus 2420. The microprocessor 2414 may include a CPU or a application process (AP). The electronic system 2400 may further include a random access memory (RAM) 2416 configured to directly communicate with the microprocessor 2414. The microprocessor 2414 and/or the RAM 2416 may be assembled within a single package. The user interface 2418 may be used to input data to the electronic system 2400, or output data from the electronic system 2400. For example, the user interface 2418 may include a touch pad, a touch screen, a keyboard, a mouse, a voice detector, a cathode ray tube (CRT) monitor, an LCD, an AMOLED, a plasma display pad (PDP), a printer, a light, or various input/output devices. The memory 2412 may store operational codes of the microprocessor 2414, data processed by the microprocessor 2414, or data received from the outside. The memory 2412 may include a memory controller, a hard disk, or a solid state drive (SSD). The microprocessor 2414, the RAM 2416, and/or the memory 2412 may include at least one of the semiconductor devices 100A and 100B in accordance with the various embodiments of the inventive concept.

According to an exemplary embodiment of the inventive concept, air gaps are formed between word lines so that increase of capacitance between the word lines may be prevented if a thickness of a stacked layer is reduced, and thus degradation of an operational speed of the semiconductor device may be prevented.

Further, according to an exemplary the embodiment of the inventive concept, charge trap patterns are formed only on surfaces of the word lines and separated from each other, and thus occurrence of a malfunction caused by a coupling between the memory cells may be suppressed even though a distance between cells is small by reducing the thickness of the stacked layer.

While the present inventive concept has been shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A semiconductor device, comprising:
   a plurality of word lines formed on a substrate;
   a plurality of air gaps of which each air gap is interposed between two adjacent word lines;
   a channel structure penetrating through the plurality of word lines and the plurality of air gaps; and
   a plurality of memory cells of which each memory cell is interposed between each word line and the channel structure,
   wherein each memory cell includes a blocking pattern, a charge trap pattern and a tunneling insulating pattern,
   wherein the blocking pattern of each memory cell conformally covers a top surface, a bottom surface, and a first side surface of each word line,
   wherein the blocking pattern of each memory cell is vertically adjacent to another blocking pattern of a memory cell adjacent to and spaced apart from each memory cell, wherein the first side surface is adjacent to the channel structure, and
wherein the charge trap pattern is interposed only between the first side surface and the channel structure.

2. The semiconductor device of claim 1,
wherein two adjacent charge trap patterns of two adjacent memory cells are spaced apart from each other in a direction perpendicular to a surface of the substrate.

3. The semiconductor device of claim 2,
wherein each air gap is further interposed between the two adjacent charge trap patterns.

4. The semiconductor device of claim 3,
wherein each air gap includes a first region having a first height and a second region having a second height,
wherein the first height is measured between a blocking pattern covering a bottom surface of one of two adjacent word lines and a blocking pattern covering a top surface of the other of the two adjacent word lines,
wherein the second height is measured between the two adjacent charge trap patterns, wherein the first height is smaller than the second height.

5. The semiconductor device of claim 2, further comprising a plurality of oxide layers of which each oxide layer is interposed between the two adjacent charge trap patterns which are vertically spaced apart from each other.

6. The semiconductor device of claim 5,
wherein the two adjacent charge trap patterns and each oxide layer are vertically aligned.

7. The semiconductor device of claim 5,
wherein each air gap is enclosed by each oxide layer.

8. The semiconductor device of claim 1,
wherein a vertical length of the charge trap pattern is greater than a vertical length of the first side surface.

9. The semiconductor device of claim 1,
wherein a vertical length of the charge trap pattern is smaller than a vertical length of the blocking pattern, on the first side surface.

10. The semiconductor device of claim 1,
wherein the tunneling insulating pattern is interposed between the charge trap pattern and the channel structures.

11. The semiconductor device of claim 10, further comprising an isolation pattern penetrating through the plurality of word lines and the plurality of air gaps.

12. The semiconductor device of claim 11,
wherein the isolation pattern is extended to enclose each air gap, wherein the isolation pattern is disposed on the blocking pattern, the charge trap pattern, and the tunneling insulating pattern.

13. The semiconductor device of claim 11, further comprising a capping pattern formed between the isolation pattern and the word lines.

14. A semiconductor device comprising:
a stacked structure disposed on a substrate, wherein the stacked structure includes a first word line, an air gap and a second word line vertically stacked on each other, and wherein the air gap is interposed between the first word line and the second word line;
a channel structure adjacent to a first side of the stacked structure;
an isolation pattern adjacent to a second side of the stacked structure, wherein the second side is opposite to the first side;
a contiguous tunneling insulating pattern interposed between the stacked structure and the channel structure;
a first charge trap pattern interposed between the first word line and the channel structure;
a second charge trap pattern interposed between the first charge trap pattern and the channel structure;
a first blocking pattern having a first portion interposed between the first word line and the first charge trap pattern and a second portion interposed between the first word line and the air gap; and
a second blocking pattern interposed between the second word line and the contiguous tunneling insulating pattern.

15. The semiconductor device of claim 14,
wherein the air gap is further interposed between the first charge trap pattern and the second charge trap pattern.

16. The semiconductor device of claim 14,
wherein the isolation pattern includes a first extended portion, a second extended portion and a third extended portion, wherein the first extended portion is interposed between the air gap and the first portion of the first blocking pattern, wherein the second extended portion is interposed between the air gap and the first portion of the second blocking pattern, and wherein the third extended portion is interposed between the air gap and the contiguous tunneling insulating pattern.

17. A semiconductor device, comprising:
word lines and air gaps, which are alternately and repeatedly formed on a substrate;
channel structures configured to vertically pass through the word lines and the air gaps and connected to the substrate;
blocking patterns formed between the word lines and the air gaps and on sides of the word lines facing the channel structures;
charge trap patterns formed on the blocking patterns formed on the sides of the word lines;
tunneling insulating patterns formed between the charge trap patterns and the channel structures; and
oxide layers, wherein each of the oxide layers is disposed between two adjacent word lines and defines each of the air gaps,
wherein the oxide layers are vertically spaced apart from each other, and
wherein the charge trap patterns are vertically spaced apart from each other.

18. The semiconductor device according to claim 17,
wherein the charge trap patterns and the oxide layers are vertically aligned.

19. The semiconductor device according to claim 17,
wherein a vertical length of the charge trap pattern is greater than a vertical length of a side of the word line, and smaller than vertical lengths of the blocking patterns.

20. The semiconductor device according to claim 17,
wherein each of the oxide layers is in contact with two adjacent charge trap patterns.

* * * * *